United States Patent
Shibazaki

(10) Patent No.: US 9,423,703 B2
(45) Date of Patent: *Aug. 23, 2016

(54) EXPOSURE APPARATUS AND DEVICE MANUFACTURING METHOD MEASURING POSITION OF SUBSTRATE STAGE USING AT LEAST THREE OF FOUR ENCODER HEADS

(75) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 580 days.

This patent is subject to a terminal disclaimer.

(21) Appl. No.: 13/007,503

(22) Filed: Jan. 14, 2011

(65) Prior Publication Data

US 2011/0102756 A1    May 5, 2011

Related U.S. Application Data

(62) Division of application No. 12/900,372, filed on Oct. 7, 2010, which is a division of application No. 11/655,082, filed on Jan. 19, 2007, now Pat. No. 7,839,485.

(60) Provisional application No. 60/851,045, filed on Oct. 12, 2006.

(30) Foreign Application Priority Data

| Jan. 19, 2006 | (JP) | 2006-011506 |
| Feb. 21, 2006 | (JP) | 2006-044599 |
| Aug. 31, 2006 | (JP) | 2006-236878 |

(51) Int. Cl.
*G03F 7/20* (2006.01)
*G01B 11/27* (2006.01)
(Continued)

(52) U.S. Cl.
CPC ......... *G03F 7/70725* (2013.01); *G01B 11/27* (2013.01); *G01D 5/26* (2013.01);
(Continued)

(58) Field of Classification Search
CPC ................................... G03F 7/70775
USPC .............. 355/72, 73–76, 53; 356/616
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |

(Continued)

FOREIGN PATENT DOCUMENTS

| CN | 1311852 A | 9/2001 |
| DE | 221 563 A1 | 4/1985 |

(Continued)

OTHER PUBLICATIONS

Feb. 26, 2013 Office Action issued in Korean Patent Application No. 2008-7011530 (with translation).
(Continued)

*Primary Examiner* — Chia-How Michael Liu
(74) *Attorney, Agent, or Firm* — Oliff PLC

(57) ABSTRACT

In an exposure apparatus exposes a substrate with an energy beam via a projection optical system, a substrate stage system has a movable body that holds the substrate and is driven to move the substrate. An encoder system measures positional information of the movable body by irradiating each of four areas of a grating section with a beam via each of four heads. A controller controls driving of the movable body based on the positional information measured by the encoder system. As the movable body moves, a relationship between the grating section and the heads changes between a first state, in which the four heads respectively face the four areas, and a second state, in which only three of the heads respectively face three areas of the four areas. At least three areas of the four areas are always faced by three of the heads at least during substrate exposure.

33 Claims, 26 Drawing Sheets

(51) Int. Cl.
  *G01D 5/26* (2006.01)
  *G01D 18/00* (2006.01)
(52) U.S. Cl.
  CPC .......... *G01D 5/266* (2013.01); *G01D 18/002* (2013.01); *G03F 7/70141* (2013.01); *G03F 7/70341* (2013.01); *G03F 7/70516* (2013.01); *G03F 7/70716* (2013.01); *G03F 7/70775* (2013.01); *G03F 7/70975* (2013.01); *Y10T 29/49826* (2015.01)

(56) References Cited

U.S. PATENT DOCUMENTS

| | | |
|---|---|---|
| 4,751,383 A | 6/1988 | Ueyama |
| 4,780,617 A | 10/1988 | Umatate et al. |
| 5,021,649 A | 6/1991 | Nishimura et al. |
| 5,247,165 A | 9/1993 | Hiruta et al. |
| 5,448,332 A | 9/1995 | Sakakibara et al. |
| 5,610,683 A | 3/1997 | Takahashi et al. |
| 5,610,715 A | 3/1997 | Yoshii et al. |
| 5,646,413 A | 7/1997 | Nishi |
| 5,715,039 A | 2/1998 | Fukuda et al. |
| 5,825,043 A | 10/1998 | Suwa |
| 6,144,118 A | 11/2000 | Cahill et al. |
| 6,260,282 B1 | 7/2001 | Yuan et al. |
| 6,262,796 B1 | 7/2001 | Loopstra et al. |
| 6,341,007 B1 | 1/2002 | Nishi et al. |
| 6,356,219 B1 | 3/2002 | Weibel, IV et al. |
| 6,611,316 B2 | 8/2003 | Sewell |
| 6,639,686 B1 | 10/2003 | Ohara |
| 6,665,054 B2 | 12/2003 | Inoue |
| 6,721,034 B1 | 4/2004 | Horikawa |
| 6,778,257 B2 | 8/2004 | Bleeker et al. |
| 6,819,425 B2 | 11/2004 | Kwan |
| 6,897,963 B1 | 5/2005 | Taniguchi et al. |
| 6,952,253 B2 | 10/2005 | Lof et al. |
| 7,023,610 B2 | 4/2006 | Ohtsuki et al. |
| 7,025,498 B2 | 4/2006 | Del Puerto |
| 7,102,729 B2 | 9/2006 | Renkens et al. |
| 7,161,659 B2 | 1/2007 | Van Den Brink et al. |
| 7,253,875 B1 | 8/2007 | Luttikhuis et al. |
| 7,256,871 B2 | 8/2007 | Loopstra et al. |
| 7,289,212 B2 | 10/2007 | Kwan |
| 7,292,312 B2 | 11/2007 | Loopstra et al. |
| 7,333,174 B2 | 2/2008 | Koenen et al. |
| 7,348,574 B2 | 3/2008 | Pril et al. |
| 7,349,069 B2 | 3/2008 | Beems et al. |
| 7,362,446 B2 | 4/2008 | Van Der Pasch et al. |
| 7,405,811 B2 | 7/2008 | Beems et al. |
| 7,408,655 B2 | 8/2008 | Loopstra et al. |
| 7,483,120 B2 | 1/2009 | Luttikhuis et al. |
| 7,515,281 B2 * | 4/2009 | Loopstra et al. ............ 356/616 |
| 7,528,965 B2 | 5/2009 | Loopstra et al. |
| 7,602,489 B2 | 10/2009 | Van Der Pasch et al. |
| 7,619,207 B2 | 11/2009 | Loopstra et al. |
| 7,636,165 B2 | 12/2009 | Klaver et al. |
| 7,710,540 B2 | 5/2010 | Loopstra et al. |
| 7,839,485 B2 | 11/2010 | Shibazaki |
| 7,859,686 B2 | 12/2010 | Loopstra et al. |
| 7,880,901 B2 | 2/2011 | Loopstra et al. |
| 2002/0021450 A1 | 2/2002 | Aoki |
| 2002/0041380 A1 | 4/2002 | Kwan |
| 2003/0174343 A1 | 9/2003 | Masreliez et al. |
| 2003/0174344 A1 | 9/2003 | Jones et al. |
| 2004/0036017 A1 | 2/2004 | Ito |
| 2004/0165159 A1 | 8/2004 | Lof et al. |
| 2004/0263846 A1 | 12/2004 | Kwan |
| 2005/0128461 A1 | 6/2005 | Beems et al. |
| 2005/0259234 A1 | 11/2005 | Hirukawa et al. |
| 2005/0280791 A1 | 12/2005 | Nagasaka et al. |
| 2006/0023178 A1 | 2/2006 | Loopstra et al. |
| 2006/0023194 A1 | 2/2006 | Loopstra et al. |
| 2006/0092419 A1 | 5/2006 | Gui |
| 2006/0139595 A1 | 6/2006 | Koenen et al. |
| 2006/0139660 A1 | 6/2006 | Kwan |
| 2006/0170892 A1 | 8/2006 | Koenen et al. |
| 2006/0227309 A1 | 10/2006 | Loopstra et al. |
| 2006/0231206 A1 | 10/2006 | Nagasaka et al. |
| 2006/0238731 A1 | 10/2006 | Beems et al. |
| 2006/0238733 A1 | 10/2006 | Beems et al. |
| 2007/0035267 A1 | 2/2007 | Gao et al. |
| 2007/0052976 A1 | 3/2007 | Pril et al. |
| 2007/0076218 A1 | 4/2007 | Van Empel et al. |
| 2007/0256471 A1 | 11/2007 | Loopstra et al. |
| 2007/0263191 A1 | 11/2007 | Shibazaki |
| 2007/0288121 A1 | 12/2007 | Shibazaki |
| 2008/0043212 A1 | 2/2008 | Shibazaki |
| 2008/0074681 A1 | 3/2008 | Loopstra et al. |
| 2008/0088843 A1 | 4/2008 | Shibazaki |
| 2008/0094592 A1 | 4/2008 | Shibazaki |
| 2008/0240501 A1 | 10/2008 | Van Der Wijst et al. |
| 2008/0291415 A1 | 11/2008 | Shibazaki |
| 2009/0207422 A1 | 8/2009 | Loopstra et al. |
| 2010/0220335 A1 | 9/2010 | Loopstra et al. |
| 2011/0075154 A1 | 3/2011 | Loopstra et al. |

FOREIGN PATENT DOCUMENTS

| | | |
|---|---|---|
| DE | 224 448 A1 | 7/1985 |
| EP | 0 482 553 A2 | 4/1992 |
| EP | 1182509 A2 | 2/2002 |
| EP | 1 420 298 A2 | 5/2004 |
| EP | 1 621 933 A2 | 2/2006 |
| EP | 1 630 585 A1 | 3/2006 |
| EP | 1 975 982 A1 | 10/2008 |
| JP | A-58-202448 | 11/1983 |
| JP | A-59-019912 | 2/1984 |
| JP | A-61-044429 | 3/1986 |
| JP | S61-228309 A | 10/1986 |
| JP | A-62-065326 | 3/1987 |
| JP | A-63-147207 | 6/1988 |
| JP | A-63457419 | 6/1988 |
| JP | A-63-292005 | 11/1988 |
| JP | A-03-167419 | 7/1991 |
| JP | A-4-265805 | 9/1992 |
| JP | A-04-305915 | 10/1992 |
| JP | A-04-305917 | 10/1992 |
| JP | A-05-062877 | 3/1993 |
| JP | A-05-129184 | 5/1993 |
| JP | A-06-124873 | 5/1994 |
| JP | A-06-283403 | 10/1994 |
| JP | A-07-176468 | 7/1995 |
| JP | A-07-190741 | 7/1995 |
| JP | A-07-220990 | 8/1995 |
| JP | A-07-270122 | 10/1995 |
| JP | A-08-130179 | 5/1996 |
| JP | A-08-316125 | 11/1996 |
| JP | A-10-063011 | 3/1998 |
| JP | A-10-214783 | 8/1998 |
| JP | A-10-223528 | 8/1998 |
| JP | A-10289943 | 10/1998 |
| JP | H10-284409 A | 10/1998 |
| JP | A-10-303114 | 11/1998 |
| JP | A-10-340846 | 12/1998 |
| JP | A-11-176727 | 7/1999 |
| JP | A-2000-058436 | 2/2000 |
| JP | A-2002-151405 | 5/2002 |
| JP | B2-3303386 | 5/2002 |
| JP | A-2003-227735 | 8/2003 |
| JP | A-2003-249443 | 9/2003 |
| JP | 2003-279385 A | 10/2003 |
| JP | A-2003-347184 | 12/2003 |
| JP | A-2004-101362 | 4/2004 |
| JP | A-2004-140290 | 5/2004 |
| JP | A-2004-519850 | 7/2004 |
| JP | A-2004-349494 | 12/2004 |
| JP | A-2005-268811 | 9/2005 |
| JP | A-2006-054452 | 2/2006 |
| JP | A-2006-303505 | 11/2006 |
| JP | A-2007-093546 | 4/2007 |
| WO | WO 98/40791 | 9/1998 |
| WO | WO 99/23692 A | 5/1999 |
| WO | WO 99/23692 A1 | 5/1999 |
| WO | WO 99/46835 | 9/1999 |

(56) References Cited

FOREIGN PATENT DOCUMENTS

| WO | WO 99/49504 A1 | 9/1999 |
|---|---|---|
| WO | 00/06973 A1 | 2/2000 |
| WO | WO 00/17724 A1 | 3/2000 |
| WO | WO 01/35168 A1 | 5/2001 |
| WO | WO 2004/019128 A2 | 3/2004 |
| WO | WO 2004/053955 A1 | 6/2004 |
| WO | WO 2004/055803 A1 | 7/2004 |
| WO | WO 2004/057590 A1 | 7/2004 |
| WO | WO 2004/107011 A1 | 12/2004 |
| WO | WO 2005/074014 A1 | 8/2005 |
| WO | WO 2006/038952 A2 | 4/2006 |

OTHER PUBLICATIONS

Mar. 9, 2012 Japanese Office Action in corresponding Japanese Appln. No. 2007-554984 w/English Translation.
Apr. 5, 2013 Decision on Appeal issued in Japanese Patent Application No. 2007-554984 (with English Translation).
Apr. 15, 2013 Office Action issued in European Application No. 07 707 109.0.
May 1, 2013 Office Action issued in Japanese Patent Application No. 2010-169058 (with translation).
May 1, 2013 Office Action issued in Japanese Patent Application No. 2012-093747 (with translation).
Jul. 6, 2012 Decision of Refusal issued in Japanese Patent Application No. 2007-554984 (with translation).
Castro H.F.F. et al. "Evaluation of the measurement uncertainty of a positional error calibrator based on a laser interferometer." International Journal of Machine Tools & Manufacture 45 (2005) 285-291.
Sep. 20, 2011 Extended Search Report issued in EP Application No. 07707109.0.
Feb. 5, 2010 Office Action issued in U.S. Appl. No. 11/655,082.
Jun. 11, 2010 Notice of Allowance issued in U.S. Appl. No. 11/655,082.
Aug. 5, 2010 Notice of Allowance issued in U.S. Appl. No. 11/655,082.
Apr. 17, 2007 Written Opinion of the International Searching Authority issued in PCT/JP2007/050821 (with translation).
Sep. 30, 2013 Office Action issued in Japanese Patent Application No. 2012-093747 (with translation).
Oct. 29, 2013 Office Action issued in Japanese Patent Application No. 2012-078982 (with translation).
Jul. 25, 2013 Office Action issued in U.S. Appl. No. 12/900,372.
Jul. 24, 2013 Office Action issued in U.S. Appl. No. 13/645,149.
Jul. 30, 2013 Office Action issued in U.S. Appl. No. 13/646,125.
Nov. 14, 2013 Office Action issued in U.S. Appl. No. 12/900,372.
Mar. 4, 2014 Office Action issued in Japanese Patent Application No. 2013-098046 (with translation).
Jan. 6, 2014 Office Action issued in U.S. Appl. No. 13/645,149.
Jan. 8, 2014 Office Action issued in U.S. Appl. No. 13/646,125.
Nov. 28, 2014 Office Action issued in U.S. Appl. No. 12/900,372.
Dec. 1, 2014 Office Action issued in U.S. Appl. No. 13/645,149.
Apr. 6, 2015 Office Action issued in U.S. Appl. No. 13/645,149.

* cited by examiner

EXPOSURE APPARATUS AND DEVICE MANUFACTURING METHOD MEASURING POSITION OF SUBSTRATE STAGE USING AT LEAST THREE OF FOUR ENCODER HEADS

CROSS-REFERENCE TO RELATED APPLICATIONS

This is a division of application Ser. No. 12/900,372 filed Oct. 7, 2010 which is a division of Ser. No. 11/655,082 filed Jan. 19, 2007 and claims the benefit of Provisional Application No. 60/851,045 filed Oct. 12, 2006, the disclosure of which is hereby incorporated herein by reference in its entirety.

BACKGROUND OF THE INVENTION

1. Field of the Invention

The present invention relates to movable body drive methods, movable body drive systems, pattern forming methods, pattern forming units, exposure methods, exposure apparatus, and device manufacturing methods, and more particularly to a movable body drive method in which a movable body is driven in at least a uniaxial direction, a movable body drive system suitable for applying the method, a pattern formation method that uses the movable body drive method, a pattern forming apparatus that is equipped with the movable body drive system, an exposure method that uses the movable body drive method, an exposure apparatus that has the movable body drive system, and a device manufacturing method that uses the pattern forming method.

2. Description of the Background Art

Conventionally, in a lithography process for manufacturing microdevices (electronic devices and the like) such as a liquid crystal display element or the like, a reduction projection exposure apparatus by a step-and-repeat method (the so-called stepper), a scanning projection exposure apparatus by a step-and-scan method (the so-called scanning stepper (also called a scanner)) and the like have been relatively frequently used.

With these types of exposure apparatus, in order to transfer a pattern of a reticle (or a mask) onto a plurality of shot areas on a wafer, the wafer stage that holds the wafer is driven in a XY two-dimensional direction by a linear motor or the like. Especially in the case of a scanning stepper, not only the wafer stage but also the reticle stage is driven in the scanning direction with predetermined strokes by a linear motor or the like. Position measurement of the reticle stage and the wafer stage is normally performed using a laser interferometer, which has good stability of measurement values over a long period of time, and also has high resolution.

However, due to finer patterns that come with higher integration of semiconductor devices, position control of the stages with higher precision is becoming required, and short-term fluctuation of measurement values due to temperature fluctuation of the atmosphere on the beam optical path of the laser interferometer is now becoming a matter that cannot be ignored.

Meanwhile, recently, as a type of a position measurement unit, an encoder that has a measurement resolution of the same level or higher than a laser interferometer has been introduced (refer to, for example, U.S. Pat. No. 6,639,686). However, since the encoder uses a scale (grating), various error factors (drift of grating pitch, fixed position drift, thermal expansion and the like) that occur in the scale due to the passage of use time exist, which makes the encoder lack in mechanical long-term stability. Therefore, the encoder has a drawback of lacking measurement value linearity and being inferior in long-term stability when compared with the laser interferometer.

SUMMARY OF THE INVENTION

The present invention has been made in consideration of the circumstances described above, and according to the first aspect of the present invention, there is provided a first movable body drive method in which a movable body is driven in at least a uniaxial direction, the method comprising: a first process in which a calibration operation is performed where positional information of the movable body in the uniaxial direction is measured using a first measurement unit and a second measurement unit whose measurement values excel in short-term stability when compared with measurement values of the first measurement unit, and based on measurement results of the first and second measurement units, correction information for correcting measurement values of the second measurement unit is decided; and a second process in which the movable body is driven in the uniaxial direction based on the measurement values of the second measurement unit and the correction information.

According to this method, by the calibration method above, correction information is decided for correcting the measurement values of the second measurement unit whose short-term stability of the measurement values excel when compared with the measurement values of the first measurement unit, using the measurement values of the first measurement unit. Then, based on the measurement values of the second measurement unit and the correction information, the movable body is driven in the uniaxial direction. Accordingly, it becomes possible to drive the movable body in the uniaxial direction with good accuracy, based on the measurement values of the second measurement unit that have been corrected using the correction information, that is, the measurement values of positional information of the movable body in the uniaxial direction whose long-term stability is also favorable, in addition to the short-term stability.

According to the second aspect of the present invention, there is provided a second movable body drive method in which a movable body is driven within a two-dimensional plane parallel to a first axis and a second axis orthogonal to each other wherein positional information of the movable body in a direction parallel to the first axis is measured, using a pair of first gratings that each include a grating periodically disposed in a direction parallel to the first axis within a plane parallel to the two-dimensional plane on the movable body and is placed apart in a direction orthogonal to the longitudinal direction of the grating within the plane and a first encoder that has a head unit that intersects the longitudinal direction, and positional information of the movable body in a direction parallel to the second axis is measured, using a second grating that includes a grating, which extends in a direction intersecting the longitudinal direction of the first grating serving as a longitudinal direction and is periodically disposed in a direction parallel to the second axis, and a second encoder that has a head unit that intersects the longitudinal direction of the second grating, whereby the movable body is driven based on the positional information that has been measured.

According to this method, as long as the movable body remains within a predetermined stroke range where a head unit that the first encoder has faces at least one of the gratings of the pair of the first gratings, and a head that the second encoder has faces the second grating, then, at least one of the first grating and the first encoder measure the positional information of the movable body in the direction parallel to the first axis, and the second grating and the second encoder measure the positional information of the movable body in the direction parallel to the second axis. Since the short-term stability of the measurement values of the first and second encoders is favorable, the positional information of the movable body within the two-dimensional plane is measured with good accuracy. Then, the movable body is driven, based on the positional information of the movable body measured with good accuracy. Accordingly, it becomes possible to drive the movable body with good accuracy.

According to the third aspect of the present invention, there is provided a third movable body drive method in which a movable body is driven at least in a uniaxial direction, the method comprising: a drive process in which based on measurement values of an encoder that irradiates a detection light on a grating placed on an upper surface of the movable body with a predetermined direction serving as a period direction and measures positional information of the movable body in the predetermined direction based on its reflection light and correction information of a pitch of the grating, the movable body is driven in the predetermined direction.

According to this method, the movable body can be driven with good accuracy without being affected by drift or the like of the grating pitch.

According to the fourth aspect of the present invention, there is provided a first pattern formation method in which a pattern is formed on an object, wherein a movable body on which the object is mounted is driven using one of the first and third movable body drive method of the present invention so that pattern formation with respect to the object can be performed.

According to this method, by performing pattern formation on the object mounted on the movable body driven with good accuracy using one of the first and third movable body drive method, it becomes possible to form the pattern on the object with good accuracy.

According to the fifth aspect of the present invention, there is provided a second pattern formation method in which a pattern is formed on an object, wherein at least one of a plurality of movable bodies including a movable body on which the object is mounted is driven using one of the first and third movable body drive method of the present invention so that pattern formation with respect to the object can be performed.

According to this method, for pattern formation with respect to the object, at least one of a plurality of movable bodies is driven with good accuracy by one of the first and third movable body drive method, and a pattern is generated on the object mounted on one of the movable bodies.

According to the sixth aspect of the present invention, there is provided a device manufacturing method including a pattern formation process wherein in the pattern formation process, a pattern is formed on a substrate using one of the first and second pattern formation method of the present invention.

According to the seventh aspect of the present invention, there is provided a first exposure method in which a pattern is formed on an object by irradiating an energy beam, wherein a movable body on which the object is mounted is driven using one of the first and third movable body drive method of the present invention so that the energy beam and the object are relatively moved.

According to this method, for the relative movement of the energy beam irradiated on the object and the object, the movable body on which the object is mounted is driven with good accuracy using one of the first and third movable body drive method of the present invention. Accordingly, it becomes possible to form a pattern on an object with good accuracy by scanning exposure.

According to the eighth aspect of the present invention, there is provided a first movable body drive system that drives a movable body in at least a uniaxial direction, the system comprising: a first measurement unit that measures positional information of the movable body in the uniaxial direction; a second measurement unit that measures positional information of the movable body in the uniaxial direction whose short-term stability of measurement values excels the first measurement unit; a calibration unit that performs a calibration operation of deciding correction information so as to correct measurement values of the second measurement unit using the measurement values of the first measurement unit; and a drive unit that drive the movable body in the uniaxial direction based on the measurement values of the second measurement unit and the correction information.

According to this system, the calibration unit performs the calibration operation described above, and correction information is decided for correcting the measurement values of the second measurement unit whose short-term stability of the measurement values excels when compared with the first measurement unit, using the measurement values of the first measurement unit. Then, based on the measurement values of the second measurement unit and the correction information, the movable body is driven in the uniaxial direction. Accordingly, it becomes possible to drive the movable body in the uniaxial direction with good accuracy, based on the measurement values of the second measurement unit that have been corrected using the correction information, that is, the measurement values of positional information of the movable body in the uniaxial direction whose long-term stability is also favorable, in addition to the short-term stability.

According to the ninth aspect of the present invention, there is provided a second movable body drive system that drives a movable body within a two-dimensional plane parallel to a first axis and a second axis which are orthogonal, the system comprising: a first grating placed on a plane parallel to the two-dimensional plane on the movable body that also includes a grating disposed periodically in a direction parallel to the first axis; a pair of second gratings that extends in a direction intersecting the direction serving as a longitudinal direction on a plane parallel to the two-dimensional plane on the movable body, and is also placed apart in a direction orthogonal to the longitudinal direction, and also includes a grating periodically disposed in a direction parallel to the second axis; a first encoder that has a head unit intersecting the longitudinal direction of the first grating, and measures positional information of the movable body in the direction parallel to the first axis along with the first grating; a second encoder that has a head unit intersecting the longitudinal direction of the pair of second gratings, and measures positional information of the movable body in the direction parallel to the second axis along with the pair of second gratings; and a drive unit that drives the movable body based on positional information measured by the first and second encoders.

According to this method, as long as the movable body remains within a predetermined stroke range where a head unit that the first encoder has faces at least one of the gratings of the pair of the first gratings, and a head that the second encoder has faces the second grating, then, the first grating and the first encoder measure the positional information of the movable body in the direction parallel to the first axis, and the second grating and the second encoder measures the positional information of the movable body in the direction parallel to the second axis. Since the short-term stability of the measurement values of the first and second encoders is favorable, the positional information of the movable body within the two-dimensional plane is measured with good accuracy. Then, the movable body is driven, based on the positional information of the movable body measured with good accuracy. Accordingly, it becomes possible to drive the movable body with good accuracy.

According to the tenth aspect of the present invention, there is provided a third movable body drive system that drives a movable body within a two-dimensional plane parallel to a first axis and a second axis which are orthogonal, the system comprising: a first grating that extends in a direction parallel to the second axis with the direction serving as a longitudinal direction on the movable body, and also has a grating periodically disposed in a direction parallel to the first axis; a second grating that extends in a direction parallel to the first axis with the direction serving as a longitudinal direction on the movable body, and also has a grating periodically disposed in a direction parallel to the second axis; a first encoder that has a head unit that intersects the direction parallel to the second axis and measures positional information of the movable body in the direction parallel to the first axis along with the first grating; a second encoder that has a head unit that intersects the direction parallel to the first axis and measures positional information of the movable body in the direction parallel to the second axis along with the second grating; and a drive unit that drives the movable body based on the positional information measured by the first and second encoders, wherein at least one of the first and second encoders has a plurality of the head units placed apart in the longitudinal direction.

According to this system, by the first grating and the first encoder, and the second grating and the second encoder, rotation (rotation around the axis orthogonal to the two-dimensional plane) in the two-dimensional plane is measured, in addition to the positional information of the movable body in the direction parallel to the first axis and the positional information in the direction parallel to the second axis. Further, since the short-term stability of the measurement values of the first and second encoders is favorable, positional information (including rotational information) of the movable body within the two-dimensional plane is measured with good accuracy. The, based on the positional information of the movable body measured with good accuracy, the drive unit drives the movable body. Accordingly, it becomes possible to drive the movable body with good accuracy.

According to the eleventh aspect of the present invention, there is provided a fourth movable body drive system that drives a movable body in at least uniaxial direction, the system comprising: an encoder that irradiates a detection light on a grating placed in a predetermined direction, which serves as a periodical direction, on an upper surface of the movable body and measures positional information of the movable body in the predetermined direction based on a reflection light; and a drive unit that drives the movable body in the predetermined direction based on measurement values of the encoder and correction information of a pitch of the grating.

According to this system, the drive unit drives the movable body in the predetermined direction, based on the measurement values of the encoder and the correction information of the pitch of grating. Accordingly, the movable body can be driven with good accuracy without being affected by drift or the like of the grating pitch.

According to the twelfth aspect of the present invention, there is provided a first pattern forming apparatus that forms a pattern on an object, the unit comprising: a patterning unit that generates a pattern on the object; and any one of the first to fourth movable body drive system of the present invention, wherein the movable body drive system drives the movable body on which the object is mounted so as to perform pattern formation with respect to the object.

According to this system, by generating a pattern with the patterning unit on the object on the movable body driven with good accuracy using any one of the first to fourth movable body drive system of the present invention, it becomes possible to form a pattern on an object with good accuracy.

According to the thirteenth aspect of the present invention, there is provided a second pattern forming apparatus that forms a pattern on an object, the unit comprising: a patterning unit that generates a pattern on the object; a plurality of movable bodies including a movable body on which the object is mounted; and any one of the first to fourth movable body drive system of the present invention, wherein the movable body drive system drives at least one of the plurality of movable bodies so as to perform pattern formation with respect to the object.

According to this system, for pattern formation with respect to the object, at least one of a plurality of movable bodies is driven with good accuracy by one of the first to fourth movable body drive system, and the patterning unit generates a pattern on the object mounted on one of the movable bodies.

According to the fourteenth aspect of the present invention, there is provided a first exposure apparatus that forms a pattern on an object by irradiating an energy beam, the apparatus comprising: a patterning unit that irradiates the energy beam on the object; and any one of the first to fourth movable body drive system of the present invention, wherein the movable body on which the object is mounted is driven by the movable body drive system so that the energy beam and the object are relatively moved.

According to this apparatus, for relative movement of the energy beam irradiated on the object from the patterning unit and the object, the movable body on which the object is mounted is driven with good accuracy using any one of the first to fourth movable body drive system of the present invention. Accordingly, it becomes possible to form a pattern on an object with good accuracy by scanning exposure.

According to the fifteenth aspect of the present invention, there is provided a second exposure method in which an exposure operation by a step-and-scan method that alternately repeats scanning exposure of synchronously moving a mask and an object in a predetermined scanning direction so as to transfer a pattern formed on the mask onto a divided area on the object and movement of the object to perform scanning exposure on a following divided area is performed to sequentially transfer the pattern onto a plurality of divided areas on the object, wherein positional information of a mask stage that holds the mask is measured with an encoder and movement of the mask stage is controlled, based on measurement values of the encoder and correction information of the measurement values of the encoder decided from positional information of the mask stage using the encoder and an interferometer at least during scanning exposure to each divided area, and the correction information is calibrated, based on measurement values of the interferometer and the encoder stored during the exposure operation by the step-and-scan method.

According to this method, on exposure by the step-and-scan method to the next object, the movement of the mask stage during scanning exposure (at the time of pattern transfer) of each divided area can be controlled with good accuracy, based on the measurement values of the encoder which have been corrected using the correction information, that is, measurement values of the positional information of the mask stage in the scanning direction having good linearity and long-term stability, in addition to good short-term stability. Accordingly, the pattern formed on the mask can be transferred onto the plurality of divided areas on the object by scanning exposure with good precision.

According to the sixteenth aspect of the present invention, there is provided a second exposure apparatus that performs an exposure operation by a step-and-scan method which alternately repeats scanning exposure of synchronously moving a mask and an object in a predetermined scanning direction so as to transfer a pattern formed on the mask onto a divided area on the object and movement of the object to perform scanning exposure on a following divided area, the apparatus comprising: a mask stage movable in at least the scanning direction holding the mask; an object stage movable in at least the scanning direction holding the object; an interferometer and an encoder that measure positional information of the mask stage in the scanning direction; and a control unit that controls movement of the mask stage, based on measurement values of the encoder and correction information of the measurement values of the encoder decided from positional information of the mask stage using the encoder and an interferometer at least during scanning exposure to each divided area, and calibrates the correction information, based on measurement values of the interferometer and the encoder stored during the exposure operation by the step-and-scan method.

According to this apparatus, when the controller performs the exposure operation by the step-and-scan method in which a pattern is sequentially transferred onto a plurality of divided areas on an object, the controller controls the movement of the mask stage based on the measurement values of the encoder and the correction information of the measurement values of the encoder decided from the positional information of the mask stage by the encoder and the interferometer during the scanning exposure of each divided area, and calibrates the correction information based on the measurement values of the interferometer and the encoder stored during the exposure operation by the step-and-scan method. Accordingly, the movement of the mask stage during scanning exposure (at the time of pattern transfer) with respect to each divided area on the object after calibration can be controlled with good precision, based on the measurement values of the encoder that have been corrected using the calibrated correction information, that is, measurement values of the positional information of the mask stage in the scanning direction having good linearity and long-term stability, in addition to good short-term stability. Accordingly, the pattern formed on the mask can be transferred with good accuracy onto the plurality of divided areas on the object by the scanning exposure.

According to the seventeenth aspect of the present invention, there is provided a third exposure apparatus that synchronously moves a mask and an object in predetermined scanning direction with respect to an illumination light and transfers a pattern formed on the mask onto the object, the apparatus comprising: a mask stage movable in at least the scanning direction holding the mask; an object stage movable in at least the scanning direction holding the object; an interferometer and an encoder that measure positional information of the mask stage in the scanning direction; a calibration unit that decides correction information in which measurement values of the encoder is corrected using measurement values of the interferometer, based on measurement results of the interferometer and the encoder, which are measured by driving the mask stage in the scanning direction at a slow speed at a level in which the short-term variation of the measurement values of the interferometer can be ignored and measuring positional information of the mask stage in the scanning direction using the interferometer and the encoder; and a control unit that controls movement of the mask stage during transfer of the pattern, based on the measurement value of the encoder and the correction information.

According to this apparatus, by the calibration unit, the mask stage is driven in the scanning direction at a slow speed at a level in which the short-term variation of the measurement values of the interferometer can be ignored, and the positional information of the mask stage in the scanning direction is measured using the interferometer and the encoder. Then, based on the measurement results of the interferometer and the encoder, correction information for correcting the measurement values of the encoder using the measurement values of the interferometer, that is, correction information for correcting the measurement values of the encoder whose short-term stability of the measurement values excels the interferometer, using the measurement values of the interferometer whose linearity and long-term stability of the measurement values excels the encoder, is decided. Then, the control unit controls the movement of the mask stage during pattern transfer, based on the measurement values of the encoder and the correction information. Accordingly, it becomes possible to control the movement of the mask stage in the scanning direction during pattern transfer with good accuracy, based on the measurement values of the encoder that has been corrected using the correction information, that is, the measurement values of the positional information of the mask stage having good linearity and long-term stability, in addition to good short-term stability. Accordingly, the pattern formed on the mask can be transferred with good accuracy onto the object by the scanning exposure.

According to the eighteenth aspect of the present invention, there is provided a fourth exposure apparatus that synchronously moves a mask and an object in predetermined scanning direction with respect to an illumination light and transfers a pattern formed on the mask onto the object, the apparatus comprising: a mask stage movable in at least the scanning direction holding the mask; an object stage movable in at least the scanning direction holding the object; an interferometer and an encoder that measure positional information of the mask stage in the scanning direction; a calibration unit that corrects scaling error in a map information that denotes a relation between the measurement values of the interferometer and the measurement values of the encoder, based on the measurement values of the interferometer and the encoder each obtained at a predetermined sampling interval, while position setting the mask stage at a plurality of positions including a first position and a second position which are positions on both edges of a range where the illumination light is irradiated on a pattern area of a mask subject to exposure; and a control unit that controls the movement of the mask stage during transfer of the pattern, based on the measurement values of the encoder and the map information after correction.

According to this apparatus, the calibration unit obtains measurement values of the interferometer and the encoder at a predetermined sampling interval while position setting the mask stage at a plurality of positions including a first position and a second position which are positions on both edges of a range where the illumination light is irradiated on a pattern area of a mask subject to exposure, and based on the measurement values that have been obtained, the calibration unit performs calibration operation of correcting scaling error in a map information that denotes a relation between the measurement values of the interferometer and the measurement values of the encoder. That is, the scaling error of the map information that denotes a relation between the measurement values of the encoder whose short-term stability of the measurement values excels the interferometer and the measurement values of the interferometer whose linearity and long-term stability of the measurement values excels the encoder is corrected. Then, by the control unit, based on the measurement values of the encoder and the map information after correction, the movement of the mask stage during pattern transfer is controlled. Accordingly, it becomes possible to control the movement of the mask stage in the scanning direction during pattern transfer with good accuracy, based on the map information after correction and the measurement values of the encoder.

DESCRIPTION OF THE EMBODIMENTS

An embodiment of the present invention will be described below, referring to FIGS. 1 to 21.

Figure 1:
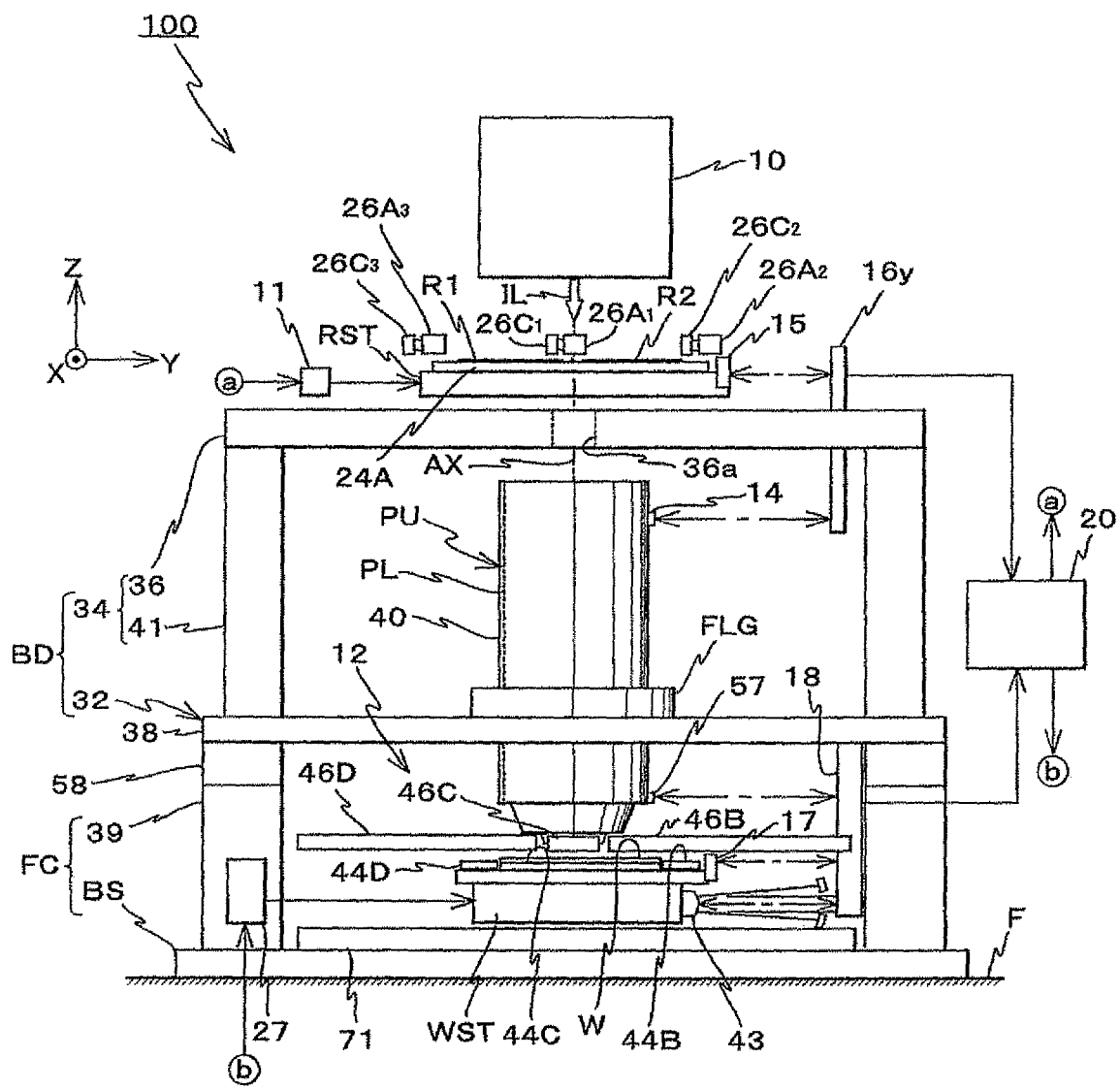
FIG. 1 is a view that shows a schematic arrangement of an exposure apparatus related to an embodiment.

FIG. 1 shows the entire configuration of an exposure apparatus 100 related to the embodiment. Exposure apparatus 100 is a scanning exposure apparatus based on a step-and-scan method, that is, the so-called scanning stepper. As it will be described later, a projection optical system PL is arranged in the embodiment, and in the description below, a direction parallel to an optical axis AX of projection optical system PL will be set as the Z-axis direction, a direction in which a reticle and a wafer are relatively scanned within a plane orthogonal to the Z-axis will be set as the Y-axis direction, and a direction orthogonal to both the Z-axis and Y-axis will be set as the X-axis direction. Further, the rotational (gradient) direction around the X-axis, Y-axis, and Z-axis will be set as θx direction, θy direction, and θz direction, respectively.

Exposure apparatus 100 is equipped with an illumination system 10 that includes a light source and an illumination optical system and illuminates reticles R1 and R2 with an illumination light (exposure light) IL, a reticle stage RST that holds reticles R1 and R2, a projection unit PU, a wafer stage unit 12 that includes a wafer stage WST on which a wafer W is mounted, a body BD on which reticle stage RST, projection unit PU and the like are mounted, a control system for these components and the like.

Illumination system 10 illuminates a slit shaped illumination area IAR (refer to FIG. 2) that extends in the X-axis direction set with a reticle blind (masking system) (not shown) on reticle R1 or R2 by an illumination light IL with a substantially uniform illuminance. In this case, as illumination light IL, an ArF excimer laser beam (wavelength 193 nm) is used.

Reticle stage RST is supported on a reticle base 36 that configures the top plate of a second column 34 of reticle base 36, for example, via a clearance of several μm by air bearings or the like (not shown) arranged on its bottom surface. As reticle stage RST, for example, a reticle stage that can hold one reticle, or a twin reticle stage that can move independently while each holding one reticle can be used. In this embodiment, a reticle stage by a double reticle holder method that can hold two reticles at a time is used.

Reticle stage RST, in this case, can be finely driven two-dimensionally (in the X-axis direction, the Y-axis direction, and the θz direction) within an XY plane perpendicular to optical axis AX of projection optical system PL by a reticle stage drive system 11 which includes a linear motor or the like. Further, reticle stage RST can be driven on reticle base 36 in a predetermined scanning direction (in this case, the Y-axis direction, which is the lateral direction of the page surface in FIG. 1) at a designated scanning speed. Reticle stage RST can employ a coarse/fine movement structure as is disclosed in, for example, Kokai (Japanese Patent Unexamined Application Publication) No. 8-130179 (the corresponding U.S. Pat. No. 6,721,034), and its configuration is not limited to the one referred to in this embodiment (FIG. 2 or the like).

Reticle stage RST is configured so that its positional information within the XY plane (movement plane) can be measured by a reticle interferometer system, which includes a reticle Y laser interferometer (hereinafter referred to as "reticle Y interferometer") 16y and the like, and an encoder system, which includes encoder head (hereinafter simply referred to as "head") $26A_1$ to $26A_3$, $26C_1$ to $26C_3$, a movement scale 24A and the like. FIG. 1 shows a state where the upper edge surface of reticles R1 and R2 are exposed above movement scale 24A. However, this is for the sake of convenience when describing the embodiment, therefore, the actual state will be different.

The configuration and the like of reticle stage RST, and the reticle interferometer system and encoder system that measure the position of reticle stage RST within the XY plane (movement plane) will be further described below.

Figure 2:
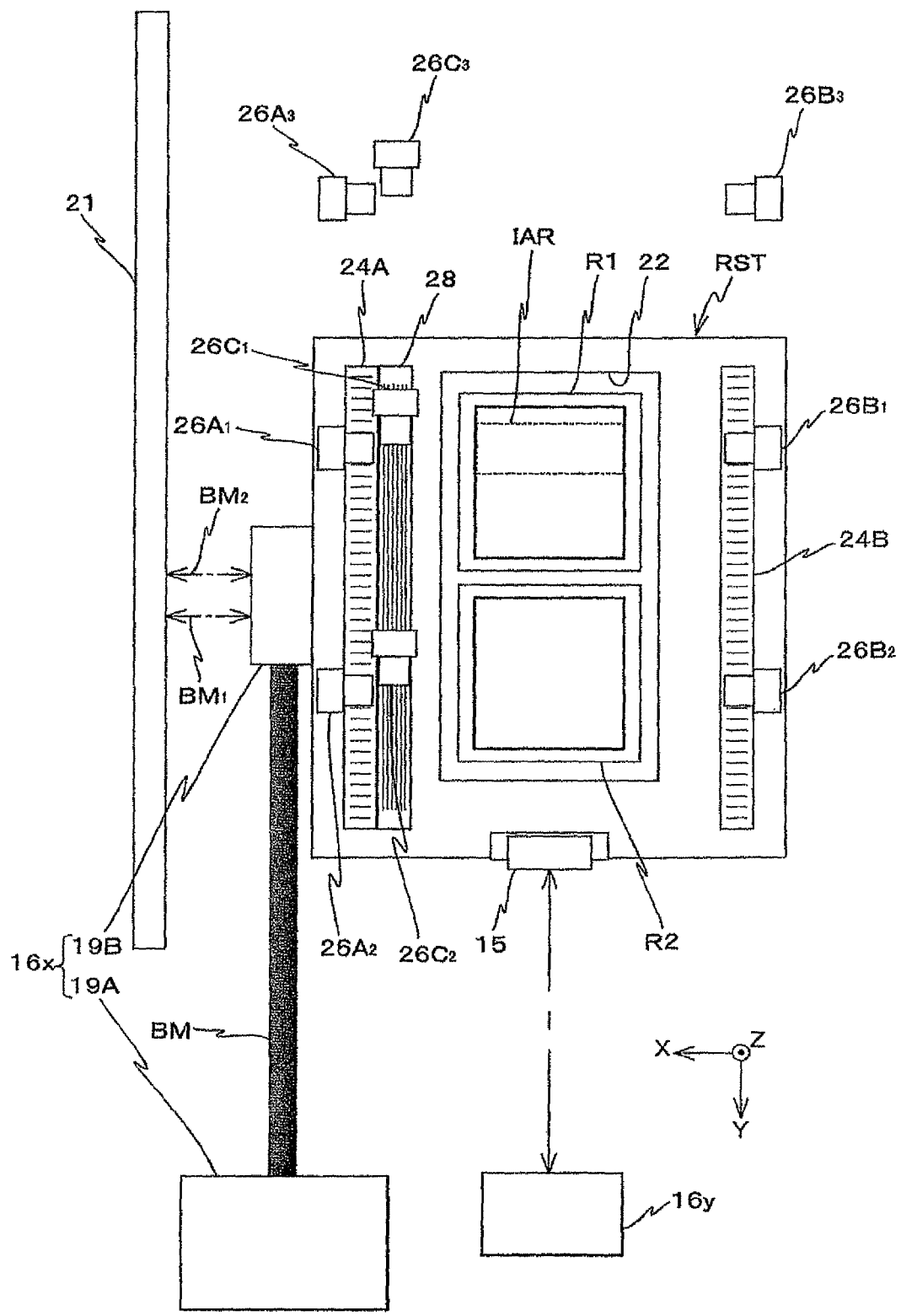
FIG. 2 is a planar view that shows a reticle stage, along with an encoder system which measures positional information of the reticle stage and an interferometer system.

As is shown in FIG. 2, in the center of reticle stage RST, a rectangular recessed section 22 is formed, which extends narrowly in the Y-axis direction (the scanning direction) in a planar view (when viewed from above). Inside recessed section 22, two substantially square openings (not shown) are formed side by side in the Y-axis direction, and in a state covering these openings reticle R1 and reticle R2 are placed side by side in the Y-axis direction. Reticles R1 and R2 are each vacuum suctioned by a suction mechanism (not shown) such as, for example, a vacuum chuck, which is arranged on the bottom surface within recessed section 22 in the two openings, on both sides in the X-axis direction.

Further, on the +X side edge section and −X side edge section on the upper surface of reticle stage RST, a pair of movement scales 24A and 24B are arranged with the Y-axis direction being the longitudinal direction, in an arrangement symmetric to a center axis parallel to the Y-axis direction that passes the center of illumination area IAR (in the embodiment, the center substantially coincides with optical axis AX within a first plane (object plane) of projection optical system PL). Movement scales 24A and 24B are made of the same material (such as, for example, ceramics or low thermal expansion glass), and on the surface, a reflection type diffraction grating that has a period direction in the Y-axis direction is formed in an arrangement symmetric to the center axis referred to above. Movement scales 24A and 24B are fixed to reticle stage RST, for example, by vacuum suction (or a plate spring) or the like, so that expansion/contraction does not occur locally.

Above movement scales 24A and 24B (on the +Z side), as is shown in FIG. 2, two pairs of heads $26A_1$ and $26A_2$, and $26B_1$ and $26B_2$ used for measuring the position in the Y-axis direction are arranged facing movement scales 24A and 24B, in an arrangement symmetric to the center axis referred to above (refer to FIG. 1). Of these heads, heads $26A_1$ and $26B_1$ are placed at positions where their measurement centers substantially coincide with a straight line (measurement axis) in the X-axis direction that passes the center of illumination area IAR previously described. Further, heads $26A_2$ and $26B_2$ are placed at positions the same distance away from heads $26A_1$ and $26B_1$ in the +Y direction, also in plane with heads $26A_1$ and $26B_1$. Furthermore, also in plane with heads $26A_1$ and $26B_1$ and in symmetry with heads $26A_2$ and $26B_2$ regarding the above measurement axis, a pair of heads $26A_3$ and $26B_3$ is placed at positions the same distance away from heads $26A_1$ and $26B_1$ in the −Y direction. The three pairs of heads $26A_1$ and $26B_1$, $26A_2$ and $26B_2$, and $26A_3$ and $26B_3$ are each fixed to reticle base 36 via support members (not shown).

Further, on the −X side of movement scale 24A on the upper surface of reticle stage RST, a movement scale 28 with the Y-axis direction being the longitudinal direction is placed in line with movement scale 24A, and is fixed to reticle stage RST by, for example, vacuum suction (or a spring plate) or the like. Movement scale 28 is made of the same material as movement scales 24A and 24B (such as, for example, ceramics or low thermal expansion glass), and on the upper surface, a reflection type diffraction grating that has a period direction in the X-axis direction is formed covering almost the entire length in the Y-axis direction.

Above movement scale 28 (on the +Z side), as is shown in FIG. 2, two heads $26C_1$ and $26C_2$ used for measuring the position in the X-axis direction are arranged facing movement scale 28 (refer to FIG. 1). Of these heads, head $26C_1$ is positioned substantially on the straight line (measurement axis) in the X-axis direction that passes the center of illumination area IAR previously described. Further, head $26C_2$ is placed at a position in the vicinity of head $26A_2$, which is a predetermined distance away from head $26C_1$ in the +Y direction, and also in plane with heads $26A_1$ and $26A_2$.

Furthermore, also in plane with head $26C_1$ and in symmetry with head $26C_2$ regarding the above measurement axis, a head $26C_3$ is placed at a position a predetermined distance away from head $26C_1$ in the −Y direction. The three heads $26C_1$, $26C_2$, and $26C_3$ are each fixed to reticle base 36 via support members (not shown). In the embodiment, the nine heads $26A_1$ to $26A_3$, $26B_1$ to $26B_3$, and $26C_1$ to $26C_3$ are fixed to reticle base 36 via support members (not shown), however, the present invention is not limited to this, and for example, the heads can be arranged in a frame member set on a floor surface F or a base plate BS via a vibration isolation mechanism.

In the embodiment, heads $26A_1$ and $26B_1$ and movement scales 24A and 243 that face the heads constitute a pair of Y linear encoders used for measuring the position of reticle stage RST in the Y-axis direction (Y position). In the description below, for the sake of convenience, these Y linear encoders will be indicated as Y linear encoders $26A_1$ and $26B_1$ using the same reference numerals as the heads.

The measurement axes of Y linear encoders $26A_1$ and $26B_1$ are located the same distance away in the X-axis direction from the center of illumination area IAR (in the embodiment, coinciding with optical axis AX of projection optical system PL) previously described. And, at the point of exposure or the like, for example, the Y position of reticle stage RST is measured, based on an average value of the measurement values of Y linear encoders $26A_1$ and $26B_1$. More specifically, the substantial measurement axes for measuring the positional information of reticle stage RST with Y linear encoders $26A_1$ and $26B_1$ passes through optical axis AX of projection optical system PL. Accordingly, at the point of exposure or the like, the Y position of reticle stage RST can be measured using Y linear encoders $26A_1$ and $26B_1$ without Abbe errors. Furthermore, rotational information of reticle stage RST in the θz direction (yawing) is obtained based on the measurement values of Y linear encoders $26A_1$ and $26B_1$.

Similarly, heads $26A_2$ and $26A_3$ and movement scale 24A that faces the heads each constitute a Y linear encoder used for measuring the position of reticle stage RST in the Y-axis direction (Y position). In the description below, for the sake of convenience, these Y linear encoders will each be indicated as Y linear encoders $26A_2$, $26A_3$, $26B_2$, and $26B_3$ using the same reference numerals as the heads.

Further, head $26C_1$ and movement scale 28 that face the head constitute an X linear encoder used for measuring the position of reticle stage RST in the X-axis direction (an X position) along the straight line parallel to the X-axis direction (measurement axis) that passes through the center of illumination area IAR previously described. In the description below, for the sake of convenience, the X linear encoder will be indicated as X linear encoder $26C_1$ using the same reference numerals as the head. Accordingly, at the point of exposure or the like, the X position of reticle stage RST can be measured using X linear encoder $26C_1$ without Abbe errors.

Similarly, heads $26C_2$ and $26C_3$ and movement scale 28 each constitute an X linear encoder used for measuring the X position of reticle stage RST. In the description below, for the sake of convenience, these X linear encoders will each be indicated as X linear encoders $26C_2$ and $26C_3$ using the same reference numerals as the heads.

The measurement values of the nine linear encoders (hereinafter will also be appropriately referred to as "encoders") $26A_1$ to $26C_3$ above are sent (refer to FIG. 3) to a main controller 20 (refer to FIG. 1).

The three movement scales 24A, 24B, and 28 are set so that their length in the Y-axis direction (corresponding to the formation range of the diffraction gratings in movement scales 24A and 24B, and the width of the diffraction grating in movement scale 28) covers the entire area of the movement strokes (movement range) of reticle stage RST in the Y-axis direction when scanning exposure of wafer W is performed via at least one of reticle R1 and R2 (in the embodiment, in at least during the scanning exposure and also during acceleration/deceleration and synchronous settling period of reticle stage RST before and after the scanning exposure, among heads $26A_i$, $26B_i$, and $26C_i$ (i=1 to 3), which make a set in threes, at least one set of heads (measurement beams) is set so that it does not move off its corresponding movement scale (diffraction grating), that is, an unmeasurable state is avoided). Further, the width (corresponding to the width of the diffraction gratings in movement scales 24A and 24B, and the formation range of the diffraction grating in movement scale 28) of the three movement scales 24A, 24B, and 28 in the X-axis direction previously described is also similarly set, so that it covers the entire area of the movement strokes of reticle stage RST in the X-axis direction (in the embodiment, among heads $26A_i$, $26B_i$, and $26C_i$ (i=1 to 3), which make a set in threes, at least one set of heads (measurement beams) is set so that it does not move off its corresponding movement scale (diffraction grating), that is, an unmeasurable state is avoided). Reticle stage RST can be finely rotated in the θz direction, therefore, the size (length and width) of the three movement scales 24A, 24B, and 28 described earlier in the X-axis and Y-axis directions is naturally decided also taking into consideration the rotational range in the θz direction, so that measurement by at least the three linear encoders $26A_1$, $26B_1$, and $26C_1$ does not become unmeasurable.

Furthermore, in the embodiment, in the scanning exposure using reticle R2, the positional information (including at least the positions in the X-axis and Y-axis directions and the rotational direction in the θz direction) of reticle stage RST can be measured by the six linear encoders $26A_1$, $26A_2$, $26B_1$, $26B_2$, $26C_1$, and $26C_2$. Further, in the scanning exposure using reticle R1, the positional information (including at least the positions in the X-axis and Y-axis directions and the rotational direction in the θz direction) of reticle stage RST can be measured by the six linear encoders $26A_1$, $26A_3$, $26B_1$, $26B_3$, $26C_1$, and $26C_3$. Further, in the embodiment, exchange of reticles R1 and R2 is performed on the +Y side or the −Y side with respect to illumination area IAR previously described, or reticle R1 is exchanged on the −Y side while reticle R2 is exchanged on the +Y side, and also at such exchange positions, the positional information of reticle stage RST can be measured using at least three of the linear encoders $26A_2$, $26B_2$, and $26C_2$ or linear encoders $26A_3$, $26B_3$, and $26C_3$.

In the embodiment, the encoder system for reticle stage RST is configured with the three movement scales 24A, 24B, and 28 and a head unit that has nine heads $26A_1$ to $26A_3$, $26B_1$ to $26B_3$, and $26C_1$ to $26C_3$, however, the configuration of the encoder system is not limited to the one shown in FIG. 2, and for example, the head unit can merely have three head units, $26A_1$, $26B_1$, and $26C_1$. In this case, when the position of reticle stage RST becomes unmeasurable by linear encoders $26A_1$, $26B_1$, and $26C_1$ at the reticle exchange position or while moving to the reticle exchange position, the position of reticle stage RST can be measured, for example, using a different measurement unit, or at least a part of the reticle interferometer system referred to earlier. Further, in the embodiment, the three movement scales 24A, 24B, and 28 are fixed to reticle stage RST using a suction mechanism, a plate spring or the like, however, besides such ways, for example, a screw clamp can be used, or the diffraction grating can be directly formed on reticle stage RST. Furthermore, in the embodiment, movement scales 24A, 24B, and 28 are arranged on the upper surface (illumination system side) of reticle stage RST, however, movement scales 24A, 24B, and 28 can also be arranged on the lower surface (projection optical system side), or the placement of the head units (encoder heads) and movement scales 24A, 24B, and 28 described earlier can be reversed, that is, the head units can be arranged on reticle stage RST and movement scales 24A, 24B, and 28 can be arranged on the body side.

Figure 6:
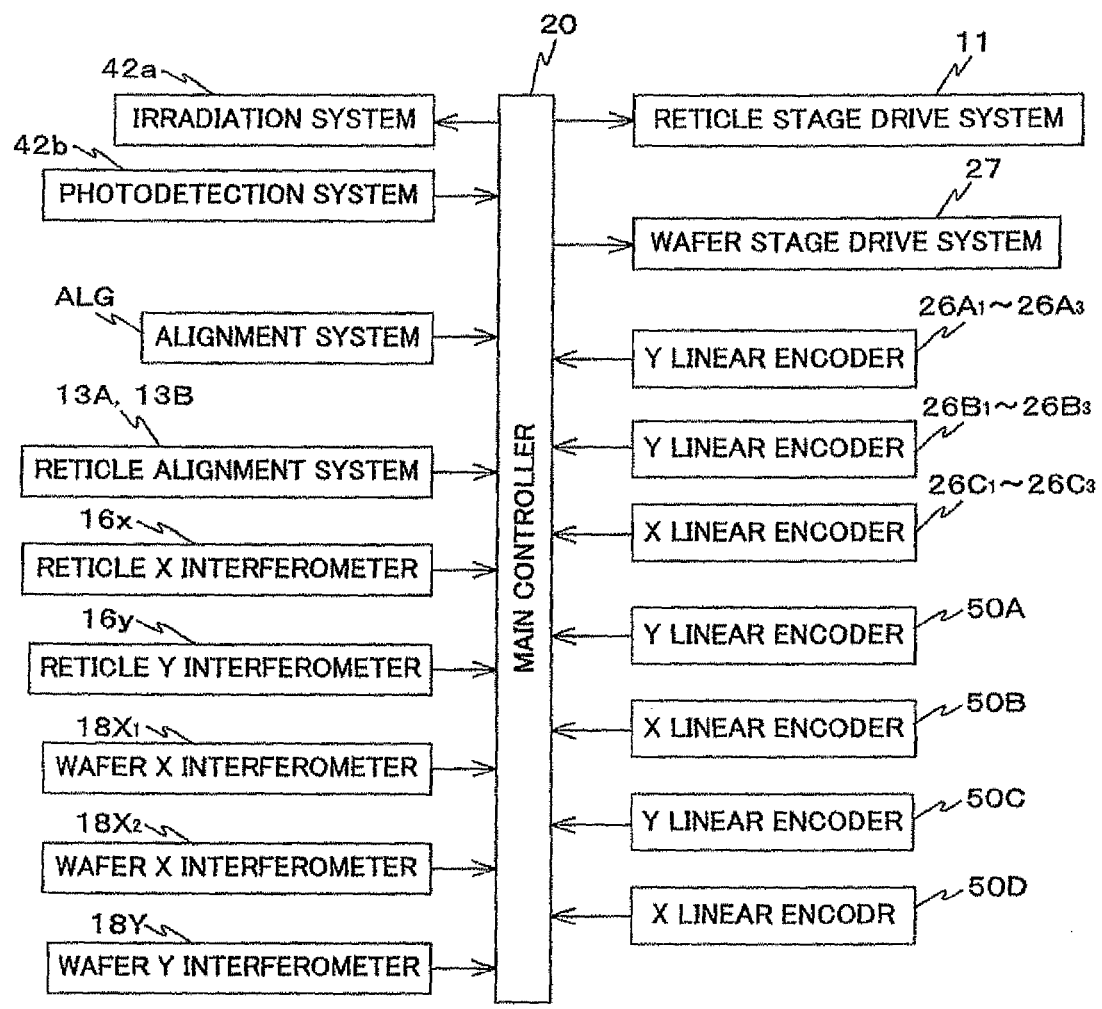
FIG. 6 is a block diagram of a control system partially omitted, related to stage control of an exposure apparatus related to an embodiment.

The reticle interferometer system is equipped with reticle Y interferometer 16y and a reticle X interferometer 16x, as is shown in FIGS. 2 and 6.

As is shown in FIG. 2, reticle X interferometer 16x includes a sensor head 19A (not shown in FIG. 1) and an optical system unit 19B fixed to the edge surface of reticle stage RST on the +X side.

Sensor head 19A is fixed on the upper surface of reticle base 36, and sensor head 19A incorporates a light source, an optical system, two analyzers (polarizers), and two photoelectric conversion elements inside. As the light source, a two-frequency laser that uses the Zeeman effect is used. The optical system enlarges the sectional shape of the laser beam from this light source in the horizontal direction, and as is shown in FIG. 2, a beam BM whose sectional shape is enlarged is emitted from sensor head 19. Then, in optical system unit 19B, beam BM is split into two beams, and one of the split beams is incident on a first beam splitter (not shown), which splits the beam into a measurement beam $BM_1$ and a reference beam. Measurement beam $BM_1$ is reflected by a reflection surface of a planar mirror 21, while the reference beam is reflected, for example, by the reflection surface of reticle stage RST, and then returns to the first beam splitter where it is concentrically synthesized and then is output from optical system unit 19B. Similarly, the other split beam is incident on a second beam splitter (not shown), which splits the beam into a measurement beam $BM_2$ and a reference beam. Measurement beam $BM_2$ is reflected by a reflection surface of a planar mirror 21, while the reference beam is reflected, for example, by the reflection surface of reticle stage RST, and then returns to the second beam splitter where it is concentrically synthesized and then is output from optical system unit 19B. Although it is not shown in the drawings, in the embodiment, planar mirror 21 is fixed to a part of body BD described earlier, such as, for example, to reticle base 36 of the second column 34, or to a barrel platform (main frame) 38 of a first column 32 which will be described later in the description.

Further, return lights from both the first and the second beam splitters inside optical system unit 19B (synthesized light of measurement beams $BM_1$ and $BM_2$ and the respective reference beams described above) return to sensor head 19A. Inside sensor head 19A, these return lights are incident on separate analyzers via the optical system, and the interference lights output from each analyzer are received separately by the two photoelectric conversion elements, and interference signals according to each of the interference lights are sent to a signal processing system (not shown). Then, based on the interference signals of each photoelectric conversion element, the signal processing system uses a phase change that occurs due to a Doppler shift in the phase of the measurement beam with respect to the phase of the reference beam to perform a heterodyne detection for measuring the change in the interference signals caused by the phase change. And then, from the change of the interference signals that have been detected, the signal processing system constantly detects the positional information of reticle stage RST in the X-axis direction at the irradiation points of measurement beams $BM_1$ and $BM_2$ with planar mirror 21 serving as a reference, that is, the X positional information of reticle stage RST at the irradiation points of measurement beams $BM_1$ and $BM_2$, at a resolution of, for example, approximately 0.5 to 1 nm.

Reticle Y interferometer 16y is a Michelson heterodyne interferometer that employs a two-frequency laser that uses the Zeeman effect as its light source as in reticle X interferometer 16x. Reticle Y interferometer 16y constantly detects the Y position of reticle stage RST via a movable mirror (such as a planar mirror or a retroreflector) 15, which is fixed to reticle stage RST, at a resolution of, for example, approximately 0.5 to 1 nm, with a fixed mirror 14 (refer to FIG. 1) fixed to the side surface of a barrel 40 configuring projection unit PU serving as a reference. At least a part of reticle Y interferometer 16y (for example, an optical unit excluding the light source) is fixed, for example, to reticle base 36.

The X positional information from the two axes of reticle X interferometer 16x and the Y positional information from reticle Y interferometer 16y is sent to main controller 20 (refer to FIG. 6).

The reticle interferometer system previously described is equipped with X interferometer 16x that has sensor head 19A and optical system unit 19B arranged in reticle stage RST, however, the configuration of X interferometer 16x is not limited to this, and for example, the arrangement of optical system unit 19B and planar mirror 21 can be reversed, or more specifically, a configuration in which a measurement beam from optical system unit 19B placed on reticle base 36 is irradiated on a reflection surface (corresponding to planar mirror 21) formed extending in the Y-axis direction on the side surface of reticle stage RST can also be employed. Furthermore, sensor head 19A is arranged on reticle base 36, however, for example, at least a part of sensor head 19A can be arranged on a frame member different from body BD. Further, in the embodiment, as the reflection surface for the interferometer of the reticle interferometer system, movable mirror 15 referred to earlier fixed on the edge surface of reticle stage RST is used, however, instead of movable mirror 15, a reflection surface, which can be obtained by mirror polishing the edge surface (side surface) of reticle stage RST, can also be used. Further, in the embodiment, Y interferometer 16y had one measurement axis and X interferometer 16x had two measurement axes, however, the number of measurement axis can be reversed between the X-axis direction and the Y-axis direction, or both of the interferometers can each have two or more axes. Especially in the latter case, Y interferometer 16y can measure the rotational information in the θx direction (pitching) of reticle stage RST and X interferometer 16x can measure the rotational information in the θy direction (rolling) of reticle stage RST.

In exposure apparatus 100 of the embodiment, the measurement values of reticle interferometer systems 16x and 16y are used only for calibration of measurement values of encoders 26A₁, 26B₁, 26C₁ and the like, which will be described later, and on exposure operation, the position of reticle stage RST is controlled according to measurement values of the encoder system on the reticle side. Especially the position of reticle stage RST during scanning exposure is controlled by main controller 20, based on the measurement values of encoders 26A₁, 26B₁, and 26C₁. Accordingly, as it can be easily imagined from FIG. 2, on exposure operation, a switching operation (linking the measurement values) of the encoder used for position control of reticle stage RST has to be performed. Details will be described later in the description.

Above reticle stage RST, a pair of reticle alignment detection systems 13A and 13B (not shown in FIG. 1, refer to FIG. 6), each consisting of an alignment system by a TTR (Through The Reticle) method that uses light of the exposure wavelength for detecting a pair of fiducial marks on wafer stage WST and a corresponding pair of reticle marks on the reticle at the same time via projection optical system PL, is arranged in the X-axis direction at a predetermined distance. As the pair of reticle alignment detection systems 13A and 13B, a system having a structure similar to the one disclosed in, for example, Kokai (Japanese Unexamined Patent Application Publication) No. 7-176468 (the corresponding U.S. Pat. No. 5,646,413) and the like can be used.

Projection unit PU is held by a part of body BD, below reticle stage RST in FIG. 1. Body BD is equipped with the first column 32 arranged on frame caster FC installed on floor surface F of a clean room and the second column 34 fixed on the first column 32.

Frame caster FC is equipped with a base plate BS laid horizontally on floor surface F, and a plurality of, e.g. three (or four), leg sections 39 (however, the leg section in the depth of the page surface of FIG. 1 is omitted in the drawings) fixed on base plate BS.

The first column 32 is equipped with a barrel platform (main frame) 38, which is supported substantially horizontally by a plurality of, e.g. three (or four), first vibration isolation mechanisms 58 fixed individually on the upper end of the plurality of leg sections 39 that configures frame caster FC.

In barrel platform 38, a circular opening (not shown) is formed substantially in the center, and in the circular opening, projection unit PU is inserted from above and is held by barrel platform 38 via a flange FLG arranged on the outer circumferential section. On the upper surface of barrel platform 38, at positions surrounding projection unit PU, one end (the lower end) of a plurality of, e.g. three (or four), legs 41 (however, the leg in the depth of the page surface of FIG. 1 is omitted in the drawings) is fixed. The other end (the upper end) of these legs 41 is substantially flush on a horizontal surface, and on each of the upper end surface of legs 41, the lower surface of reticle base 36 described earlier is fixed. In the manner described above, the plurality of legs 41 horizontally supports reticle base 36. That is, reticle base 36 and legs 41 that support reticle base 36 constitute the second column 34. In reticle base 36, an opening 36a, which serves as a path for illumination light IL, is formed in the center.

Projection unit PU includes barrel 40 that has a cylinder hollow shape with flange FLG arranged, and projection optical system PL consisting of a plurality of optical elements held in barrel 40. In the embodiment, projection unit PU was mounted on barrel platform 38, however, as is disclosed in, for example, the pamphlet of International Publication WO2006/038952 and the like, projection unit PU can be supported by suspension with respect to a mainframe member (not shown) placed above projection unit PU or to reticle base 36.

As projection optical system PL, for example, a dioptric system is used consisting of a plurality of lenses (lens elements) that are disposed along optical axis AX, which is parallel to the Z-axis direction. Projection optical system PL is, for example, a both-side telecentric dioptric system that has a predetermined projection magnification (such as one-quarter or one-fifth times). Therefore, when illumination light IL from illumination system 10 illuminates illumination area IAR, a reduced image of the circuit pattern (a reduced image of a part of the circuit pattern) is formed within illumination area IAR, with illumination light IL that has passed through the reticle (R1 or R2) whose pattern surface substantially coincides with the first plane (object plane) of projection optical system PL, in an area conjugate to illumination area IAR on wafer W (exposure area) whose surface is coated with a resist (a sensitive agent) and is placed on the second plane (image plane) side, via projection optical system PL. And by reticle stage RST and wafer stage WST being synchronously driven, the reticle is relatively moved in the scanning direction (Y-axis direction) with respect to illumination area IAR (illumination light IL) while wafer W is relatively moved in the scanning direction (Y-axis direction) with respect to the exposure area (illumination light IL), thus scanning exposure of a shot area (divided area) on wafer W is performed, and the pattern of the reticle is transferred onto the shot area. That is, in the embodiment, the pattern is generated on wafer W according to illumination system 10, the reticle, and projection optical system PL, and then by the exposure of the sensitive layer (resist layer) on wafer W with illumination light IL, the pattern is formed on wafer W.

Wafer stage unit 12 is equipped with a stage base 71, which is supported substantially horizontally by a plurality of (e.g. three) second vibration isolation mechanisms (omitted in drawings) placed on base plate BS, wafer stage WST placed above the upper surface of stage base 71, a wafer stage drive section 27 that drives wafer stage WST, and the like.

Stage base 71 is made of a flat plate, which is also called a platform, and the upper surface is finished so that the degree of flatness is extremely high. The upper surface serves as a guide surface when wafer stage WST moves.

Wafer stage WST has a main section and a table section above the main section, and is driven, for example, in directions of six degrees of freedom, which are the X-axis direction, the Y-axis direction, the Z-axis direction, the θx direction, the θy direction, and the θz direction by wafer stage drive system 27 that includes voice coil motors or the like.

Wafer stage WST can also employ a configuration, for example, in which wafer stage WST is equipped with a wafer stage main section driven in at least the X-axis direction, the Y-axis direction, and the θz direction by a linear motor or the like, and a wafer table that is finely driven on the wafer stage main section in at least the Z-axis direction, the θx direction, and the θy direction by a voice coil motor or the like.

On wafer stage WST (or to be more precise, on the table section mentioned above), wafer W is mounted via a wafer holder (not shown), and wafer W is fixed to the wafer holder, for example, by vacuum suction (or electrostatic suction) or the like.

Further, positional information of wafer stage WST within the XY plane (movement plane) can be measured by both an encoder system that includes head units 46B, 46C, and 46D and movement scales 44B, 44C, and 44D and the like and a wafer laser interferometer system (hereinafter referred to as "wafer interferometer system") 18, shown in FIG. 1. Next, details on the configuration of the encoder system for wafer stage WST and wafer interferometer system 18 will be described.

Figure 3:
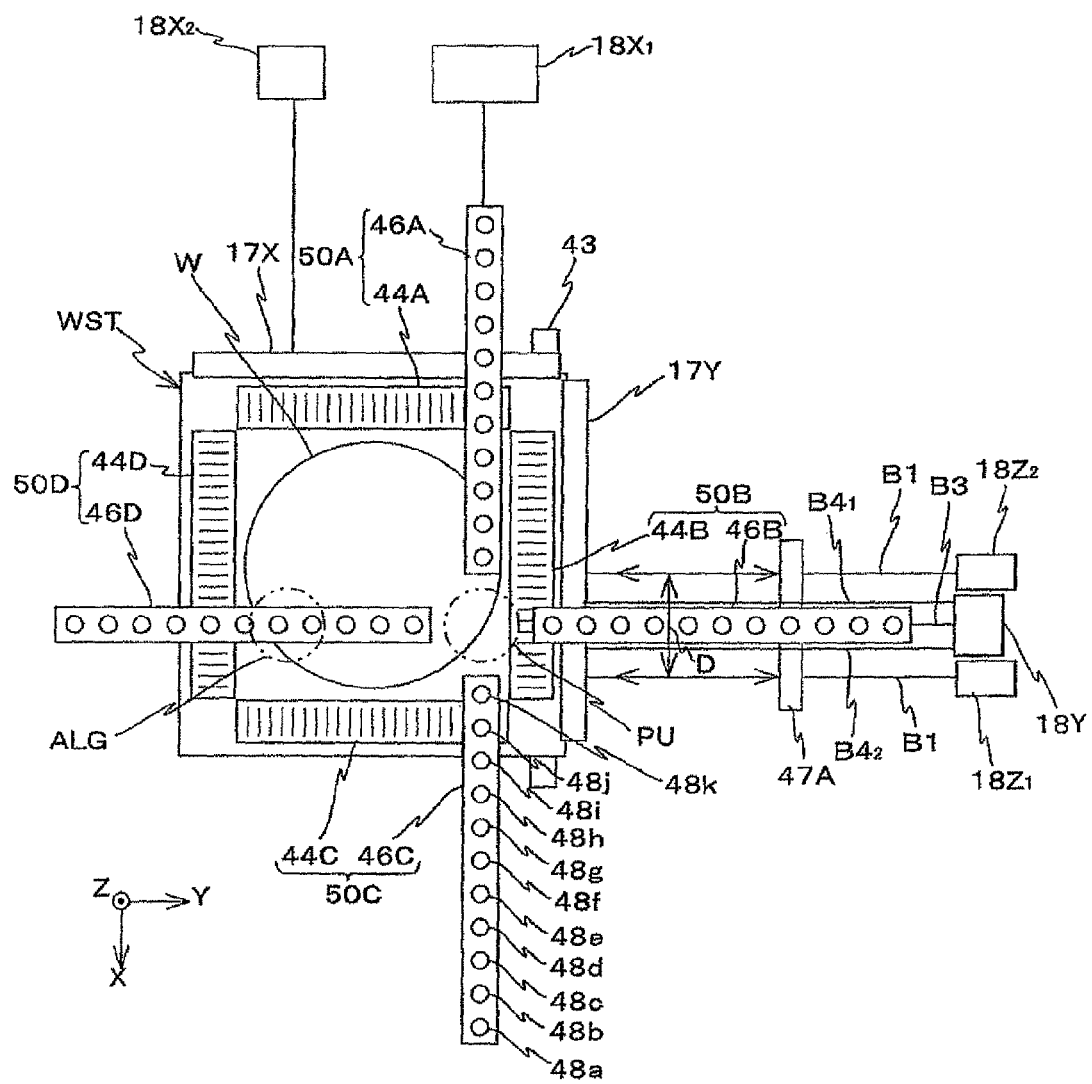
FIG. 3 is a planar view that shows a wafer stage, along with an encoder which measures positional information of the wafer stage and an interferometer.

As is shown in FIG. 3, on the upper surface of wafer stage WST, four movement scales 44A to 44D are fixed surrounding wafer W. More specifically, movement scales 44A to 44D are made of the same material (such as, for example, ceramics or low thermal expansion glass), and on the surface, a reflection type diffraction grating that has a period direction in the longitudinal direction is formed. The diffraction grating is formed having a pitch, for example, between 4 μm to 138 nm. In this embodiment, the diffraction grating is formed having a 1 μm pitch. In FIG. 3, for the sake of convenience in the drawing, the pitch of the grating will be indicated much wider than the actual pitch. The same applies to other drawings.

The longitudinal direction of movement scales 44A and 44C coincides with the Y-axis direction in FIG. 3, and movement scales 44A and 44C are arranged in symmetry with respect to a center line that passes through the center of wafer stage WST (considered excluding movable mirrors 17X and 17Y) parallel to the Y-axis direction, and each diffraction grating formed on movement scales 44A and 44C is also placed in symmetry regarding the center line. Since these movement scales 44A and 44C have diffraction gratings arranged periodically in the Y-axis direction, movement scales 44A and 44C are used for measuring the position of wafer stage WST in the Y-axis direction.

Further, the longitudinal direction of movement scales 44B and 44D coincides with the X-axis direction in FIG. 3, and movement scales 44B and 44D are arranged in symmetry with respect to a center line that passes through the center of wafer stage WST (considered excluding movable mirrors 17X and 17Y) parallel to the X-axis direction, and each diffraction grating formed on movement scales 44B and 44D is also placed in symmetry regarding the center line. Since these movement scales 44B and 44D have diffraction gratings arranged periodically in the X-axis direction, movement scales 44B and 44D are used for measuring the position of wafer stage WST in the X-axis direction.

In FIG. 1 the state is shown where wafer W is exposed above movement scale 44C, however, this is for the sake of convenience, and the upper surface of movement scales 44A to 44D is actually at the same height, or positioned above the upper surface of wafer W.

Meanwhile, as is obvious from FIGS. 1 and 3, four encoder head units (hereinafter shortened to "head unit") 46A to 46D are placed crossing the corresponding movement scales 44A to 44D, in a state where the four encoder heads surround the periphery of the lowest end of projection unit PU from four directions. Although it is omitted in FIG. 1 from the point of avoiding confusion, these head units 46A to 46D are actually fixed to barrel platform 38 in a suspended state via a support member.

Head units 46A and 46C are placed on the −X side and +X side of projection unit PU with the longitudinal direction being the X-axis direction, which is orthogonal to the longitudinal direction of the corresponding movement scales 44A and 44C (the Y-axis direction in FIG. 3), and is also placed in symmetry regarding optical axis AX of projection optical system PL. Further, head units 46B and 46C are placed on the +Y side and −Y side of projection unit PU with the longitudinal direction being the Y-axis direction, which is orthogonal to the longitudinal direction of the corresponding movement scales 44B and 44D (the X-axis direction in FIG. 3), and is also placed in symmetry regarding optical axis AX of projection optical system PL.

Head units 46A to 46D can each be a unit that has, for example, a single head or a plurality of heads that are disposed seamlessly. In the embodiment, however, as in FIG. 3 representatively showing head unit 46C, the head unit has a plurality of, e.g. eleven heads 48a to 48k, disposed at a predetermined distance in the longitudinal direction. Incidentally, in head units 46A to 46D, the plurality of heads are disposed at a distance so that adjacent two heads of the plurality of heads do not go astray from the corresponding movement scale (diffraction grating), or in other words, at around the same distance or narrower than the width of the diffraction grating in the direction orthogonal to the longitudinal direction (disposal direction of the diffraction grating) of the movement scale.

Head unit 46A constitutes a multiple-lens type, or to be more accurate, an eleven-lens Y linear encoder 50A (refer to FIG. 6), which is equipped with heads 48a to 48k, for measuring the Y position of wafer stage WST along with movement scale 44A. Further, head unit 46B constitutes an eleven-lens X linear encoder 50B (refer to FIG. 6) for measuring the X position of wafer stage WST along with movement scale 44B. Further, head unit 46C constitutes an eleven-lens Y linear encoder 50C (refer to FIG. 6) for measuring the Y position of wafer stage WST along with movement scale 44C. Further, head unit 46D constitutes an eleven-lens X linear encoder 50D (refer to FIG. 6) for measuring the X position of wafer stage WST along with movement scale 44D. The measurement values of encoders 50A to 50D are sent to main controller 20. In the embodiment, the four head unit 46A to 46D are supported by suspension from barrel platform 38, however, in the case exposure apparatus 100 of FIG. 1 has a configuration in which projection unit PU is supported by suspension with respect to a mainframe member or a reticle base 36, for example, head units 46A to 46D can be supported by suspension integrally with projection unit PU, or the four head units 46A to 46D can be arranged independently from projection unit PU in a measurement frame supported by suspension from the mainframe member or from reticle base 36.

Further, as is shown in FIG. 1, positional information of wafer stage WST is constantly detected by wafer interferometer system 18, which irradiates measurement beams on movable mirrors 17 and 43 fixed on wafer stage WST, at a resolution of, for example, approximately 0.5 to 1 nm. Wafer interferometer system 18 has at least a part of its system (for example, the optical unit excluding the light source) fixed to barrel platform 38 in a suspended state. At least a part of wafer interferometer system 18 can be supported by suspension integrally with projection unit PU, or can be arranged in the measurement frame as is described above.

As is shown in FIG. 3, on wafer stage WST, Y movable mirror 17Y that has a reflection surface orthogonal to the Y-axis direction, which is the scanning direction, and X movable mirror 17X that has a reflection surface orthogonal to the X-axis direction, which is the non-scanning direction, are actually arranged. In FIG. 1, however, these mirrors are representatively shown as movable mirror 17.

As is shown in FIG. 3, wafer interferometer system 18 includes five interferometers, which are; a wafer Y interferometer 18Y, two wafer X interferometers $18X_1$ and $18X_2$, and two Z interferometers $18Z_1$ and $18Z_2$. As these five interferometers, 18Y, $18X_1$, $18X_2$, $18Z_1$, and $18Z_2$, a Michelson heterodyne interferometer is used that employs a two-frequency laser that uses the Zeeman effect. Of these interferometers, as wafer Y interferometer 18Y, a multi-axis interferometer is used that has a plurality of measurement axes including two measurement axes, which are symmetric with respect to an axis (center axis) parallel to the Y-axis passing through optical axis AX of projection optical axis AX (the center of the exposure area previously described) and the detection center of an alignment system ALG, as is shown in FIG. 3.

Wafer X interferometer $18X_1$ irradiates a measurement beam on movable mirror 17X along a measurement axis that passes through optical axis AX of projection optical system PL parallel to the X-axis. Wafer X interferometer $18X_1$ measures the positional information of the reflection surface of movable mirror 17X, which uses the reflection surface of X fixed mirror fixed to the side surface of barrel 40 of projection unit PU as a reference, as the X position of wafer stage WST.

Wafer X interferometer $18X_2$ irradiates a measurement beam on movable mirror 17X along a measurement axis that passes through the detection center of alignment system ALG parallel to the X-axis, and measures the positional information of the reflection surface of movable mirror 17X, which uses the reflection surface of a fixed mirror fixed to the side surface of alignment system ALG as a reference, as the X position of wafer stage WST.

Figure 4:
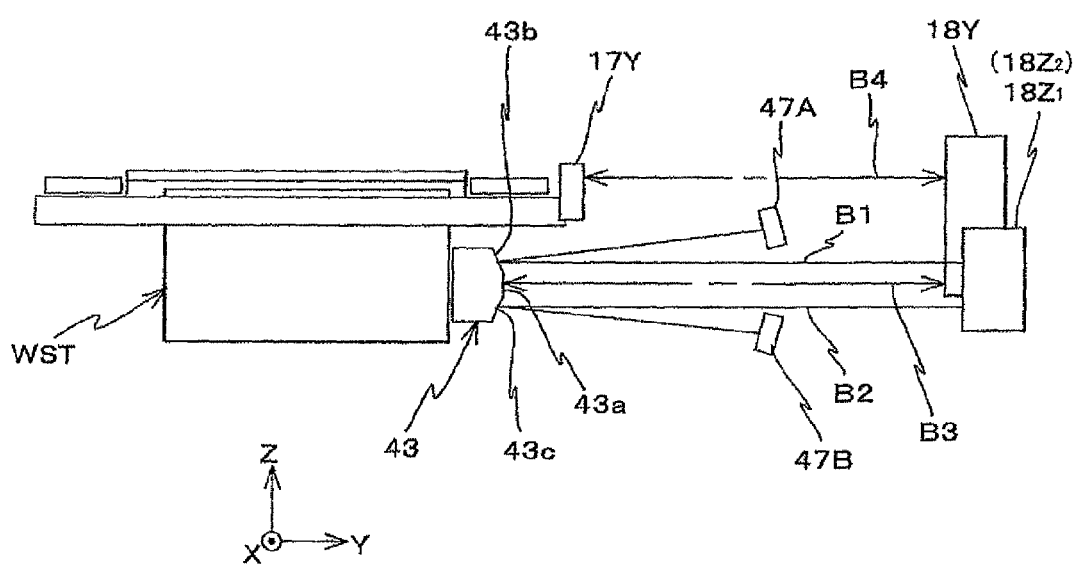
FIG. 4 is an extracted view that shows a Y interferometer which measures a position of wafer stage WST in FIG. 1, a Z interferometer, and the neighboring components.

Further, on the side surface of the main section of wafer stage WST on the +Y side, movable mirror 43 whose longitudinal direction is in the X-axis direction is attached via a kinematic support mechanism, as is shown in FIGS. 1 and 4.

A pair of Z interferometers $18Z_1$ and $18Z_2$ that constitutes a part of interferometer system 18 and irradiates a measurement beam on movable mirror 43 is arranged, facing movable mirror 43 (refer to FIGS. 3 and 4). More particularly, as is shown in FIGS. 3 and 4, the length of movable mirror 43 in the X-axis direction is longer than movable mirror 17Y, and is made of a member that has a hexagonal sectional shape, which looks like a rectangle and an isosceles trapezoid combined together. Mirror polishing is applied on the surface of movable mirror 34 on the +Y side, and three reflection surfaces 43b, 43a, and 43c shown in FIG. 4 are formed.

Reflection surface 43a configures the edge surface on the +Y side of movable mirror 43, and is parallel to the XZ plane as well as extending in the X-axis direction. Reflection surface 43b configures the surface adjacent to the +Z side of reflection surface 43a, and is parallel to a plane tilted by a predetermined angle in a clockwise direction in FIG. 4 with respect to the XZ plane and also extends in the X-axis direction. Reflection surface 43c configures the surface adjacent to the −Z side of reflection surface 43a, and is arranged in symmetry with reflection surface 43b with reflection 43a in between.

As is obvious from FIGS. 3 and 4, Z interferometers $18Z_1$ and $18Z_2$ are respectively arranged on one side and the other side of Y interferometer 18Y in the X-axis direction, spaced apart at substantially the same distance and also at a position slightly lower that Y interferometer 18Y.

As is shown in FIGS. 3 and 4, Z interferometers $18Z_1$ and $18Z_2$ project measurement beams B1 and B2 on reflection surfaces 43b and 43c, respectively, along the Y-axis direction. In the embodiment, a fixed mirror 47A that has a reflection surface on which measurement beam B1 reflected off reflection surface 43b is perpendicularly incident and a fixed mirror 47B that has a reflection surface on which measurement beam B2 reflected off reflection surface 43c is perpendicularly incident are arranged, each extending in the X-axis direction.

Fixed mirrors 47A and 47B are supported, for example, using the same support section (not shown) arranged in barrel platform 38. Incidentally, fixed mirrors 47A and 47B can also be supported using the measurement frame previously described.

As is shown in FIG. 3, Y interferometer 18Y project measurement beams $B4_1$ and $B4_2$ on movable mirror 17Y, along the measurement axes in the Y-axis direction, which are spaced apart by the same distance on the −X side and +X side from a straight line parallel to the Y-axis passing through the projection center (optical axis AX, refer to FIG. 1) of projection optical system PL, and by receiving the respective reflection beams, Y interferometer 18Y detects the positional information of wafer stage WST in the Y-axis direction at the irradiation point of measurement beams $B4_1$ and $B4_2$ while using the reflection surface of a Y fixed mirror fixed to the side surface of barrel 40 of projection unit PU as a reference. In FIG. 4, measurement beams $B4_1$ and $B4_2$ are representatively shown as measurement beam B4.

Further, Y interferometer 18Y projects a measurement beam B3 toward reflection surface 43a along a measurement axis, which is positioned substantially in the center between measurement beams $B4_1$ and $B4_2$ in a planar view and also positioned at the −Z side of measurement beams $B4_1$ and $B4_2$ in a side view, and by receiving measurement beam B3 reflected off reflection surface 43a, Y interferometer 18Y detects the positional information of reflection surface 43a of movable mirror 43 (that is, wafer stage WST) in the Y-axis direction.

Main controller 20 computes the Y position of movable mirror 17Y, that is wafer table WTB (wafer stage WST), based on an average value of the measurement values of the measurement axes corresponding to measurement beams $B4_1$ and $B4_2$ of Y interferometer 18Y. Further, main controller 20 computes the displacement of wafer stage WST in the θx direction (pitching), based on the Y position of movable mirror 17Y and reflection surface 43a of movable mirror 43.

Further, measurement beams B1 and B2 projected from Z interferometers $18Z_1$ and $18Z_2$ are respectively incident on reflection surfaces 43b and 43c of movable mirror 43 at a predetermined incident angle (the angle is θ/2), and are reflected off reflection surfaces 43b and 43c and are perpendicularly incident on the reflection surface of fixed mirrors 47A and 47B. Then, measurement beams B1 and B2 reflected off fixed mirrors 47A and 47B are respectively reflected again by reflection surfaces 43b and 43c, and then are received by Z interferometers $18Z_1$ and $18Z_2$.

In the case the displacement of wafer stage WST (that is, movable mirror 43) in the Y-axis direction is ΔYo and the displacement (movement amount) in the Z-axis direction is ΔZo, the optical path length variation ΔL1 of measurement beam B1 and the optical path length variation ΔL2 of measurement beam B1 received by Z interferometers $18Z_1$ and $18Z_2$ can respectively expressed as in equations (1) and (2) below.

$$\Delta L1 \approx \Delta Yo \times \cos\theta - \Delta Zo \times \sin\theta \quad (1)$$

$$\Delta L2 \approx \Delta Yo \times \cos\theta - \Delta Zo \times \sin\theta \quad (2)$$

Accordingly, from equations (1) and (2), ΔZo and ΔYo can be obtained by the following equations, (3) and (4).

$$\Delta Zo = (\Delta L2 - \Delta L1)/2\sin\theta \quad (3)$$

$$\Delta Yo = (\Delta L2 + \Delta L1)/2\sin\theta \quad (4)$$

The above displacements ΔZo and ΔYo are obtained by each of the Z interferometers $18Z_1$ and $18Z_2$. Therefore, the displacements obtained by Z interferometer $18Z_1$ will be ΔZoR and ΔYoR, and the displacements obtained by Z interferometer $18Z_2$ will be ΔZoL and ΔYoL, and in the case the distance (spacing) of measurement beams B1 and B2 in the X-axis direction is indicated as D (refer to FIG. 3), then the displacement of movable mirror 43 (that is, wafer stage WST) in the θz direction (yawing amount) Δθz and the displacement of movable mirror 43 (that is, wafer stage WST) in the θy direction (rolling amount) Δθy can be obtained from equations (5) and (6) below.

$$\Delta\theta z = (\Delta YoR - \Delta YoL)/D \quad (5)$$

$$\Delta\theta y = (\Delta ZoL - \Delta ZoR)/D \quad (6)$$

Accordingly, by using the above equations (1) to (6), main controller 20 can compute the displacement of wafer stage WST in four degrees of freedom, ΔZo, ΔYo, Δθz, and Δθy, based on the measurement results of Z interferometers 43A and 43B.

Further, as is described above, main controller 20 can obtain displacement ΔY of wafer stage WST in the Y-axis direction and displacement (pitching amount) Δθx of wafer stage WST in the θx direction, based on the measurement results of Y interferometer 18Y.

Incidentally, in FIG. 1, X interferometers $18X_1$ and $18X_2$ and Z interferometers $18Z_1$ and $18Z_2$ are representatively shown as wafer interferometer system 18, and the fixed mirrors for measuring the position in the X-axis direction and the fixed mirrors for measuring the position in the Y-axis direction are representatively shown as fixed mirror 57. Further, alignment system ALG and the fixed mirror fixed to alignment system ALG are omitted in FIG. 1.

In the embodiment, wafer X interferometer $18X_1$ and wafer Y interferometer 18Y are used for calibration of the encoder system used when performing scanning exposure of the wafer, whereas wafer X interferometer $18X_2$ and wafer Y interferometer 18Y are used for mark detection performed by alignment system ALG. Further, besides measuring the Y position of wafer stage WST, wafer Y interferometer 18Y can also measure the rotational information in the θx direction (pitching). In the embodiment, as the reflection surfaces of the measurement beams of X interferometers $18X_1$ and $18X_2$ and Y interferometer 18Y of wafer interferometer system 18 previously described, movable mirrors 17X and 17Y fixed to wafer stage WST were used, however, the embodiment is not limited to this, and for example, the edge surface (side surface) of wafer stage WST can be mirror polished so as to form a reflection surface (corresponding to the reflection surface of movable mirrors 17X and 17Y).

The measurement values of wafer Y interferometer 18Y, X interferometers $18X_1$ and $18X_2$, and Z interferometers $18Z_1$ and $18Z_2$ are supplied to main controller 20.

Further, on wafer stage WST, a fiducial mark plate (not shown) is fixed in a state where the surface is at the same height as wafer W. On the surface of this fiducial plate, at least a pair of a first fiducial marks used for reticle alignment, a second fiducial mark used for baseline measurement of alignment system ALG whose positional relation to the first fiducial mark is known and the like are formed.

In exposure apparatus 100 of the embodiment, although it is omitted in FIG. 1, a multiple point focal position detection system by an oblique incident method consisting of an irradiation system 42a and a photodetection system 42b (refer to FIG. 6) similar to the one disclosed in, for example, Kokai (Japanese Patent Unexamined Application Publication) No. 6-283403 (the corresponding U.S. Pat. No. 5,448,332) or the like is arranged.

Further, in exposure apparatus 100, in the vicinity of projection unit PU, an alignment system ALG is arranged (not shown in FIG. 1). As this alignment system ALG, for example, a sensor of an FIA (Field Image Alignment) system by an image-processing method is used. This alignment system ALG supplies positional information of marks using index center as a reference to main controller 20. Based on the information that has been supplied and the measurement values of interferometers 18Y and $18X_2$ of wafer interferometer system 18, main controller 20 measures the positional information of the marks subject to detection, or to be more specific, measures the positional information of the second fiducial marks on the fiducial mark plate or the alignment marks on the wafer on a coordinate system (alignment coordinate system), which is set by interferometers 18Y and $18X_2$.

Figure 5:
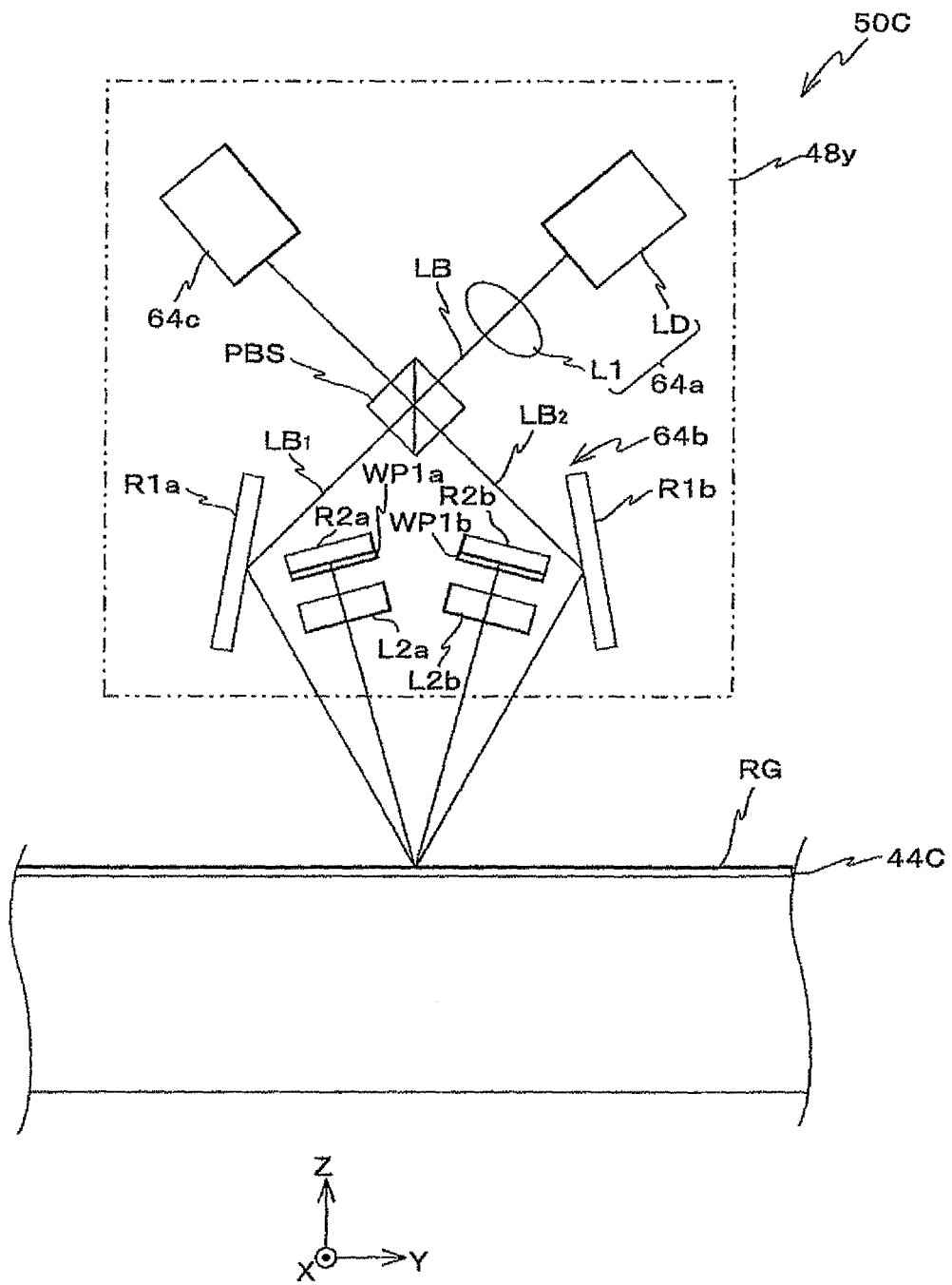
FIG. 5 is a view that shows an example of an arrangement of an encoder.

Next, the configuration or the like of encoders 50A to 50D will be described, focusing representatively on encoder 50C shown enlarged in FIG. 5. In FIG. 5, heads 48a to 48k (FIG. 3) of head unit 46C, which irradiates a detection beam on movement scale 44C, are indicated as a single head, as a head 48y.

Head 48y can be roughly divided into three sections, which are; an irradiation system 64a, an optical system 64b, and a photodetection system 64c.

Irradiation system 64a includes a light source that emits laser beam LB at an angle of 45 degrees with respect to the Y-axis and the Z-axis, such as, for example, a semiconductor laser LD, and a lens L1 placed on the optical path of laser beam LB emitted from semiconductor laser LD.

Optical system 64b is equipped with parts such as a polarization beam splitter PBS whose separating plane is parallel to the XZ plane, a pair of reflection mirrors R1a and R1b, lenses L2a and L2b, quarter-wave plates (hereinafter referred to as λ/4 plates) WP1a and WP1b, reflection mirrors R2a and R2b, and the like.

Photodetection system 64c includes polarizers (analyzers), photodetectors and the like.

In encoder 50C, laser beam LB emitted from semiconductor laser LD is incident on polarization beam splitter PBS via lens L1, and is split by polarization into two beams, $LB_1$ and $LB_2$. Beam $LB_1$ that has transmitted polarization beam splitter PBS reaches a reflection diffraction grating RG formed on movement scale 44C via reflection mirror R1a, whereas beam $LB_2$ that has been reflected off polarization beam splitter PBS reaches reflection diffraction grating RG via reflection mirror R1b. "Split by polarization," in this case, means that the incident beam is separated into a P polarization component and an S polarization component.

Diffraction beams of a predetermined order, for example, first order diffraction beams, are generated from diffraction grating RG by the irradiation of beams $LB_1$ and $LB_2$, and after the beams are respectively converted to a circular polarized light by λ/4 plates WP1a and WP1b via lenses L2b and L2a, the beams are then reflected by reflection mirrors R2a and R2a and pass through λ/4 plates WP1a and WP1b again, and reach polarization beam splitter PBS while passing through the same optical path in a reversed direction.

The polarized directions of each of the two beams that have reached polarization beam splitter PBS are rotated at an angle of 90 degrees with respect to the original direction. Therefore, the first order diffraction beam of beam $LB_1$ that has transmitted polarization beam splitter PBS earlier is reflected by polarization beam splitter PBS and is incident on photodetection system 64c, and the first order diffraction beam of beam $LB_2$ that has been reflected by polarization beam splitter PBS earlier transmits polarization beam splitter PBS and is synthesized concentrically with the first order diffraction beam of beam $LB_1$ and then is incident on photodetection system 64c.

Then, inside photodetection system 64c, the analyzers uniformly arrange the polarized directions of the two first order diffraction beams above so that the beams interfere with each other and become an interference light. The interference beam is detected by the photodetectors, and is converted into electric signals according to the intensity of the interference light.

As is obvious from the description above, in encoder 50C, since the optical path lengths of the two beams that are made to interfere are extremely short and are substantially equal, the influence of air fluctuation can mostly be ignored. Then, when movement scale 44 (that is, wafer stage WST) moves in the measurement direction (in this case, the Y-axis direction), the phase of each of the two beams change and the intensity of the interference light changes. This change in intensity of the interference light is detected by photodetection system 64c, and the positional information according to the intensity change is output as the measurement values of encoder 50C. The other encoders 50A, 50B, and 50D are also configured similar to encoder 50C. Further, also for the nine encoders $26A_1$ to $26C_3$ for the reticle stage, an encoder by the diffraction interference method that has a configuration similar to encoder 50C is used. And, as each encoder, an encoder that has a resolution of, for example, approximately 0.1 nm is used.

FIG. 6 shows a block diagram, which is partially omitted, of a control system related to stage control of exposure apparatus 100 of the embodiment. The control system in FIG. 6 is configured including a so-called microcomputer (or workstation) made up of a CPU (Central Processing Unit), ROM (Read Only Memory), RAM (Random Access Memory), and the like, and is mainly composed of main controller 20, which serves as a control unit that controls the overall operation of the entire apparatus.

In exposure apparatus 100 that has the configuration described above, when wafer alignment operation is performed by the EGA (Enhanced Global Alignment) method or the like disclosed in, for example, Kokai (Japanese Unexamined Patent Application Publication) No. 61-44429 and the corresponding U.S. Pat. No. 4,780,617 and the like, the position of wafer stage WST is controlled by main controller 20 based on the measurement values of wafer interferometer system 18 as is described above, and at the time besides wafer alignment operation such as, for example, during exposure operation, the position of wafer stage WST is controlled by main controller 20 based on the measurement values of encoders 50A to 50D. Incidentally, the position of wafer stage WST can be controlled based on the measurement values of encoders 50A to 50D also when wafer alignment operation is performed. Further, in the case the position of wafer stage WST is controlled based on the measurement values of encoders 50A to 50D when wafer alignment operation is performed, at least one of the measurement values of wafer interferometer system 18 (e.g. positional information of the Z-axis, the θx, and the θy direction) can also be used together.

Accordingly, in the embodiment, in the period after the wafer alignment operation until before the beginning of exposure, a switching operation of the position measurement system has to be performed, in which the position measurement system used for measuring the position of the wafer stage is switched from wafer interferometer system 18 (that is, wafer Y interferometer 18Y and wafer X interferometer $18X_2$) to encoders 50A to 50D.

The switching operation of the position measurement system will now be briefly described in the description below.

Figure 7:
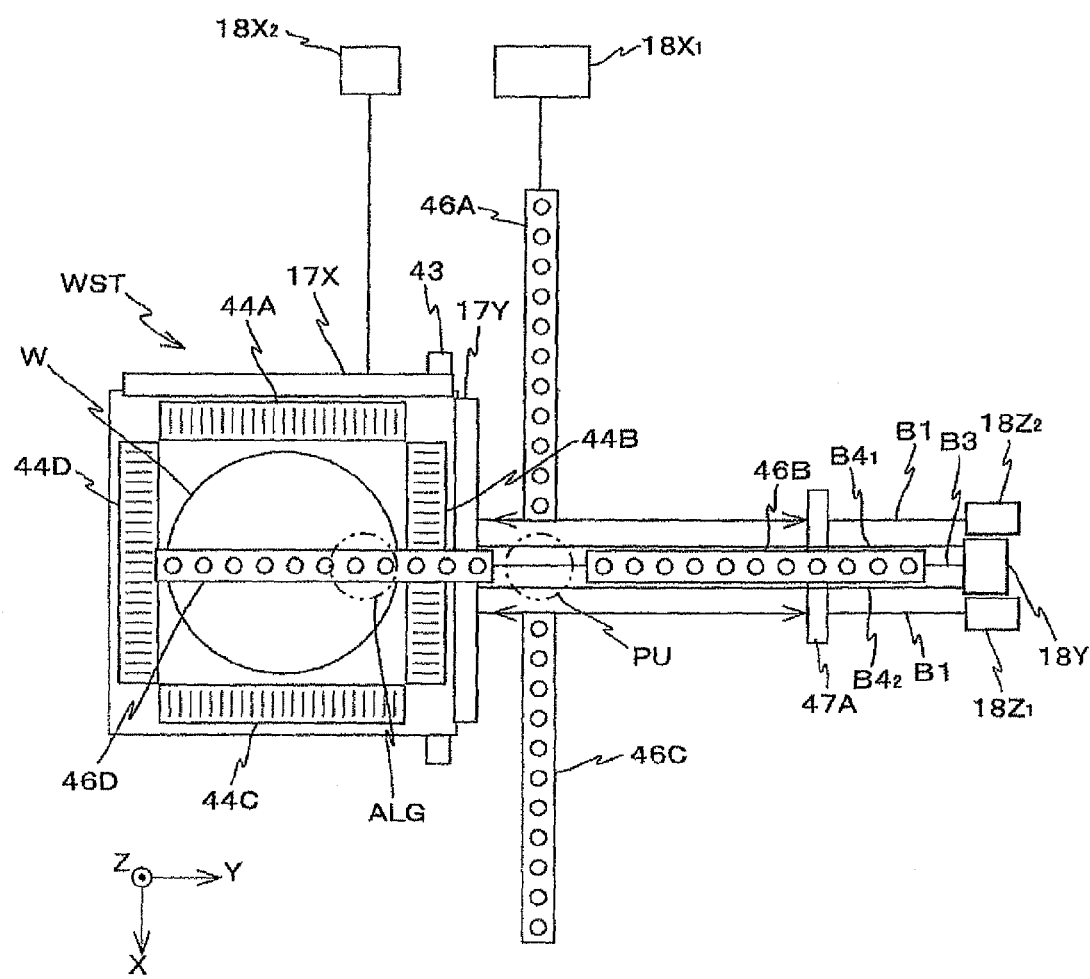
FIG. 7 is a view (No. 1) for describing a switching operation of a position measurement system.

At the point when wafer alignment has been completed, the position of wafer stage WST is controlled by main controller 20, based on the measurement values of interferometers 18Y, $18X_2$, $18Z_1$, and $18Z_2$ as is shown, for example, in FIG. 7. Therefore, after wafer alignment has been completed, main controller 20 drives wafer stage WST in the +Y direction via wafer stage drive system 27, based on the measurement values of these interferometers 18Y, $18X_2$, $18Z_1$, and $18Z_2$.

Figure 8:
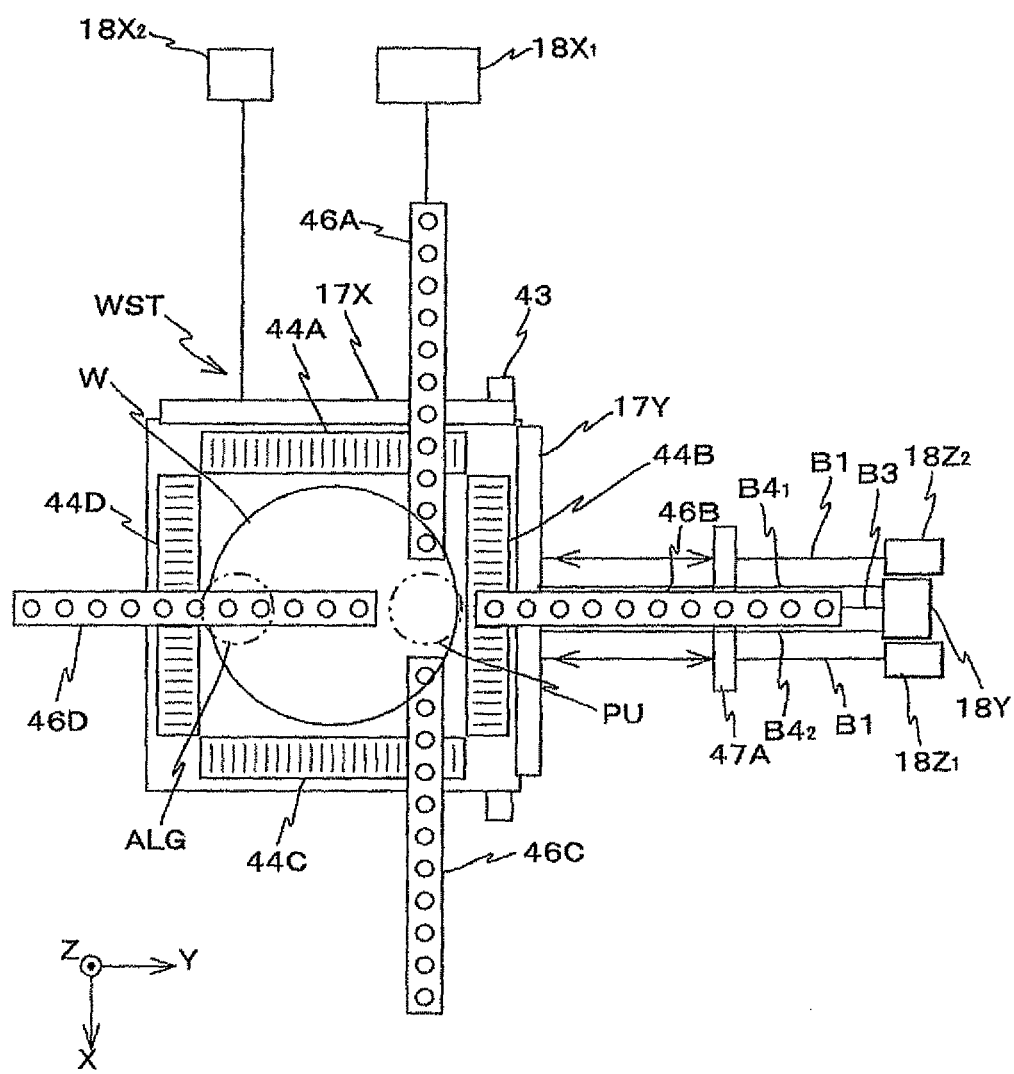
FIG. 8 is a view (No. 2) for describing a switching operation of a position measurement system.

Then, when wafer stage WST reaches a position where the two measurement beams from interferometer $18X_2$ and $18X_1$ irradiate X movable mirror 17X at the same time, as is shown in FIG. 8, main controller 20 presets the measurement values of interferometer $18X_1$ to the same values as the measurement values of interferometer $18X_2$, after adjusting the attitude of wafer stage WST so that the θz rotation error (yawing error) (and the θx rotation error (pitching error)) becomes zero based on the measurement values of interferometer 18Y. The θz rotation error of wafer stage WST can also be adjusted, based on the measurement values of Z interferometers $18Z_1$ and $18Z_2$.

Then, after the preset, main controller 20 suspends wafer stage WST at the position for a predetermined time until the short-term variation caused by air fluctuation (temperature fluctuation of air) of interferometers $18X_1$ and 18Y falls to a level that can be ignored due to an averaging effect, and then carries over an addition average value (average value during the suspension time) of measurement values of interferometer $18X_1$ obtained during the suspension of wafer stage WST as the measurement values of X linear encoders 50B and 50D. Along with this operation, main controller 20 carries over addition average values (average value during the suspension time) of measurement values of the plurality of axes of interferometer 18Y obtained during the suspension as the measurement values of Y linear encoders 50A and 50C. With this operation, preset of X linear encoders 50B and 50D and Y linear encoders 50A and 50C, that is, the switching operation of the position measurement system, is completed. Thus, hereinafter, main controller 20 controls the position of wafer stage WST based on the measurement values of encoder 50A to 50D.

Scanning operation of reticle stage RST for exposure will be described next, including the switching operation (linking the measurement values) of the encoders in the encoder system for the reticle stage.

Figure 9:
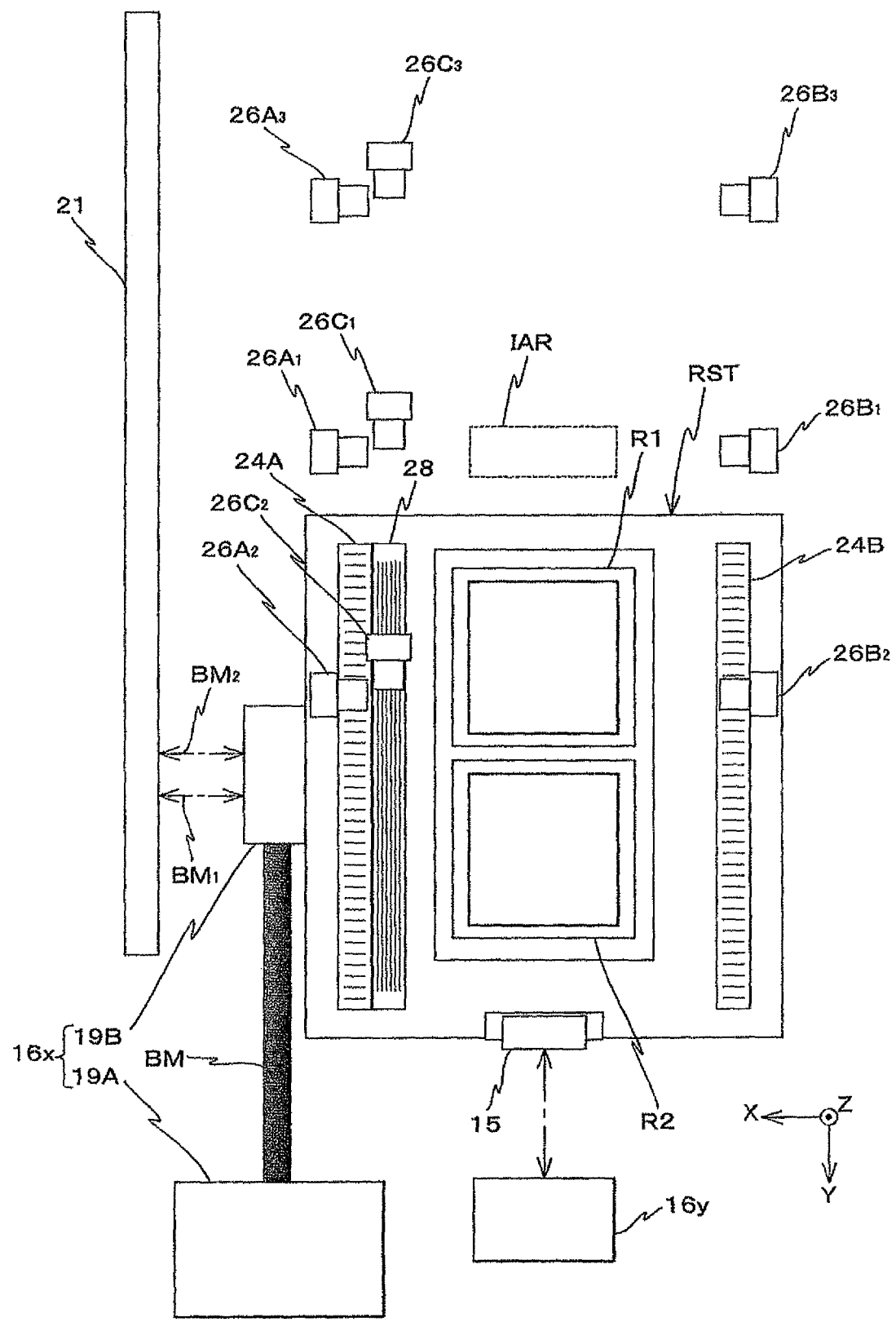
FIG. 9 is a view (No. 1) for describing a scanning operation of a reticle stage for exposure including a switching (linking the measurement values) operation of an encoder on the reticle side.

For example, in the case of scanning exposure by the movement of wafer W in the +Y direction and the movement of reticle R1 in the −Y direction (to be referred to here as a plus scan exposure focusing on the movement direction of wafer W), acceleration of reticle stage RST in the −Y direction begins from the acceleration starting position shown in FIG. 9. At this acceleration starting position, the position of reticle stage RST is measured by main controller 20 using encoders $26A_2$, $26B_2$, and $26C_2$.

Figure 10:
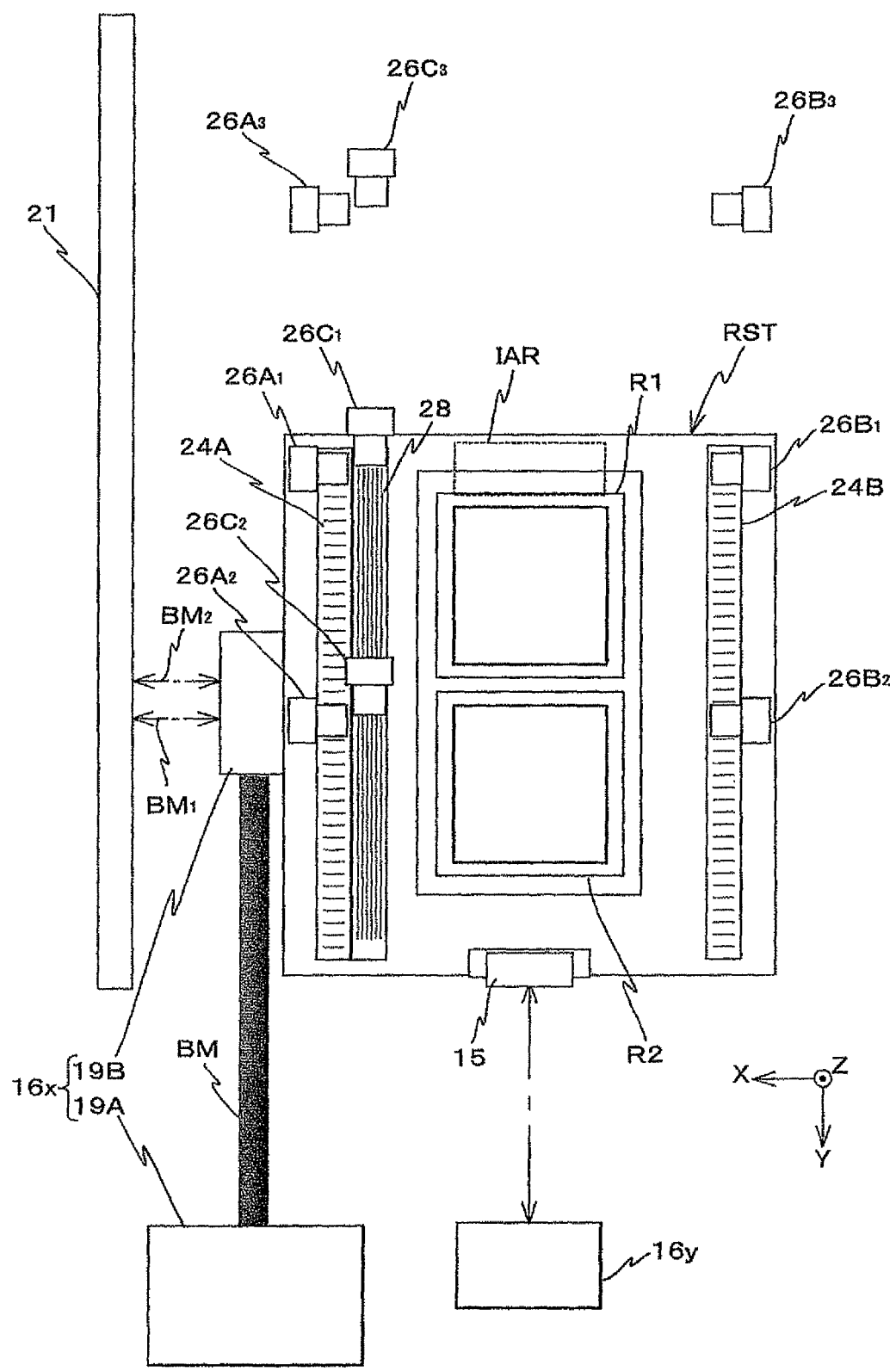
FIG. 10 is a view (No. 2) for describing a scanning operation of a reticle stage for exposure including a switching (linking the measurement values) operation of an encoder on the reticle side.

Then, at the point of acceleration finishing when the acceleration of reticle stage RST in the −Y direction has been completed, as an example, the −Y edge of reticle R1 substantially coincides with the +Y edge of illumination area IAR, as is shown in FIG. 10. And, immediately before this, heads $26A_1$, $26B_1$, and $26C_1$ move so that heads $26A_1$, $26B_1$, and $26C_1$ face movement scales 24A, 24B, and 28, respectively. That is, it becomes possible to measure the position of reticle stage RST not only with encoders $26A_2$, $26B_2$, and $26C_2$, but also with $26A_1$, $26B_1$, and $26C_1$.

Therefore, the measurement values of encoders $26A_2$, $26B_2$, and $26C_2$ (count values whose predetermined origin is zero (scale reading values)) at some point from the point where the position of reticle stage RST becomes measurable using encoders $26A_1$, $26B_1$, and $26C_1$ until the point where acceleration has been completed, is succeeded without any changes by main controller 20 as measurement values of $26A_1$, $26B_1$, and $26C_1$. Hereinafter, main controller 20 uses encoders $26A_1$, $26B_1$, and $26C_1$ to control the position of reticle stage RST.

Figure 16:
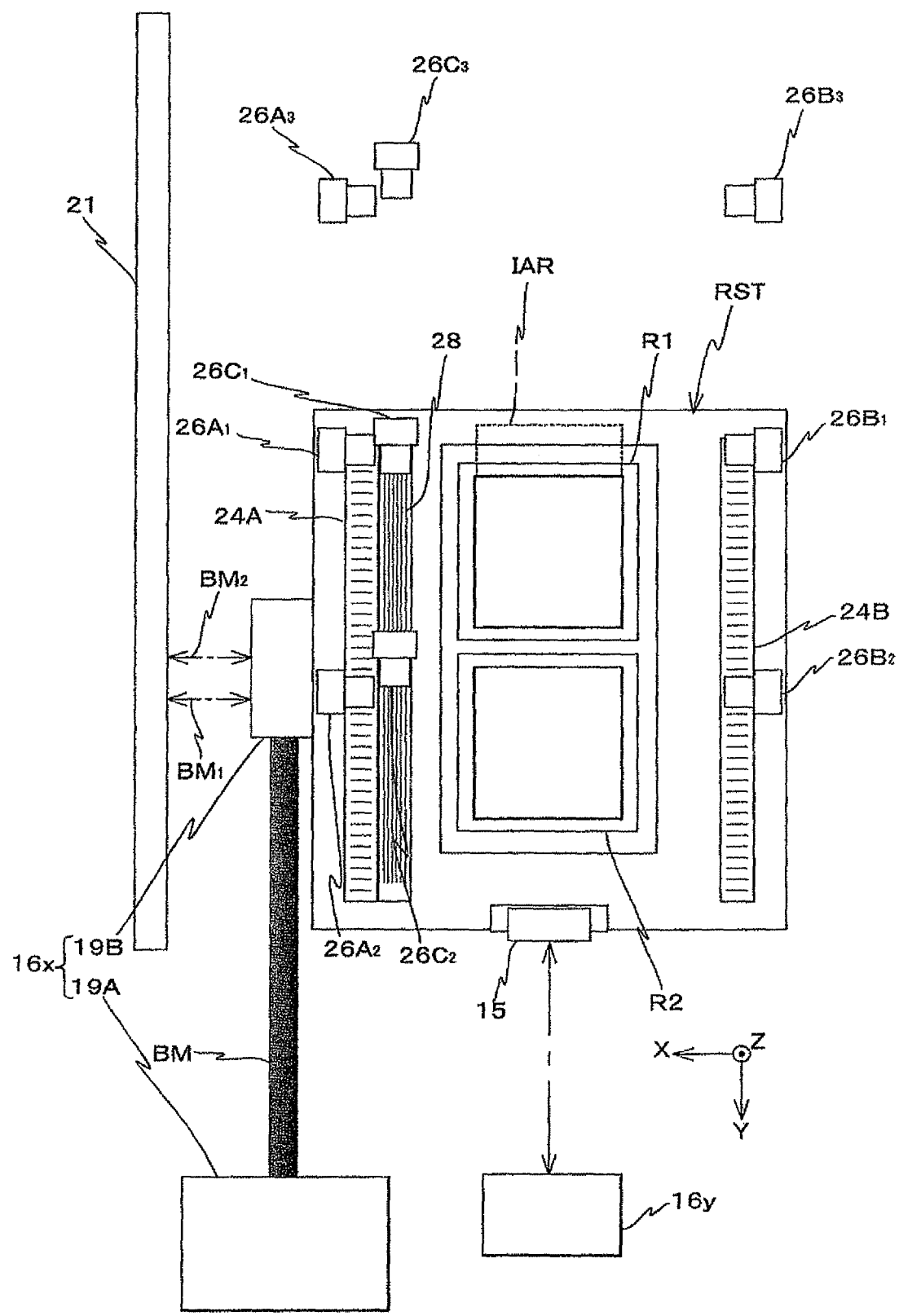
FIG. 16 is a view (No. 1) used for describing a second calibration operation for calibrating measurement errors of encoders $26A_1$, $26B_1$, and $26C_1$.

Then, from the point shown in FIG. 10, reticle stage RST begins movement at a constant speed, and when the pattern area of reticle R1 reaches illumination area IAR after a predetermined settling time has passed, exposure begins (refer to FIG. 16). Furthermore, after a predetermined period of time has passed, exposure is completed (refer to FIG. 17) and deceleration of reticle stage RST begins, and reticle stage RST stops at the position shown in FIG. 11. Incidentally, the deceleration of reticle stage RST can begin almost at the same time as the completion of exposure.

Figure 11:
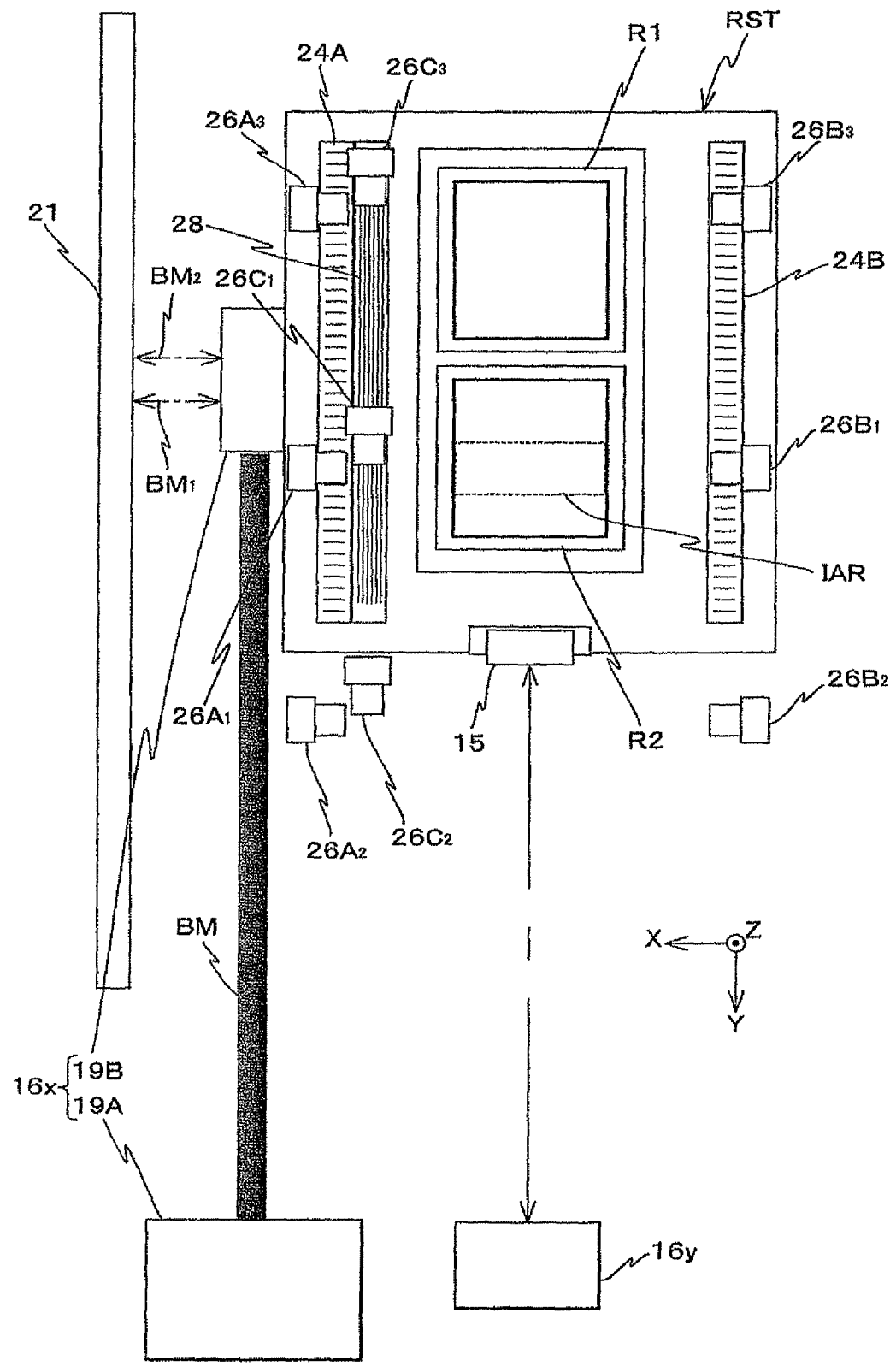
FIG. 11 is a view (No. 3) for describing a scanning operation of a reticle stage for exposure including a switching (linking the measurement values) operation of an encoder on the reticle side.

As is obvious from FIGS. 10 and 11, during the period from before the beginning of exposure (that is, the point where the switching of the encoders used for controlling the position of reticle stage RST has been performed) through the scanning exposure period until the deceleration has been completed, the position of reticle stage RST is controlled by main controller 20, based on the measurement values of encoders $26A_1$, $26B_1$, and $26C_1$.

Meanwhile, in the case of scanning exposure by the movement of wafer W in the −Y direction and the movement of reticle R1 in the +Y direction (a minus scan exposure), opposite to the plus scan exposure described above, acceleration of reticle stage RST in the +Y direction begins from the state shown in FIG. 11. Then, at the point shown in FIG. 10 where exposure has been completed, the switching operation (linking the measurement values) of the encoders is performed, and during the deceleration period, the position of reticle stage RST is controlled by main controller 20, based on the measurement values of encoders $26A_2$, $26B_2$, and $26C_2$.

In FIGS. 9, 10, 11 and the like, the state is shown where the position of reticle stage RST is measured using interferometers 16x and 16y in addition to the encoders, however, it is a matter of course that the position measurement of reticle stage RST does not necessarily have to be performed with the interferometers. The method of using the measurement results of the encoders and interferometers 16x and 16y obtained during scanning exposure in the embodiment will be described, later in the description.

Although a detailed description will be omitted, in the plus scan exposure and minus scan exposure that use reticle R2, encoders $26A_1$, $26B_1$, and $26C_1$ and encoders $26A_3$, $26B_3$, and $26C_3$ are used. The switching operation (linking the measurement values) similar to the description above is performed on these exposures as well, and at least during the scanning exposure, the position of reticle stage RST is controlled by main controller 20 based on the measurement values of encoders $26A_1$, $26B_1$, and $26C_1$. Further, as well as the X, Y positions of reticle stage RST, main controller 20 also controls the position of reticle stage RST in the θz direction (yawing), based on the measurement values of the encoder.

In exposure apparatus 100 of the embodiment, a series of operations such as reticle alignment (includes making the reticle coordinate system and the wafer coordinate system correspond with each other), baseline alignment of alignment system ALG and the like are performed, using reticle alignment systems 13A and 13B (FIG. 6), the fiducial mark plate on wafer stage WST, alignment system ALG and the like, as in a typical scanning stepper. The position control of reticle stage RST and wafer stage WST during the series of operations is performed based on the measurement values of interferometers 16y and 16x, and interferometers $18X_1$, $18X_2$, 18Y, $18Z_1$, and $18Z_2$. In the reticle alignment or the baseline measurement, the position control of reticle stage RST and wafer stage WST can be performed based on only the measurement values of the encoders described earlier, or on the measurement values of both the interferometers and the encoders.

Next, wafer exchange of the wafer on wafer stage WST (in the case no wafers are on wafer stage WST, wafer loading is performed) is performed by main controller 20, using a wafer loader (not shown) (carrier unit), and then, wafer alignment is performed, for example, by the EGA method, using alignment system ALG. And according to this wafer alignment, the arrangement coordinates of the plurality of shot areas on the wafer on the alignment coordinate system previously described can be obtained.

Then, main controller 20 performs the switching of the position measurement system previously described, and then, main controller 20 controls the position of wafer stage WST based on the measurement values of the baseline and the encoders 50A to 50D measured earlier, and in the procedure similar to a typical scanning stepper, main controller 20 performs exposure by the step and scan method, and the pattern of the reticle (R1 or R2) is transferred onto each of the plurality of shot areas on the wafer.

Figure 12A:
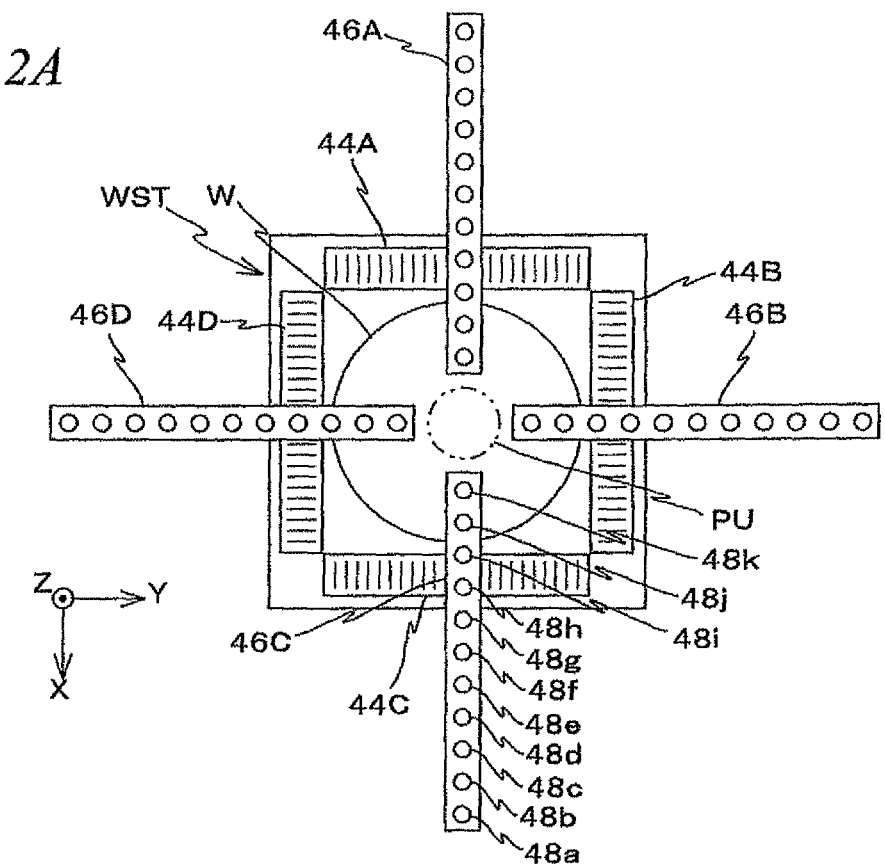
FIG. 12A is a view that shows a state in which the wafer stage is located at a position where the area around the center of the wafer is directly under a projection unit.
Figure 12B:
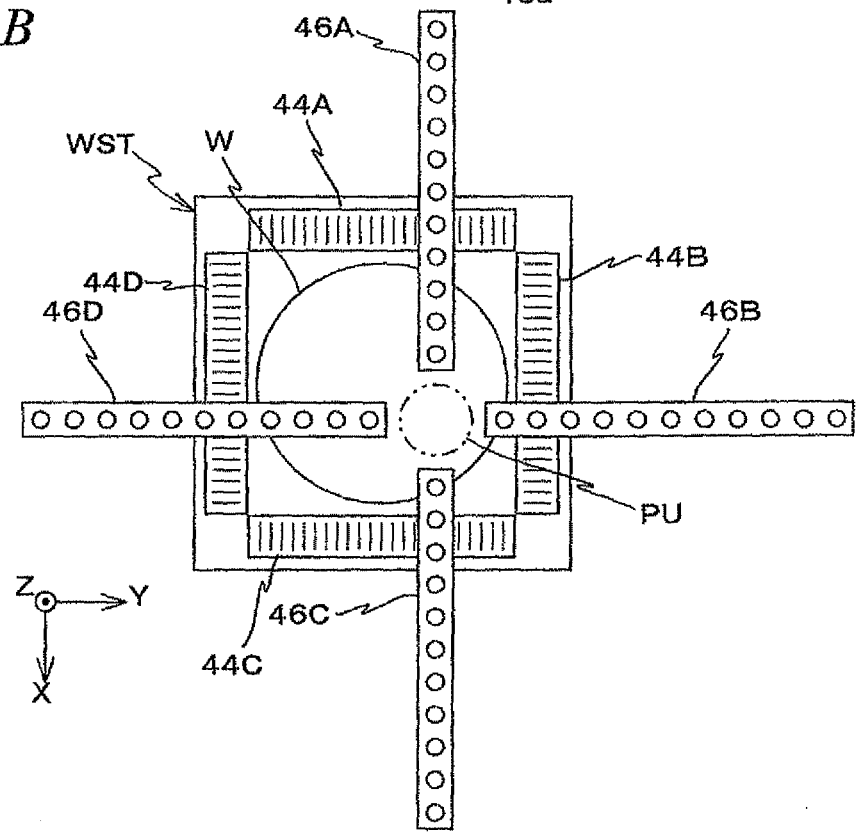
FIG. 12B is a view that shows a state in which the wafer stage is located at a position where the area in the middle between the center of the wafer and the periphery of the wafer is directly under the projection unit.
Figure 13A:
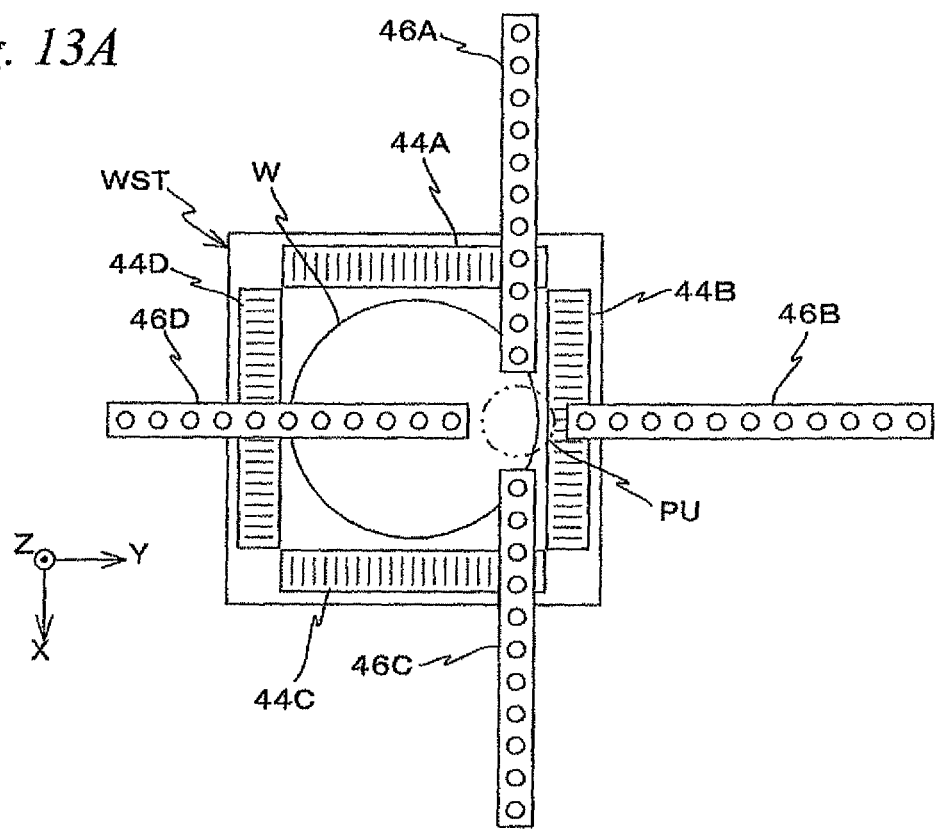
FIG. 13A is a view that shows a state where the wafer stage is located at a position where the vicinity of the edge of the wafer on the +Y side is directly under projection unit PU.
Figure 13B:
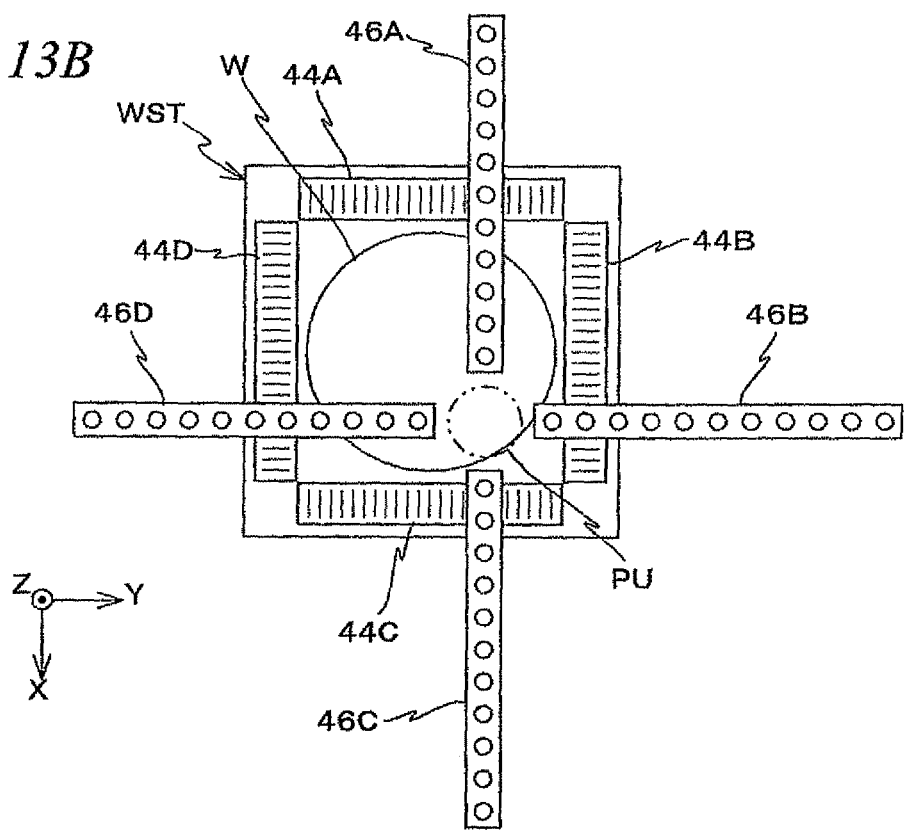
FIG. 13B is a view that shows a state where the wafer stage is located at a position where the vicinity of the edge of the wafer in a direction at an angle of 45 degrees to the X-axis and the Y-axis when viewing from the center of the wafer is directly under projection unit PU.
Figure 14:
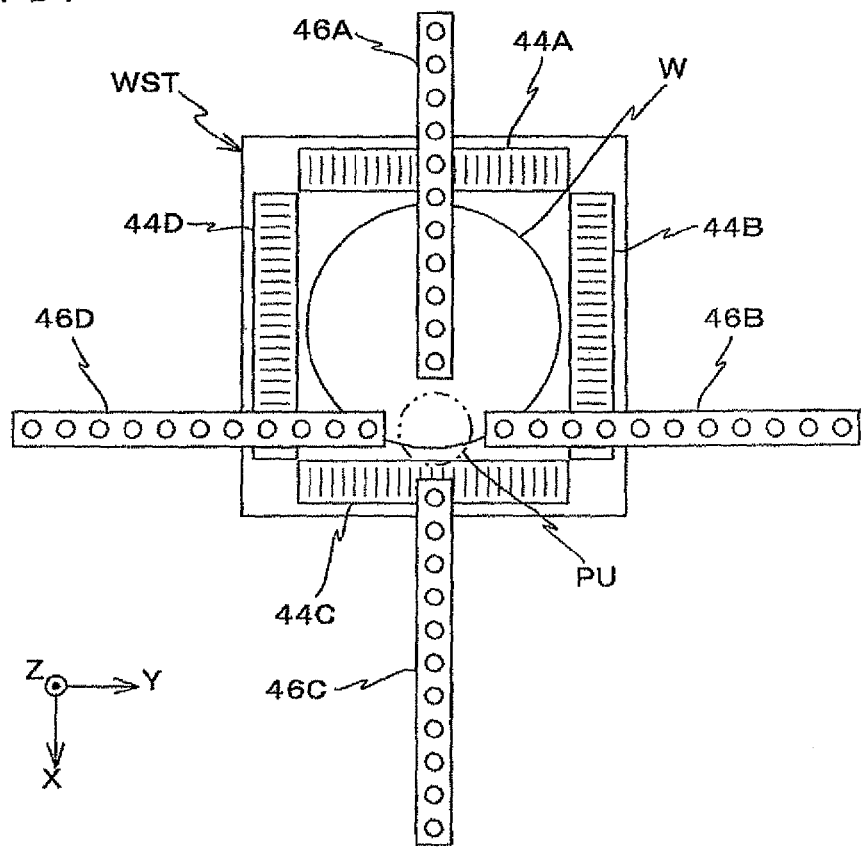
FIG. 14 is a view that shows a state where the wafer stage is located at a position where the vicinity of the edge of the wafer on the +X side is directly under projection unit PU.

FIG. 12A shows a state in which wafer stage WST is located at a position where the center of wafer W is positioned directly below projection unit PU, and FIG. 12B shows a state in which wafer stage WST is located at a position where the area around the middle in between the center of wafer W and its circumference is positioned directly below projection unit PU. Further, FIG. 13A shows a state in which wafer stage WST is located at a position where the area close to the edge of wafer W on the +Y side is positioned directly below projection unit PU, and FIG. 13B shows a state in which wafer stage WST is located at a position where the area close to the edge of wafer W in the direction at an angle of 45 degrees with respect to the X-axis and the Y-axis when viewed from the center of wafer W is positioned directly below projection unit PU. Further, FIG. 14 shows a state in which wafer stage WST is located at a position where the area close to the edge of wafer W on the +X side is positioned directly below projection unit PU. When viewing FIGS. 12A to 14, it can be seen that in each drawing, at least one (in the embodiment, one or two) of the eleven heads in each of the head units 46A to 46D faces its corresponding movement scale. And, when totally considering this fact, the symmetric arrangement of head units 46A to 46D vertically and horizontally with optical axis AX of projection optical system PL serving as the center, and the symmetric arrangement of movement scales 44A to 44D in the X-axis direction and Y-axis direction with respect to the center of wafer stage WST, the following is obvious; that is, in exposure apparatus 100, no matter at which position wafer stage WST is located within the movement range of wafer stage WST during scanning exposure, at least one of the eleven heads in each of the head units 46A to 46D faces its corresponding movement scale, and the X position and the Y position of wafer stage WST can be constantly measured according to the four encoders 50A to 50D. Further, yawing of wafer stage WST can also be measured.

In other words, the four movement scales 44A to 44D are each set longer than the size (diameter) of wafer W in the longitudinal direction, so that the length in the longitudinal direction (corresponding to the formation range of the diffraction grating) covers the entire area of the movement strokes of (movement range) of wafer stage WST when at least performing scanning exposure on the entire surface of wafer W (in the embodiment, the four head units 46A to 46D (measurement beams) do not move off the corresponding movement scales (diffraction gratings) in all the shot areas at least during scanning exposure, during the acceleration/deceleration time of wafer stage WST before and after the scanning exposure, and during the synchronous settling time, that is, avoid becoming unmeasurable).

Further, the four head units 46A to 46D are each similarly set around the same level or longer than the movement strokes in the longitudinal direction, so that the length in the longitudinal direction (corresponding to the formation range of the diffraction grating) covers the entire area of the movement strokes of wafer stage WST when at least performing scanning exposure on the entire surface of wafer W (that is, at least during exposure operation of wafer W, the four head units 46A to 46D (measurement beams) do not move off the corresponding movement scales (diffraction gratings) at least during scanning exposure, that is, avoid becoming unmeasurable). Incidentally, head units 46A to 46D can be configured so that they can measure the position of wafer stage WST according to encoders 50A to 50D not only during the exposure operation, but also during other operations such as the alignment operation (including wafer alignment and baseline measurement, which were previously described).

In the movement scale of the encoder, the fixed position of the movement scale shifts due to the passage of use time, or the pitch of the diffraction grating changes partially or entirely due to thermal expansion and the like, which makes the encoder lack in long-term stability. Therefore, the errors included in the measurement values become larger due to the passage of use time, and calibration becomes necessary. In the description below, calibration operation of the encoders, which is performed in exposure apparatus 100 of the embodiment, will be described.

First of all, a first calibration operation for correcting gain errors and linearity errors of the measurement values of the encoders configuring the encoder system for the reticle stage will be described. Since the first calibration operation is performed, for example, per each lot before beginning the exposure of the first wafer, that is, performed at a relatively long interval, it will also be referred to as a long-term calibration in the description below.

More specifically, main controller 20 scans the range where illumination area IAR passes (it actually is the range where (the pattern areas of) reticles R1 and R2 move across illumination area IAR) reticles R1 and R2 (their pattern areas) at an extremely slow speed at a level in which the short-term variation of the measurement values of the interferometers can be ignored, while moving reticle stage RST in the Y-axis direction. During this first calibration operation, illumination area IAR is not necessarily illuminated with illumination light IL, however, in this case, in order to describe the movement position of reticle stage RST in a clearly understandable manner, the expressions such as "illumination area IAR passes" and the like are used.

Figure 15:
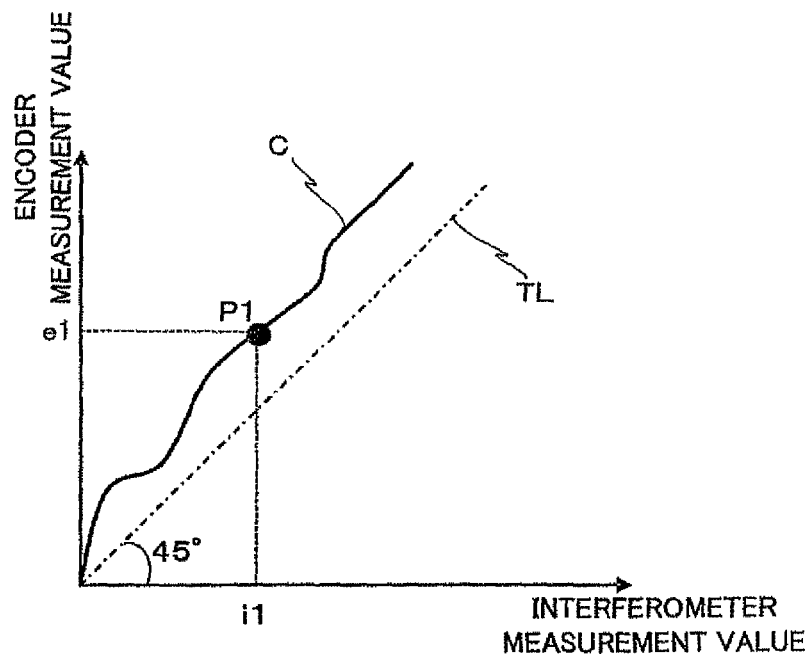
FIG. 15 is a diagram that shows an example of a map which is obtained by a first calibration operation of encoders $26A_1$, $26B_1$, and $26C_1$.

During the scanning above, main controller 20 takes in the measurement values of reticle Y interferometer $16y$, Y linear encoders $26A_1$ and $26B_1$, reticle X interferometer $16x$, and X linear encoders $26C_1$ at a predetermined sampling interval, and stores the measurement values in a memory (not shown), and also makes a map as in FIG. 15 on the measurement values of Y linear encoders $26A_1$ and $26B_1$ and measurement values of reticle Y interferometer $16y$, and on the measurement values of reticle X interferometer $16x$ and the measurement values of X linear encoders $26C_1$, respectively. The reason for taking in the measurement values of the three encoders $26A_1$, $26B_1$, and $26C_1$ is due to taking into consideration the point in which the position of reticle stage RST is controlled using the three encoders $26A_1$, $26B_1$, and 26C in the range where illumination area IAR passes reticles R1 and R2 (their pattern areas).

FIG. 15 is a line map that shows a curve C, which shows a relation between the measurement values of an interferometer and the measurement values of an encoder in the case the horizontal axis is the measurement values of the interferometer and the vertical axis is the measurement values of the encoder, and the difference between this curve C and an ideal line TL indicates the errors included in the measurement values of the encoder. The line map in FIG. 15 can serve as a correction map for correcting the measurement values of the encoder without any changes. The reason for this is because, for example, in FIG. 15, point P1 indicates that when the measurement value of the encoder is e1 the measurement value of the corresponding interferometer is i1, and since this measurement value of the interferometer is a value which was obtained when reticle stage RST was scanned at an extremely slow speed as is previously described, it is safe to say that this value naturally contains no long-term variation errors as well as almost no short-term variation errors due to air fluctuation, and that it is an accurate value in which errors can be ignored.

When the relation between the measurement values after correction of encoders $26A_1$, $26B_1$, and $26C_1$ whose measurement values have been corrected according to the correction map of FIG. 15 and the corresponding interferometers is obtained, the relation coincides with ideal line TL in FIG. 15. The correction map for correcting the measurement values of encoder $26C_1$ can naturally be made based on the measurement values of encoder $26C_1$ and reticle X interferometer $16x$, which are obtained while driving reticle stage RST in the X-axis direction within a movable range.

Main controller 20 can also make correction maps for the remaining encoders, using the measurement values of interferometers 16x and 16y in a procedure similar to encoders 26A$_1$, 26B$_1$, and 26C$_1$ described above.

However, besides the long-term calibration operation described above, in the case of also performing together a short-term calibration operation which will be described later, curve C of the correction map above can be separated into a low order component, which is an offset component and a gradient component, and a high order component that is a component besides the low order component, and a correction map can be kept for both the low order component and the high order component, or the low order component can further be separated into the offset component and the gradient component and a correction map can be kept for both the offset component and the gradient component, along with the correction map of the high order component. Or, a correction map (correction information) on the high order component which is expected to be immovable for a relatively long period can be kept, and the correction information of the low order component which is expected to change in a relatively short period can be obtained by the short-term calibration operation.

In the description above, in the calibration operation of obtaining (deciding) the correction information of the measurement values of at least encoders 26A$_1$ and 26B$_1$, reticle stage RST was moved in the scanning direction (the Y-axis direction) in a range where the pattern areas of reticle R1 and R2 move across illumination area IAR, however, the movement range of reticle stage RST is not limited to this. For example, the movement range can substantially be the entire measurable range (corresponds to the formation range of the diffraction grating of movement scales 24A and 245) of encoders 26A$_1$ and 26B$_1$, or the movement range during the scanning exposure using one of the reticles R1 and R2. The movement range during the scanning exposure can be a movement range not only during the scanning exposure, but can also include the movement range in at least a part of the time of acceleration/deceleration before and after the scanning exposure and the synchronous settling time. Further, the movement range of reticle stage RST is not limited to the movement range of reticle stage RST during scanning exposure that uses reticles R1 and R2, and can include the movement range during the measurement operation using the a reference mark (not shown) arranged on reticle stage RST. The reference mark can be at least one mark arranged on reticle stage RST on the −Y side with respect to reticle R1 and/or on the +Y side with respect to reticle R2.

Next, a second calibration operation for calibrating a gain error (a scaling error of an encoder measurement value to an interferometer measurement value) in encoders 26A$_1$, 26B$_1$, and 26C$_1$ which is performed, for example, per each wafer (during a so-called overhead time (the period after completing the exposure of a wafer until the beginning of exposure of the next wafer)), will be described. Since the second calibration operation is performed for each wafer, that is, is performed at a relatively short interval, this operation will also be referred to as a short-term calibration in the description below.

First of all, as is shown in FIG. 16, main controller 20 sets the position of reticle stage RST in the scanning direction (the Y-axis direction) to a first Y position (hereinafter also simply referred to as a first position) so that the edge section on the −Y side of the pattern area of reticle R1 (or R2) used in the next exposure coincides with the edge section on the +Y side of illumination area IAR. On this calibration operation as well, illumination area IAR is not necessarily illuminated with illumination light IL, however, in FIG. 16, illumination area IAR is indicated in order to make the position of reticle stage RST easier to understand.

Then, main controller 20 continues the position setting state at the first position above shown in FIG. 16 for a predetermined period of time, and while continuing this state, obtains the measurement values of encoders 26A$_1$, 26B$_1$, and 26C$_1$ and interferometers 16x and 16y at a predetermined sampling interval, and stores the measurement values in memory (not shown).

Figure 17:
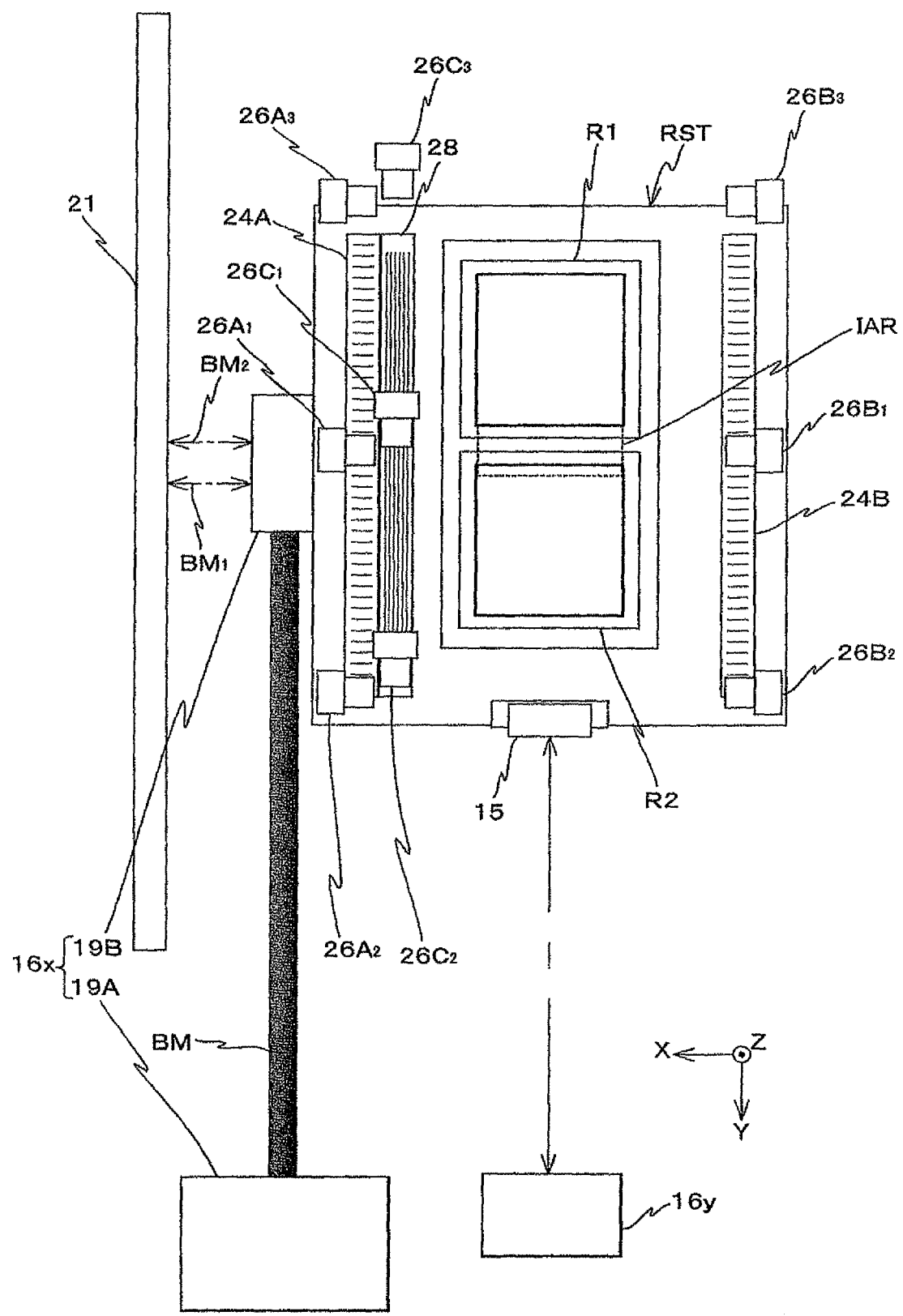
FIG. 17 is a view (No. 2) used for describing a second calibration operation for calibrating measurement errors of encoders $26A_1$, $26B_1$, and $26C_1$.
Figure 18:
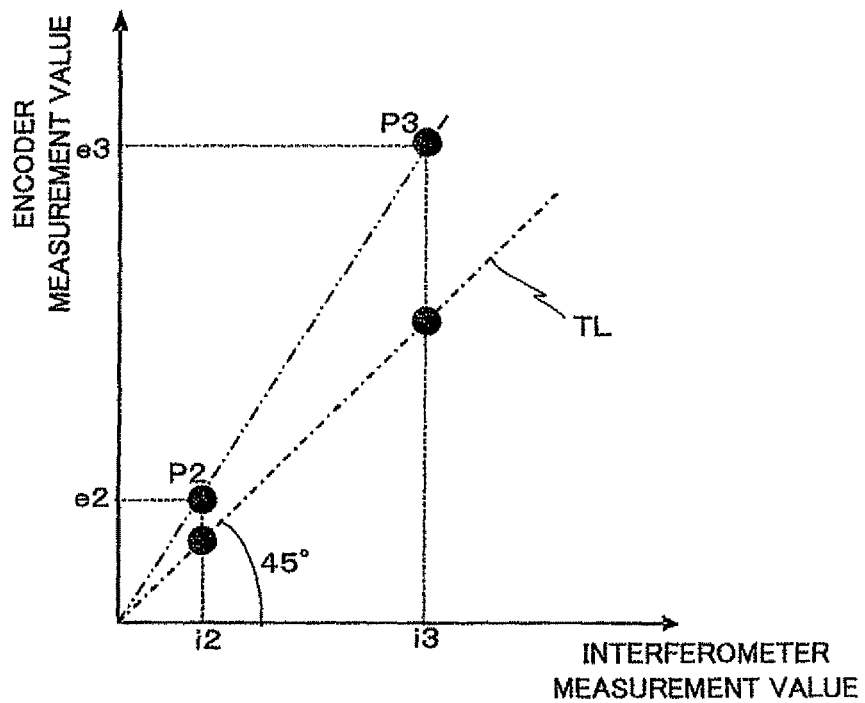
FIG. 18 is a view that shows an example of a map which is obtained by a second calibration operation.

Next, main controller 20 drives reticle stage RST in the −Y direction, and as is shown in FIG. 17, sets the position of reticle stage RST to a second Y position (hereinafter also simply referred to as a second position) so that the edge section on the +Y side of the pattern area of reticle R1 (or R2) coincides with the edge section on the −Y side of illumination area IAR. Then, main controller 20 continues the position setting state at the second position above shown in FIG. 17 for a predetermined period of time, and while continuing this state, obtains the measurement values of encoders 26A$_1$, 26B$_1$, and 26C$_1$ and interferometers 16x and 16y at a predetermined sampling interval, and stores the measurement values in memory (not shown).

Then, based on the measurement values (information) stored in memory at each of the first and second positions above, main controller 20 computes the averaging value (time averaging value) of the measurement values at each of the first and the second positions described above, for encoders 26A$_1$, 26B$_1$, and 26C$_1$ and interferometers 16x and 16y. Then, based on the computed results, main controller 20 makes a map on the measurement values of Y linear encoders 26A$_1$ and 26B$_1$ and the measurement values of reticle Y interferometer 16y, and also on the measurement values of reticle X interferometer 16x and X linear encoder 26C$_1$, like the one shown in FIG. 18. In the map in FIG. 18, point P2 and point P3 are points that show the relation between the measurement values of the interferometers at each of the first and second positions whose short-term variation due to air fluctuation or the like is reduced by the averaging effect and the measurement values of the corresponding encoders.

Next, main controller 20 computes a gradient component (scaling) $S_c$ of a correction map used for correcting the measurement values of the encoder using the measurement values of the interferometer from the following equation.

$$S_c = (e3-e2)/(i3-i2)$$

Then, main controller 20 replaces the gradient component of the correction map that has been computed with the gradient component in the correction map of the low order component. And based on the correction map of the low order component that has been replaced and the high order component kept as the correction map, main controller 20 makes a new correction map for correcting the low order component and the high order component.

In the description above, the position of reticle stage RST was set to both the first position and the second position, which are the positions on both edges of the range where illumination area IAR passes the pattern area of reticles R1 and R2, and a predetermined processing was performed so as to compute the new correction information described above. However, the computation is not limited to this, and the position of reticle stage RST can be set besides the first position and the second position, to three or more positions which include at least one position between the first position and the second position. And then, the processing similar to the description above is performed, and a least squares approximation straight line of the three or more points that have been obtained can be computed, and based on the approximation straight line, an offset component can also be computed in addition to the gradient component of the correction map (scaling error). In this case, a new correction map for correcting the low order component and the high order component can be made, based on the low order component of the correction map that has been computed (gradient component and offset component) and the high order component kept as the correction map. Further, the first and second positions to which the position of reticle stage RST is set was made to correspond to both edges of the movement range of reticle stage RST so that the entire pattern area of the reticle moves across illumination area IAR in the scanning direction. However, the present invention is not limited to this, and for example, the position of reticle stage RST can be made to correspond to the actual movement range (the movement range including the time of acceleration/deceleration before and after the scanning exposure and the synchronous settling time) of reticle stage RST during scanning exposure using one of the reticles R1 and R2. Furthermore, a part of the movement range in the scanning direction set by the first and second positions can be shifted from the movement range of reticle stage RST for the entire pattern area of the reticle to move across illumination area IAR, however, it is preferable for the movement range set by the first and second positions to include the movement range of reticle stage RST for the entire pattern area of the reticle to move across illumination area IAR. Further, the movement range of reticle stage RST can include the movement range during measurement operation using the reference marks.

Next, a third calibration operation performed per wafer (the so-called overhead time) for revising a gain error (a scaling error and an offset of an encoder measurement value to an interferometer measurement value) in encoders $26A_1$, $26B_1$, and $26C_1$, that is, the low order component of the correction map described earlier, will be described. This third calibration operation will also be referred to as a short-term calibration below, due to the same reasons as before.

First of all, main controller 20 drives reticle stage RST in the Y-axis direction within a predetermined range in which illumination area IAR passes the pattern area of reticle R1 (or R2) used in the next exposure. Reticle stage RST is driven at a low speed, but at a level in which the throughput can be maintained within an allowable range even if the throughput of exposure apparatus 100 decreases due to performing the third calibration operation. Then, during the drive, main controller 20 obtains the positional information of reticle stage RST at a predetermined sampling interval using interferometers 16x and 16y and encoders $26A_1$, $26B_1$, and $26C_1$, and stores the measurement values in memory (not shown). Also on this third calibration, illumination area IAR is not necessarily illuminated with illumination light IL, however, for the same reasons as before, the expressions such as "illumination area IAR passes" and the like are used. Further, the movement range of reticle stage RST is the same range as the range described in the second calibration operation. However, in the third calibration operation, position setting of reticle stage RST does not have to be performed at both edges of the movement range.

Figure 19:
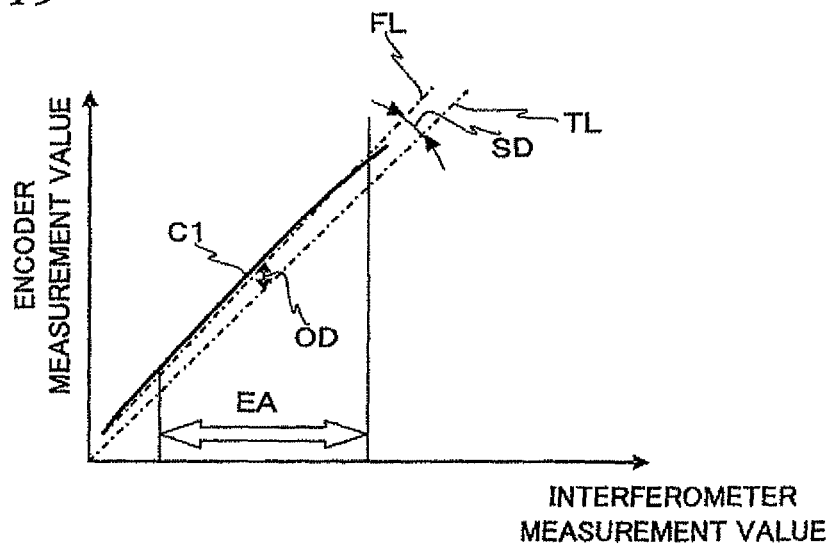
FIG. 19 is a diagram that shows an example of a map which is obtained by a second calibration operation of encoders $26A_1$, $26B_1$, and $26C_1$.

Then, main controller 20 makes a curve as in a curve C1 shown in FIG. 19 for each of the measurement values of Y linear encoders $26A_1$ and $26B_1$ and the measurement values of reticle Y interferometer 16y, and the measurement values of reticle X interferometer 16x and the measurement values of X linear encoder $26C_1$, in a similar manner as in the previous description. In FIG. 19, reference code EA indicates the predetermined range in which illumination area IAR passes the pattern area of reticle R1 (or R2), that is, the exposure section.

Next, main controller 20 obtains a least squares approximation straight line FL of curve C1, and then obtains an offset drift OD and a scaling drift SD of approximation straight line FL to ideal line TL. Then, using offset drift (offset error) and scaling drift (gradient error) that have been obtained, the correction map of the low order component kept in advance as a map is revised. Then, based on the correction map of the low order component that has been corrected and the correction map of the high order component kept in advance as a map, main controller 20 makes a new correction map for correcting the low order component and the high order component.

At least a part of the movement range of reticle stage RST in the third calibration operation can be shifted from a predetermined range (corresponding to exposure section EA) for the entire pattern area of the reticle to move across illumination area IAR, however, it is preferable for the movement range to include the predetermine range, and for example, the movement range can be the actual moving range of reticle stage RST during scanning exposure (the movement range that includes the acceleration/deceleration and synchronous settling period before and after the scanning exposure) using one of reticles R1 and R2. Further, the movement range of reticle stage RST can include the movement range during measurement operation using the reference marks previously described.

In exposure apparatus 100, main controller 20 performs the long-term calibration operation and the short-term calibration operation for encoders 50A to 50D used for controlling the position of wafer stage WST during the exposure operation in a similar method as in the first to third calibration previously described. However, wafer stage WST moves within a two-dimensional plane. In this case, main controller 20 drives wafer stage WST on an orthogonal coordinate system set by wafer Y interferometer 18Y and wafer X interferometer $18X_1$ and obtains a correction map based on errors of the measurement values of X linear encoders 50B and 50D, as well as a correction map based on errors of the measurement values of y linear encoders 50A and 50C. In this case, the disposal direction of the diffraction grating of movement scales 44A and 44C Y and the longitudinal direction of linear encoders 50A and 50C are both in the Y-axis direction, and the longitudinal direction of head units 46A and 46C (the disposal direction of the heads) is in the X-axis direction.

Next, the long-term calibration operation (the first calibration operation) of encoders 50A to 50 D performed in exposure apparatus 100 of the embodiment, that is, an acquisition operation of correction information of the grating pitch of the movement scales and correction information of grating deformation of wafer stage WST will be described, based on FIG. 20.

Figure 20:
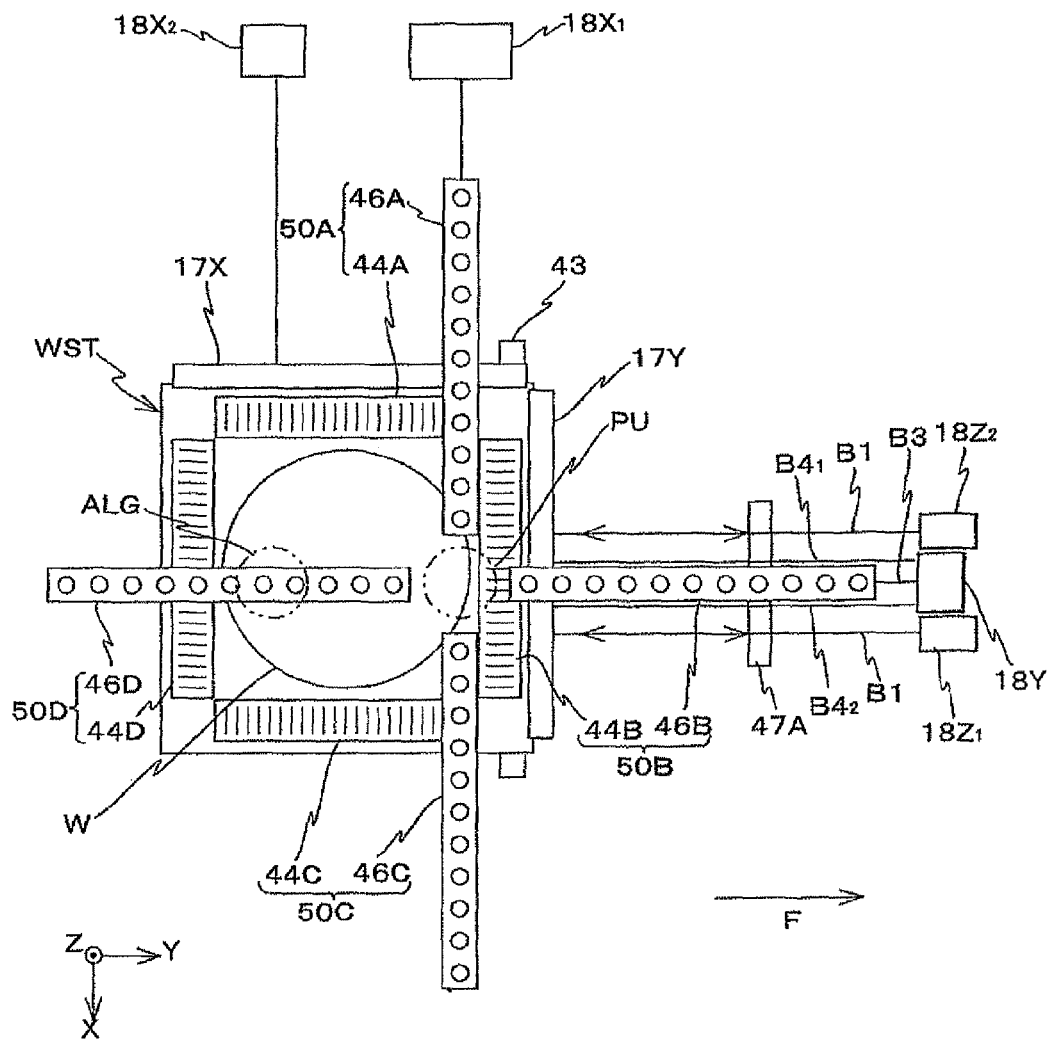
FIG. 20 is a view used for describing a long-term calibration operation (a first calibration operation) of encoder values 50A to 50D, that is, a view used for describing an acquisition operation of correction information of a grating pitch of a movement scale and correction information of grating deformation.

In FIG. 20, measurement beams $B4_1$ and $B4_2$ from Y interferometer 18Y are placed symmetrically to a straight line (coincides with a straight line formed when the center of a plurality of heads of head unit 46B and head unit 46D are joined) parallel to the Y-axis that passes through the optical axis of projection optical system PL, and the substantial measurement axis of Y interferometer 18Y coincides with a straight line parallel with the Y-axis that passes through the optical axis of projection optical system PL. Therefore, according to Y interferometer 18Y, the Y position of wafer stage WST can be measured without Abbe errors. Similarly, the measurement beam from X interferometer $18X_1$ is placed on a straight line (coincides with a straight line formed when the center of a plurality of heads of head unit 46A and head unit 46C are joined) parallel to the X-axis that passes through the optical axis of projection optical system PL, and the measurement axis of X interferometer $18X_1$ coincides with a straight line parallel with the X-axis that passes through the optical axis of projection optical system PL. Therefore, according to X interferometer $18X_1$, the X position of wafer stage WST can be measured without Abbe errors.

Now, as an example, an acquisition operation of correction information of deformation of the grating lines (grating line warp) of the X scale and the correction information of the grating pitch of the Y scale will be described. In order to simplify the description, the reflection surface of movable mirror 17X is to be an ideal plane.

First of all, main controller 20 drives wafer stage WST based on the measurement values of Y interferometer 18Y, X interferometer $18X_1$, and Z interferometers $18Z_1$ and $18Z_2$, and sets the position of wafer stage WST as is shown in FIG. 20 so that movement scales 44A and 44C are placed directly under the corresponding head units 46A and 46C (at least one head) and the edge on the +Y side of movement scales (diffraction gratings) 44A and 44C each coincide with the corresponding head units 46A and 46C.

Next, main controller 20 moves wafer stage WST in the +Y direction, for example, until the other end (the edge on the −Y side) of movement scales 44A and 44C coincides with the corresponding head units 46A and 46C as is indicated by an arrow F in FIG. 20 in a low speed at a level in which the short-term variation of the measurement values of Y interferometer 18Y can be ignored and also with the measurement values of X interferometer $18X_1$ fixed at a predetermined value, based on the measurement values of Y interferometer 18Y and Z interferometers $18Z_1$ and $18Z_2$ while maintaining all of the pitching amount, rolling amount, and yawing amount at zero. During this movement, main controller 20 takes in the measurement values of Y linear encoders 50A and 50C and the measurement values of Y interferometer 18Y (measurement values according to measurement beams $B4_1$ and $B4_2$) at a predetermined sampling interval, and then obtains the relation between the measurement values of Y linear encoders 50A and 50C and the measurement values of Y interferometer 18Y, based on the measurement values that are taken in. More specifically, main controller 20 obtains the grating pitch (the distance between adjacent grating lines) of movement scales 44A and 44C, which are placed sequentially facing head units 46A and 46C along with the movement of wafer stage WST and the correction information of the grating pitch. The correction information of the grating pitch can be obtained, for example, in the case the horizontal axis indicates the measurement values of the interferometer and the vertical axis indicates the measurement values of the encoders, as a correction map or the like that denotes a relation between the two using a curve. Since the measurement values of Y interferometer 18 in this case are values which can be obtained when wafer stage WST was scanned at an extremely slow speed as is previously described, it is safe to say that these values naturally contain no long-term variation errors as well as almost no short-term variation errors due to air fluctuation, and that it is an accurate value in which errors can be ignored. In this case, wafer stage WST was driven in the Y-axis direction covering a range in which both edges of movement scales 44A and 44C move across the corresponding head units 46A and 46C. The movement range, however, is not limited to this, and for example, wafer stage WST can be driven in a range in the Y-axis direction in which wafer stage WST is moved during exposure operation of a wafer.

Further, during the movement of wafer stage WST, by statistically processing the measurement values (measurement values of X linear encoders 50B and 50D) obtained from the plurality of heads of head units 46B and 46D, which are sequentially placed facing movement scales 44B and 44D along with the movement of wafer stage WST, such as for example, by averaging (or weighted averaging), main controller 20 also obtains correction information of the deformation (warp) of the grating lines that sequentially face the plurality of heads. This is because in the case the reflection surface of movable mirror 17X is an ideal plane, the same variation pattern should repeatedly appear during the process of sending wafer stage WST in the +Y direction, therefore, if the measurement data obtained by the plurality of heads is averaged, the correction information of the deformation (warp) of the grating lines of movement scales 44B and 44D that sequentially face the plurality of heads can be accurately obtained.

In the case the reflection surface of movable mirror 17X is not an ideal plane, the unevenness (distortion) of the reflection surface is to be measured and correction data of the distortion is to be obtained. Then, on the movement of wafer stage WST in the +Y direction described above, instead of fixing the measurement value of X interferometer $18X_1$ to a predetermined value, by controlling the X position of wafer stage WST based on the correction data, wafer stage WST can be accurately moved in the Y-axis direction. When this operation is applied, the correction information of the grating pitch of movement scales 44A and 44C and the correction information of the deformation (warp) of the grating lines of movement scales 44B and 44D can be accurately obtained in completely the same manner as in the above description. The measurement data obtained using the plurality of heads of head units 46B and 46D is a plurality of data at different regions of reference on the reflection surface of movable mirror 17X, and the heads each measure the deformation (warp) of the same grating line. Therefore, by the averaging or the like described above, an incidental effect occurs in which the distortion correction residual of the reflection surface is averaged so that it becomes closer to a true value (in other words, by averaging the measurement data (warp information of the grating line) obtained by a plurality of heads, the influence of the distortion correction residual can be reduced).

Since only the disposal direction of the diffraction grating, the longitudinal direction of movement scales 44B and 44D, and the longitudinal direction of head units 46B and 46D (the disposal direction of the heads) in X linear encoders 50B and 50D are opposite in the X-axis and Y-axis direction to the Y linear encoders 50A and 50C, details on the acquisition operation (the first calibration operation) of the correction information of the deformation (warp) of the grating lines of the Y scale and the correction information of the grating pitch of movement scales 50B and 50D will be omitted because the processing that needs to be performed is the correction described above with the X-axis direction and Y-axis direction interchanged.

As in the description above, main controller 20 obtains the correction information of the grating pitch of movement scales 44A and 44C, the correction information of the deformation (warp) of the grating lines of movement scales 44B and 44D, the correction information of the grating pitch of movement scales 44B and 44D and the correction information of the deformation (warp) of the grating lines of movement scales 44A and 44C, per a predetermined timing, such as for example, for each lot.

Then, during the exposure processing or the like of the wafer in the lot, main controller 20 performs position control of wafer stage WST in the Y-axis direction while correcting the measurement values (that is, the measurement values of encoders 50A and 50C) obtained from head units 46A and 46C based on the correction information of the grating pitch and the correction information of the deformation (warp) of the grating lines of movement scales 44A and 44C. Accordingly, it becomes possible for main controller 20 to perform position control of wafer stage WST in the Y-axis direction with good accuracy using linear encoders 50A and 50C, without being affected by the influence of the temporal change of the grating pitch and the grating line warp of movement scales 44A and 44C.

Further, during the exposure processing or the like of the wafer in the lot, main controller 20 performs position control of wafer stage WST in the X-axis direction while correcting the measurement values (that is, the measurement values of encoders 50B and 50D) obtained from head units 46B and 46D based on the correction information of the grating pitch and the correction information of the deformation (warp) of the grating lines of movement scales 44B and 44D. Accordingly, it becomes possible for main controller 20 to perform position control of wafer stage WST in the X-axis direction with good accuracy using linear encoders 50B and 50D, without being affected by the influence of the temporal change of the grating pitch and the grating line warp of movement scales 44B and 44D.

In the description above, the correction information of the grating pitch and the deformation (warp) of the grating lines were obtained for each of the movement scales 44A to 44D, however, the present invention is not limited to this, and the correction information of the grating pitch and the deformation (warp) of the grating lines can be obtained for only one of movement scales 44A and 44C and movement scales 44B and 44D, or the correction information of only one of the grating pitch and the deformation (warp) of the grating lines can be obtained for both movement scales 44A and 44C and movement scales 44B and 44D.

Although a detailed description will be omitted, the short-term calibration operation (the second and third calibration operations) of encoders 50A to 50D used for controlling the position of wafer stage WST during the exposure operation is to be performed according to the long-term calibration operation (the first calibration operation) described above.

Then, on the exposure operation by the step-and-scan method, main controller 20 performs position control of reticle stage RST based on the measurement values of encoders 26$A_1$, 26$B_1$, and 26$C_1$ and their correction maps, as well as the position control of wafer stage WST based on the measurement values of encoders 50A to 50D and their correction maps.

Further, in exposure apparatus 100 of the embodiment, reticle R1 and reticle R2 can be simultaneously mounted on reticle stage RST. Therefore, by having completed reticle alignment of reticle R1 and reticle R2, main controller 20 can perform double exposure, for example, using reticle R1 and reticle R2, by simply moving reticle stage RST based on the measurement values of encoders 26$A_1$, 26$B_1$, and 26$C_1$ without performing the reticle exchange operation to reticle stage RST.

The encoders used in the embodiment is not limited to the encoder by the diffraction interference method and encoders of various types of methods can be used, such as an encoder by the so-called pick up method, or for example, a so-called scan encoder whose details are disclosed in, for example, U.S. Pat. No. 6,639,686 or the like.

As is described in detail above, according to exposure apparatus 100 related to the embodiment, main controller 20 performs calibration operation of, for example, encoders 26$A_1$, 26$B_1$, and 26$C_1$. More specifically, correction information for correcting measurement values of encoders 26$A_1$, 26$B_1$, and 26$C_1$ and the like whose short-term stability of the measurement values is superior to interferometers 16$y$ and 16$x$ are acquired, using the measurement values of interferometers 16$y$ and 16$x$ whose linearity and long-term stability of the measurement values are superior to encoders 26$A_1$, 26$B_1$, and 26$C_1$. Then, main controller 20 drives reticle stage RST during scanning exposure or the like, based on the measurement values and the correction information of encoders 26$A_1$, 26$B_1$, and 26$C_1$.

Accordingly, reticle stage RST can be driven with good precision, based on the positional information of reticle stage RST whose linearity and long-term stability is good in addition to the measurement values of encoders 26$A_1$, 26$B_1$, and 26$C_1$ that have been corrected using the correction information, that is, the short-term stability.

Further, according to exposure apparatus 100, by the long-term calibration previously described, correction information for correcting measurement values of encoders 26$A_1$ and 26$B_1$ whose short-term stability of the measurement values is superior to interferometer 16$y$ is acquired, using the measurement values of interferometer 16$y$ whose linearity and long-term stability of the measurement values are superior to encoders 26$A_1$ and 26$B_1$. Then, during pattern transfer or the like, main controller 20 controls the movement of reticle stage RST based on the measurement values of encoders 26$A_1$ and 26$B_1$ and the correction information. Accordingly, it becomes possible to control the movement of reticle stage RST with good precision, based on the positional information of reticle stage RST in the scanning direction whose linearity and long-term stability is good in addition to the measurement values of encoders 26$A_1$ and 26$B_1$ that have been corrected using the correction information, that is, the short-term stability.

Further, according to exposure apparatus 100, by one of the short-term calibrations previously described, correction information for correcting a low order component (scaling error, or a scaling error and a scaling offset) of a map information that denotes a relation between the measurement values of interferometer 16$y$ whose linearity and long-term stability of the measurement values are superior to encoders 26$A_1$ and 26$B_1$ and the measurement values of encoders 26$A_1$ and 26$B_1$ whose short-term stability of the measurement values is superior to interferometer 16$y$ is acquired. Then, during pattern transfer or the like, main controller 20 controls the movement of reticle stage RST, based on the measurement values of encoders 26$A_1$ and 26$B_1$ and the map information whose low order component has been corrected using the correction information obtained above.

Further, according to exposure apparatus 100, main controller 20 performs calibration operation of, for example, encoders 50A to 50D in the manner similar to the calibration operation of encoders 26$A_1$ and 26$B_1$ described above. More specifically, correction information for correcting measurement values of encoders 50A to 50D whose short-term stability of the measurement values is superior to interferometers 18Y and 18X are acquired, using the measurement values of interferometers 18Y and 18X whose linearity and long-term stability of the measurement values are superior to encoders 50A to 50D. Then, main controller 20 drives wafer stage WST during scanning exposure, during the stepping movement in between shot areas, and the like, based on the measurement values and the correction information of encoders 50A to 50D.

Accordingly, wafer stage WST can be driven with good precision in both the X-axis and the Y-axis directions, based on the positional information of wafer stage WST in the X-axis and the Y-axis directions whose linearity and long-term stability is good in addition to the measurement values of encoders 50A to 50D that have been corrected using the correction information, that is, the short-term stability.

Accordingly, with exposure apparatus 100 of the embodiment, on scanning exposure of each shot area on the wafer, main controller 20 can drive reticle R1 or R2 (reticle stage RST) and wafer W (wafer stage WST) in the scanning direction (Y-axis direction) with good accuracy based on the measurement values of encoders 26A$_1$, 26B$_1$, and 26C$_1$ and encoders 50A to 50D, as well as perform position setting of reticle R1 or R2 (reticle stage RST) and wafer W (wafer stage WST) in the non-scanning direction (X-axis direction) with high precision. Accordingly, it becomes possible to form the pattern of reticle R1 (or R2) on the plurality of shot areas on wafer W with good accuracy.

In exposure apparatus 100 of the embodiment, main controller 20 revised the correction information of the measurement values of the encoders based on the measurement values of the encoders and the interferometers, which were obtained by moving reticle stage RST separately from the exposure operation. However, for example, the correction information can be revised, using the measurement values of the encoders and the interferometers, which are obtained during the movement of reticle stage RST during the exposure operation. More specifically, when performing the exposure operation by the step-and-scan method in which the pattern of reticle R1 (or R2) is sequentially transferred on the plurality of shot areas on wafer W, the position of reticle stage RST can be controlled based on the measurement values of the encoders and the correction information, for example, during the scanning exposure of each shot area. And, in parallel with the control (exposure operation of the wafer), the measurement values of the interferometers and the encoders can be accumulated. Then, based on the accumulated measurement values, sequential calibration of measurement errors of the encoders in which the correction information (for example, a map information that denotes a relation between measurement values of the interferometers and the measurement values of the encoders as is shown in FIG. 21) is calibrated in prior to exposing the next wafer can be performed.

Figure 21:
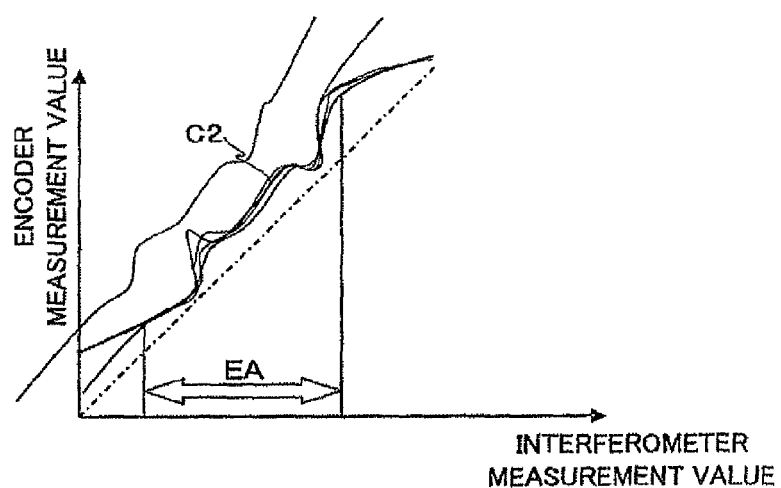
FIG. 21 is a view that shows measurement values of an interferometer and an encoder which can be obtained through sequential calibration of measurement errors of the encoder.

In FIG. 21, reference numeral C2 indicates the average value of the accumulated data, and this data of the average value is an averaging of the short-term variation (variation in measurement values due to air fluctuation or the like) of the measurement values of the interferometer. In this case, the data during scanning exposure does not have to be accumulated for all the shot areas, and the data during scanning exposure can merely be accumulated for the number of shot areas enough to perform the averaging of the short-term variation of the measurement values of the interferometer. In FIG. 21, reference code EA indicates an exposure section as in FIG. 19.

In this case as well, when performing exposure operation of the next wafer by the step-and-scan method, the movement of reticle stage RST during scanning exposure of each shot area can be controlled with good precision, based on the measurement values of the encoders corrected using the correction information (for example, the map information in FIG. 21), that is, on the positional information of the reticle stage whose linearity and long-term stability is good in addition to the short-term stability. Accordingly, it becomes possible to transfer the pattern formed on reticle R1 (or R2) by scanning exposure on the plurality of shot areas on the wafer with good accuracy. The calibration can be performed not only on the Y linear encoders but also on the X linear encoders, or the calibration can further be preformed on the encoder system (encoders 50A to 50D) of the wafer stage.

In exposure apparatus 100 in the embodiment above, correction information of the grating pitch of the movement scales and correction information of grating deformation can be obtained by a method related to a modified example, which will be described below.

An acquisition operation of correction information of the grating pitch of movement scales 44A and 44C and correction information of deformation (warp of the grating lines) of the grating lines of movement scales 44B and 44D will now be described. Further, in order to make the description simple, the reflection surface of movable mirror 17X is to be an ideal plane.

Figure 22:
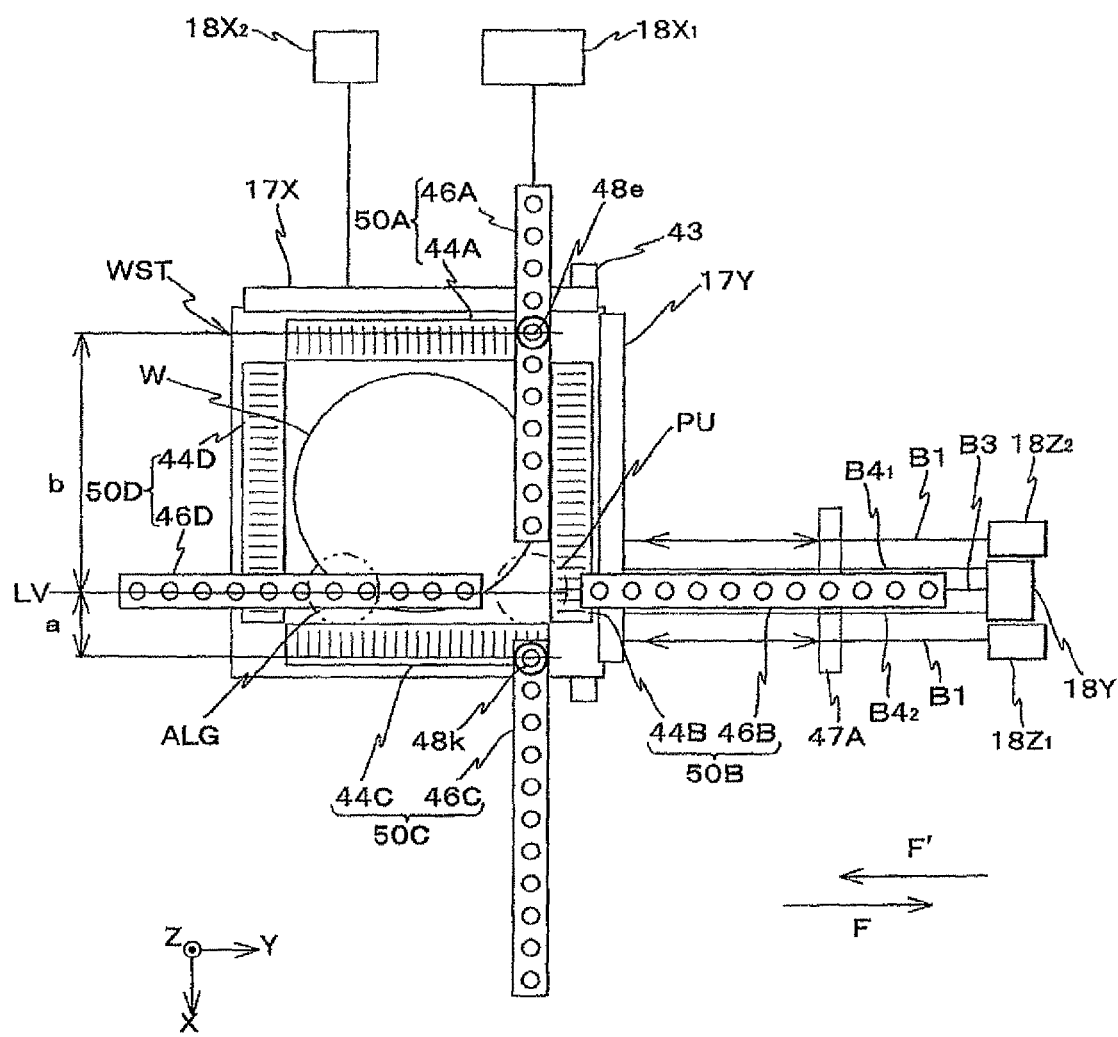
FIG. 22 is a view (No. 1) used for describing an acquisition operation of correction information of a grating pitch of movement scales 44A and 44C related to a modified example.

First of all, main controller 20 moves wafer stage WST, for example, in the +Y direction indicated by an arrow F in FIG. 22 in the stroke range previously described, while maintaining all of the pitching amount, the rolling amount, and the yawing amount to zero, based on the measurement values of Y interferometer 18Y, and Z interferometers 18Z$_1$ and 18Z$_2$ while fixing the measurement values of X interferometer 18X$_1$ to a predetermined value. During this movement, main controller 20 takes in the measurement values of encoders 50A and 50C and the measurement values of Y interferometer Y18 (the measurement values according to measurement beams B4$_1$ and B4$_2$) into an internal memory at a predetermined sampling interval. In this case, the measurement values of encoder 50C is obtained from head 48$k$ of head unit 46C, which is indicated enclosed in a circle in FIG. 22, located at a position a distance a away in the +X direction from a straight line LV parallel to the Y-axis that passes through the optical axis of projection optical system PL, facing movement scale 44C. Further, the measurement values of encoder 50A is obtained from head 48$e$ of head unit 46A, which is indicated enclosed in a circle in FIG. 22, located at a position a distance b away in the −X direction from straight line LV, facing movement scale 44A.

Next, after main controller 20 moves wafer stage WST in the +X direction by a predetermined distance based on the measurement values of X interferometer 18X$_1$, main controller 20 moves wafer stage WST in the −Y direction indicated by an arrow F' in FIG. 22 by a predetermined distance based on the measurement values of Y interferometer 18Y, and then makes wafer stage WST stop at this position.

Figure 23:
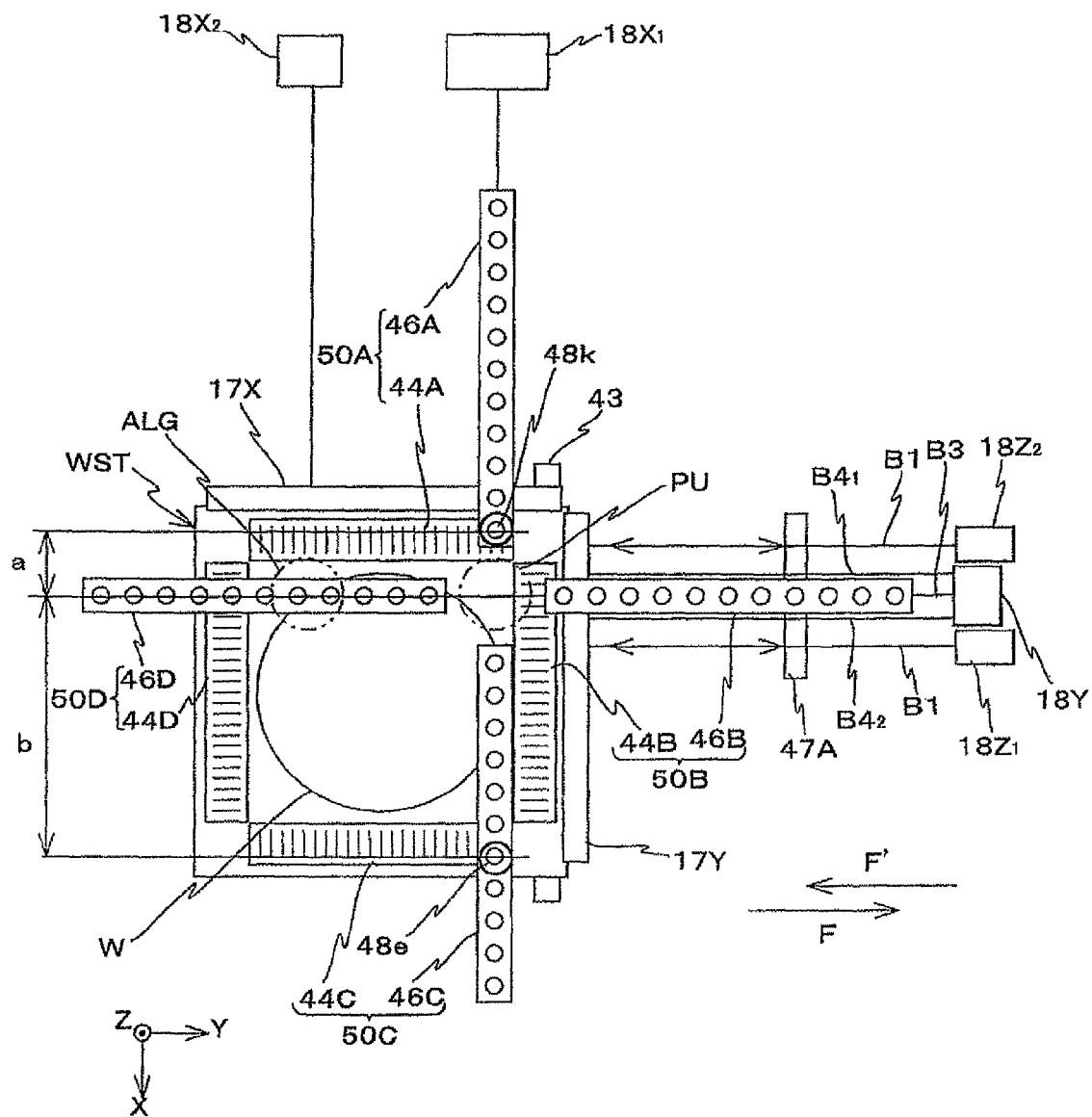
FIG. 23 is a view (No. 2) used for describing an acquisition operation of correction information of a grating pitch of movement scales 44A and 44C related to a modified example.

Then, main controller 20 moves wafer stage WST, for example, in the +Y direction indicated by an arrow F in FIG. 23 in the stroke range previously described, while maintaining all of the pitching amount, the rolling amount, and the yawing amount close to zero as much as possible, based on the measurement values of Y interferometer 18Y, and Z interferometers 18Z$_1$ and 18Z$_2$ while fixing the measurement values of X interferometer 18X$_1$ to a predetermined value. During this movement, main controller 20 takes in the measurement values of encoders 50A and 50C and the measurement values of Y interferometer Y18 (the measurement values according to measurement beams B4$_1$ and B4$_2$) into an internal memory at a predetermined sampling interval. In this case, the measurement values of encoder 50C is obtained from head 48*e* of head unit 46C, which is indicated enclosed in a circle in FIG. 23, located at a position a distance b away in the +X direction from straight line LV, facing movement scale 44C. Further, the measurement values of encoder 50A is obtained from head 48*k* of head unit 46A, which is indicated enclosed in a circle in FIG. 23, located at a position a distance a away in the −X direction from straight line LV, facing movement scale 44A.

However, since the position of each head on the XY coordinate system is known, by forming a simultaneous equation using the sampling values obtained in the two operations above and solving the simultaneous equation, the correction information (e.g. a correction map) of the grating pitch of movement scales 44C and 44A can be respectively obtained independently.

In the case the reflection surface of movable mirror 17X is not an ideal plane, the unevenness (distortion) of the reflection surface is to be measured and correction data of the distortion is to be obtained. Then, on the movement of wafer stage WST in the +Y direction shown in FIGS. 22 and 23 described above, instead of fixing the measurement value of X interferometer $18X_1$ to a predetermined value, by controlling the X position of wafer stage WST based on the correction data, wafer stage WST can be accurately moved in the Y-axis direction.

Figure 24:
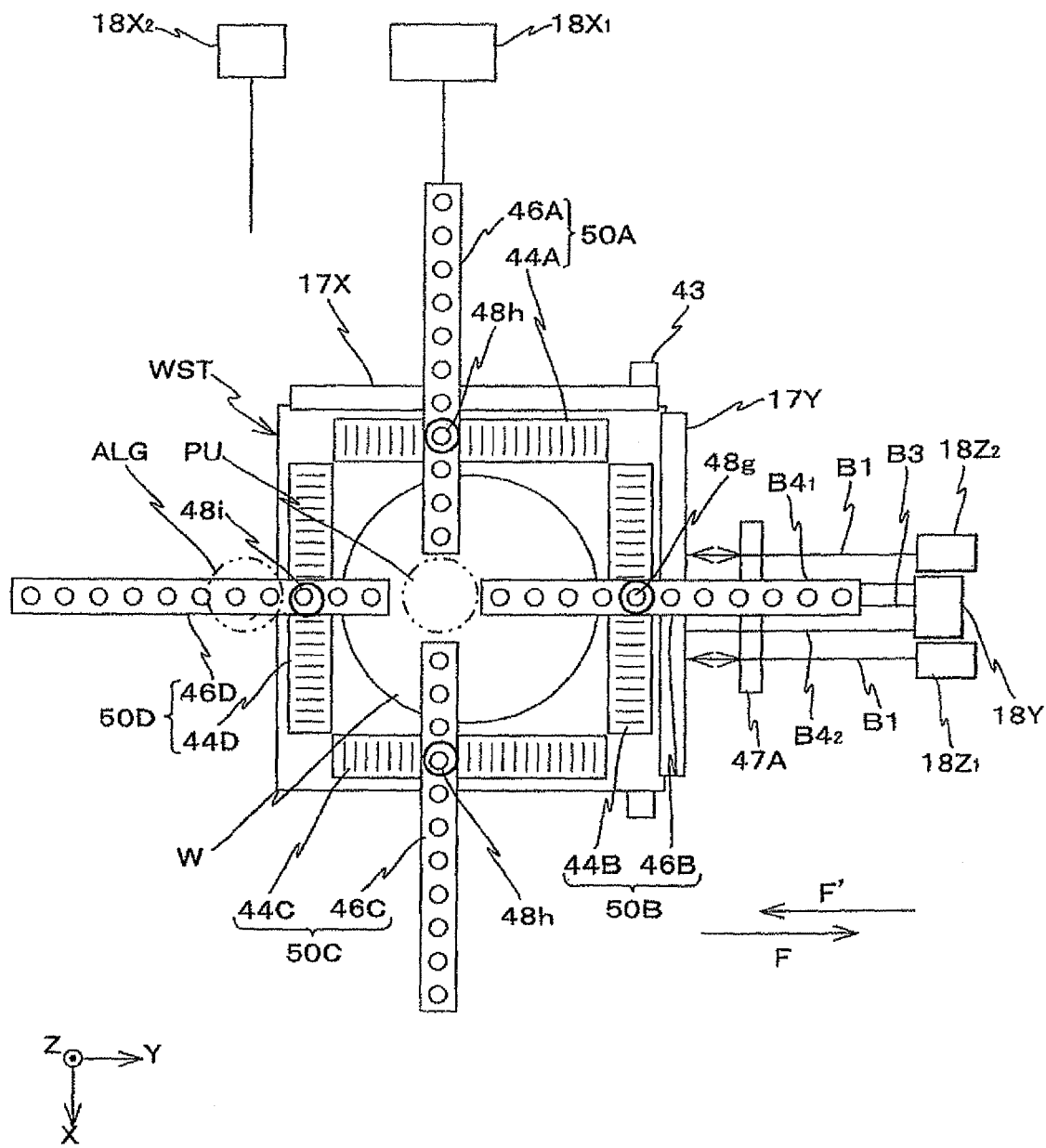
FIG. 24 is a view used for describing an acquisition operation of correction information of a grating line deformation (grating line warp) of movement scales 44B and 44D related to a modified example.

After the correction information (e.g. a correction map) of the grating pitch of each of the movement scales 44C and 44A has been obtained in the manner described above, main controller 20 then moves wafer stage WST in the +Y direction as is shown, for example, in FIG. 24, in a procedure similar to the case in FIG. 22 or the like described above. This case is different, however, from when the correction information of the grating pitch of movement scales 44C and 44A was obtained, and head 48*g* of head unit 46B and head 48*i* of head unit 46D that are indicated enclosed in a circle in FIG. 24 facing movement scales 44B and 44D, are located away from the measurement axis of X interferometer $18X_1$. Therefore, an apparent yawing amount of wafer stage WST measured by the interferometer due to air fluctuation affects the measurement values of encoders 50B and 50D (head 48*g* of head unit 46B and head 48*i* of head unit 46D), and is included in the measurement values as an error (hereinafter referred to shortly as a "yawing-induced error). However, in this case, the apparent yawing amount of wafer stage WST measured by the interferometer due to the air fluctuation described above can be measured, using encoders 50A and 50C (head 48*h* of head unit 46A and head 48*h* of head unit 46C enclosed in a circle in FIG. 24, facing movement scales 44A and 44C). More specifically, while correcting the measurement values of encoders 50A and 50C using the correction information of the grating pitch of movement scales 44C and 44A that has been obtained earlier, main controller 20 can obtain the apparent yawing amount of wafer stage WST described above, based on the measurement values that have been corrected. Then, main controller 20 can correct the yawing-induced error described above, using the apparent yawing amount that has been obtained.

Main controller 20 moves wafer stage WST in the +Y direction, and during this movement, takes in the measurement values obtained from a plurality of heads of head units 46B and 46D, which are sequentially placed facing movement scales 44B and 44D, into an internal memory at a predetermined sampling interval while correcting the yawing-induced error in the manner described above. Then, for the same reasons described earlier, main controller 20 performs statistical processing on the measurement values taken in the internal memory, such as for example, averaging (or weighted averaging) so that the correction information of the deformation (warp) of the grating lines of movement scales 44B and 44D can also be obtained.

Further, also in the case of obtaining the correction information (e.g. correction map) of the grating pitch of movement scales 44A and 44C and/or the correction information of the deformation (warp) of the grating lines of movement scales 44B and 44D by driving wafer stage WST in the −Y direction indicated by arrow F' in FIGS. 22, 23, and 24 taking into consideration the reciprocal difference, the processing similar to the description above should be performed.

Meanwhile, on obtaining the correction information of the deformation (warp) of the grating lines of movement scales 44A and 44C and the correction information of the grating pitch of movement scales 44B and 44D, main controller 20 performs the same processing described above with the X-axis direction and the Y-axis direction interchanged. Details on this will be omitted.

Since each scale (diffraction grating) has a width, on obtaining the correction information, the correction information of the grating pitch can be obtained, for example, by obtaining the correction information above along three lines in the width direction, on the right, left, and in the center, and as for the correction information of the grating line warp, a grating line can be representatively chosen so as to measure the warp. This is preferable, from the viewpoint of accuracy and workability.

According to the method related to the modified example described above, when obtaining the correction information of the grating pitch and/or the correction information of the deformation of the grating lines (warp of the grating lines), wafer stage WST does not necessarily have to be moved at an extremely low speed. Therefore, it becomes possible to perform the acquisition operation of such correction information described above in a short time.

Figure 25:
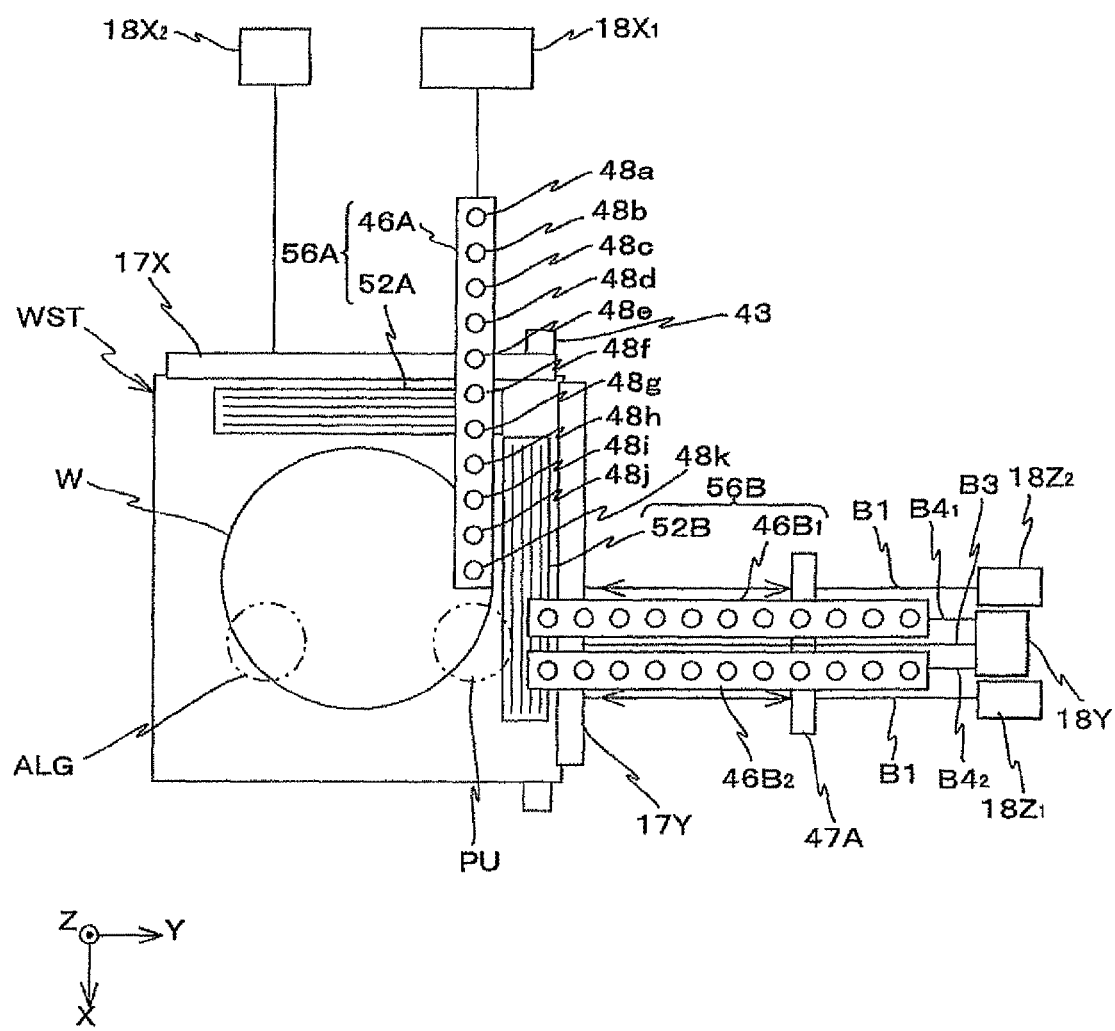
FIG. 25 is a view that shows a modified example of an encoder system for a wafer stage.
Figure 26:
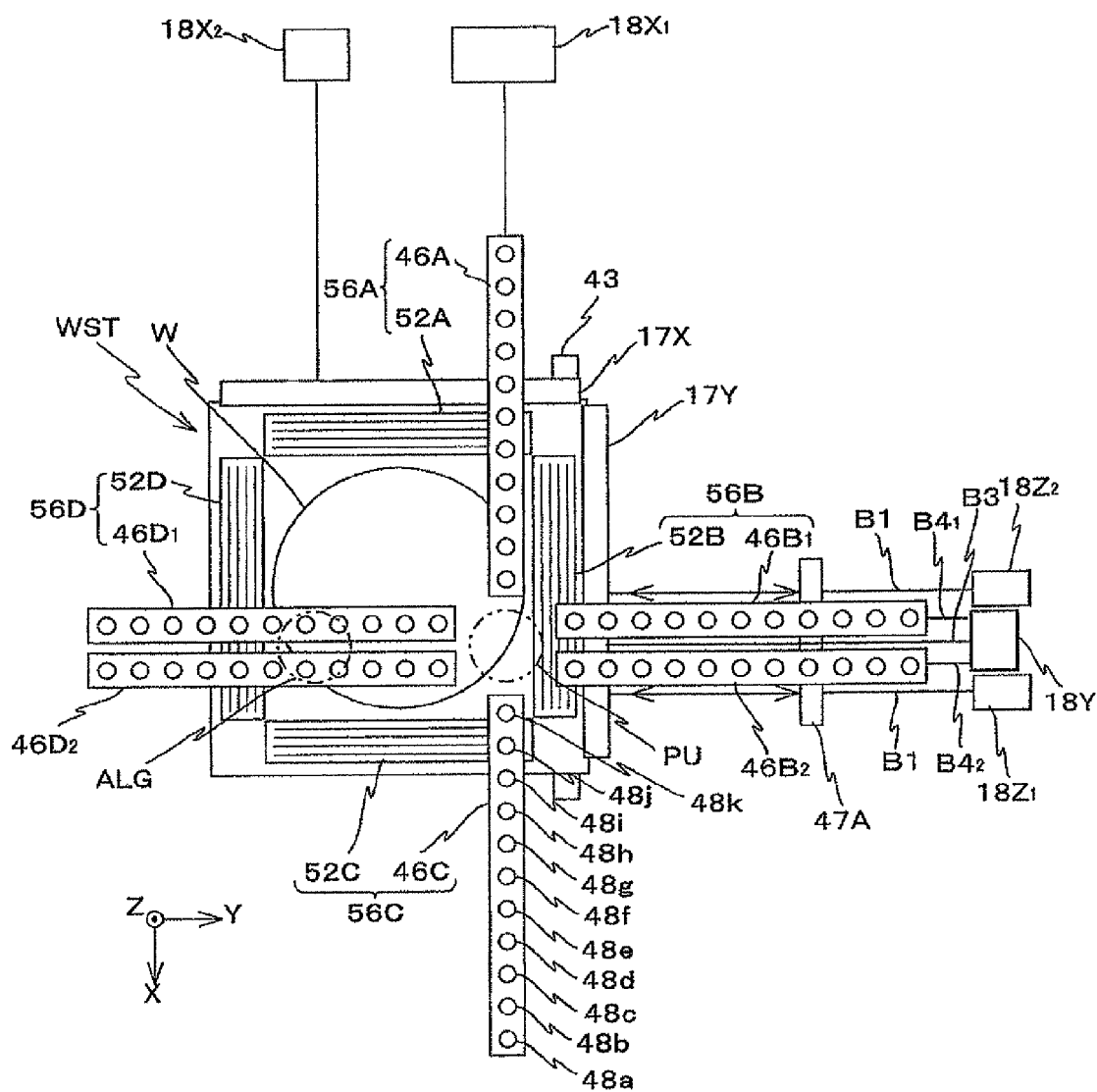
FIG. 26 is a view that shows a different modified example of an encoder system for a wafer stage.

Next, a modified example of an encoder system for the wafer stage will be described, referring to FIGS. 25 and 26. In FIGS. 25 and 26, the only point different from FIG. 3 is the configuration of the encoder system, therefore, in the description below, for parts that have the same or similar arrangement as in FIG. 3, the same reference numerals will be used, and the description thereabout will be omitted.

As is shown in FIG. 25, on the upper surface of wafer stage WST, two movement scales 52A and 52B whose longitudinal direction are orthogonal to each other and the longitudinal direction is the Y-axis direction and the X-axis direction, respectively, are fixed in an L-shape. On the surface of the two movement scales 52A and 52B, a reflection type diffraction grating that has a period direction orthogonal to the longitudinal direction is formed.

Further, head unit 46A and a pair of head units $46B_1$ and $46B_2$ are each placed crossing the corresponding movement scales 52A and 52B, and are fixed to barrel platform 38 in a suspended state via a support member (not shown). Head unit 46A is placed on an axis (center axis) parallel to the X-axis that passes through optical axis AX of projection optical system PL with the longitudinal direction (the disposal direction of the heads) being the X-axis direction (the period direction of the diffraction grating), which is orthogonal to the longitudinal direction of movement scale 52A (the Y-axis direction), and constitutes an X linear encoder 56A that measures the positional information of wafer stage WST in the X-axis direction, together with movement scale 52A. The pair of head units $46B_1$ and $46B_2$ are placed in an arrangement symmetric to an axis (center axis) parallel to the Y-axis that passes through optical axis AX of projection optical system PL, with the longitudinal direction (the disposal direction of the heads) being the Y-axis direction (the period direction of the diffraction grating), which is orthogonal to the longitudinal direction of movement scale 52B (the X-axis direction), and constitutes a Y linear encoder 56B that measures the positional information of wafer stage WST in the Y-axis direction at two points, together with movement scale 52B.

Furthermore, the measurement values of the two linear encoders 56A and 56B are supplied to main controller 20, and based on the positional information in the X-axis and the Y-axis directions and the rotational information in the θz direction, main controller 20 performs position control of wafer stage WST via wafer stage drive section 27. Accordingly, wafer stage WST can be driven two-dimensionally with high precision, in exactly the same manner as in the embodiment above.

FIG. 26 is a view that shows a different modified example of an encoder system for the wafer stage, and the only point different from FIG. 25 besides the point that a set of linear encoders 56A and 56B was arranged is the point that another set of linear encoders 56C and 56D is arranged. As is shown in FIG. 26, on the upper surface of wafer stage WST, two movement scales 52C and 52D whose longitudinal direction are orthogonal to each other and the longitudinal direction is the Y-axis direction and the X-axis direction, respectively, are fixed in an L-shape. On the surface of the two movement scales 52C and 52D, a reflection type diffraction grating that has a period direction orthogonal to the longitudinal direction is formed, and movement scales 52C and 52D are placed in an arrangement symmetric to movement scales 52A and 52B, in relation to the center of wafer stage WST.

Further, head unit 46C and a pair of head units 46D$_1$ and 46D$_2$ are each placed crossing the corresponding movement scales 52C and 52D, and are fixed to barrel platform 38 in a suspended state via a support member (not shown). Head unit 46C is placed symmetric to head unit 46A described earlier, in relation to optical axis AX of projection optical system PL (that is, arranged on the axis (center axis) parallel to the X-axis that passes through optical axis AX previously described), with the longitudinal direction (the disposal direction of the heads) being the X-axis direction (the period direction of the diffraction grating), which is orthogonal to the longitudinal direction of movement scale 52C (the Y-axis direction), and constitutes an X linear encoder 56C that measures the positional information of wafer stage WST in the X-axis direction, together with movement scale 52C. The pair of head units 46D$_1$ and 46D$_2$ are placed in an arrangement symmetric to head units 46B$_1$ and 46B$_2$ described earlier, in relation to optical axis AX of projection optical system PL (that is, arranged symmetric in relation to an axis (center axis) parallel to the Y-axis that passes through optical axis AX), with the longitudinal direction (the disposal direction of the heads) being the Y-axis direction (the period direction of the diffraction grating), which is orthogonal to the longitudinal direction of movement scale 52D (the X-axis direction), and constitutes a Y linear encoder 56D that measures the positional information of wafer stage WST in the Y-axis direction at two points, together with movement scale 52D.

Furthermore, the measurement values of the four linear encoders 56A to 56D are supplied to main controller 20, and based on the positional information in the X-axis and the Y-axis directions and the rotational information in the θz direction, main controller 20 performs position control of wafer stage WST via wafer stage drive section 27. Accordingly, wafer stage WST can be driven two-dimensionally with high precision, in exactly the same manner as in the embodiment above. Since the encoder system in FIG. 26 has four linear encoders 56A to 56D, positional information of wafer stage WST (positional information in the X-axis and the Y-axis direction and the rotational information in the θz direction) can be constantly obtained from at least three encoders of the four linear encoders 56A to 56D regardless of the position of wafer stage WST during wafer exposure operation, even if the head units are not placed close to projection optical system PL when compared with the encoder system in FIG. 25. Further, in the encoder system in FIG. 26, Y linear encoders 56B and 56D each had two head units, however, the number of heads is not limited to this, and for example, the linear encoders can merely have a single head unit.

Wafer X interferometer 18X$_1$ referred to earlier has at least one measurement axis that includes a measurement axis (corresponding to the solid line in the drawings), which coincides with an axis (center axis) parallel to the X-axis that passes through optical axis AX of projection optical system PL. And, in the encoder system shown in FIGS. 26 and 26, X linear encoder 56A (and 56C) is placed so that the center axis (the measurement axis in the X measurement of wafer interferometer 18X$_1$) coincides with the measurement axis (the disposal direction of the heads) of head unit 46A (and 46C). Further, wafer Y interferometer 18Y referred to earlier has a plurality of measurement axes that include two measurement axes (corresponding to beams B4$_1$ and B4$_2$ shown by solid lines in FIGS. 25 and 26) arranged symmetric in relation to an axis (center axis) parallel to the Y-axis that passes through optical axis AX of projection optical system PL and the detection center of alignment system ALG. And, Y linear encoder 565 (and 56D) is placed so that the measurement axes (the disposal direction of the heads) of head units 46B$_1$ and 46B$_2$ (and 46D$_1$ and 46D$_2$) respectively correspond to the two measurement axes. Accordingly, difference in measurement values become difficult to occur in the case the measurement axis of the linear encoder and the measurement axis of the wafer interferometer coincide with each other as is previously described, and it becomes possible to perform the calibration operation described earlier with good precision. In the modified example, the measurement axis of the linear encoder and the measurement axis of the wafer interferometer coincide with each other, however, the present invention is not limited to this, and both axes can be placed shifted within the XY plane. Further, the same can be said for the embodiment above (FIG. 3).

In the encoder system shown in FIGS. 25 and 26, the two or four movement scales (52A to 52D) are made of the same material (such as, for example, ceramics or low thermal expansion glass), and regarding the respective longitudinal directions, the length (corresponding to the width of the diffraction grating) is set longer than the size (diameter) of wafer W so that the length covers at least the entire area of the movement strokes (movement range) of wafer stage WST during exposure operation of wafer W (in other words, during scanning exposure of all the shot areas, each head unit (measurement beam) does not move off the corresponding movement scale (diffraction grating), that is, an unmeasurable state is avoided). Further, in the encoder system shown in FIGS. 25 and 26, the three or six head units (46A to 46D$_2$) can each be, for example, a single head, or a unit having a plurality of heads that are almost seamlessly arranged, however, in the encoder system shown in FIGS. 25 and 26, in both cases the encoders have a plurality of heads that are placed at a predetermined distance along the longitudinal direction. Furthermore, in each head unit, the plurality of heads are placed at a distance so that adjacent two heads of the plurality of heads do not go astray from the corresponding movement scale (diffraction grating), or in other words, at a distance around the same or smaller than the formation range of the diffraction gratings in the direction orthogonal to the longitudinal direction (disposal direction of the diffraction gratings) of the movement scale. Further, the length (corresponding to the detection range of the diffraction gratings) of the three or six head units (46A to 46D₂) in the longitudinal direction is set to the same level or larger than the movement strokes of wafer stage WST so that the length covers at least the entire area of the movement strokes (movement range) of wafer stage WST during exposure operation of wafer W (in other words, during scanning exposure of all the shot areas, each head unit (measurement beam) does not move off the corresponding movement scale (diffraction grating), that is, an unmeasurable state is avoided).

Further, in the exposure apparatus equipped with the encoder system shown in FIGS. 25 and 26, calibration operation (the first to third calibration operation previously described) for deciding the correction information of the measurement values of each encoder is performed exactly the same as in exposure apparatus 100 (including the encoder system shown in FIG. 3) in the embodiment above. In this case, for instance, in each encoder, the position of the movement scale in the longitudinal direction is set so that one end of the movement scale coincides with the corresponding head unit, and then the movement scale is moved in the disposal direction of the diffraction grating (the direction orthogonal to the longitudinal direction) by a distance around the same level, or more than the width of the movement scale. Furthermore, after the movement scale is moved in the longitudinal direction by a distance around the same level as the magnitude of the measurement beam in one head of the head units, the movement scale is moved similarly in the disposal direction of the diffraction grating, by a distance around the same level, or more than the width of the movement scale. Hereinafter, the operation described above is repeatedly performed until the other end of the movement scale coincides with the head unit. Then, based on the measurement values of the encoder obtained by this drive and the measurement values of the wafer interferometer that has the same measurement direction as the encoder, the correction information of the encoder can be decided. In this case, wafer stage WST was driven so as to cover the range in the longitudinal direction where both ends of the movement scale coincides with the corresponding head unit, however, the present invention is not limited to this, and wafer stage WST can be driven, for example, in the range in the longitudinal direction where wafer stage WST is moved during exposure operation of the wafer.

In the embodiment and the modified examples described above, position control of reticle stage RST and wafer stage WST was performed using only the encoder system (FIGS. 2, 3, 25, and 26) previously described during exposure operation of the wafer. However, even if the calibration operation previously described (especially the short-term calibration operation) is performed, there may be a case when at least a part of the positional information in the X-axis and Y-axis directions and the rotational information in the θz direction necessary for the position control referred to above cannot be obtained during the exposure operation since problems such as the position becoming unmeasurable, the measurement accuracy exceeding an allowable range and the like occur for some reason (such as foreign substances adhering on the movement scale, positional shift of the movement scale, tilt of the head unit or loss of telecentricity in the head unit, displacement of the movement scale in the Z-axis direction (the direction orthogonal to the surface) exceeding an allowable range and the like). Since the encoder system shown in FIGS. 3 and 26 have four encoders, the position control described above can be performed even if a problem occurs in one encoder, however, in the encoder system shown in FIGS. 2 and 25, if a problem occurs in one encoder, then the position control above cannot be performed.

Therefore, in the exposure apparatus, a first drive mode that uses the positional information measured by the encoder system previously described and a second drive mode that uses the positional information measured by the interferometer system previously described should be prepared, and in the setting, the first drive mode is to be used normally during exposure operation. Then, for example, in the case when at least a part of the positional information in the X-axis and Y-axis directions and the rotational information in the θz direction necessary for the position control referred to above cannot be obtained any longer during the exposure operation or the like, the first drive mode is preferably switched to the second drive mode and the position control of the reticle stage or wafer stage is to be performed in the second drive mode. Furthermore, a third mode that uses at least a part of the positional information measured by the encoder system previously described and at least a part of the positional information measured by the interferometer system previously described together can also be prepared, and the position control of the reticle stage or the wafer stage can be performed using one of the second and the third drive modes, instead of using the first drive mode. The switching of the first drive mode to the second drive mode (or to the third drive mode) is not limited only to the time of exposure operation, and the switching can be performed similarly during other operations (such as for example, measurement operation as in alignment and the like). Further, in the other operations, the mode does not have to be set to the first drive mode in advance, and other drive modes (for example, one mode of the second and third drive modes) can be set instead of the first drive mode. In such a case, for example, when an error occurs during the position control of the stage by the other drive mode, the mode can be switched to a different mode (for example, the other mode of the second and third drive modes, or the first drive mode). Furthermore, the drive mode can be made selectable during the operation other than the exposure operation.

Figure 28:
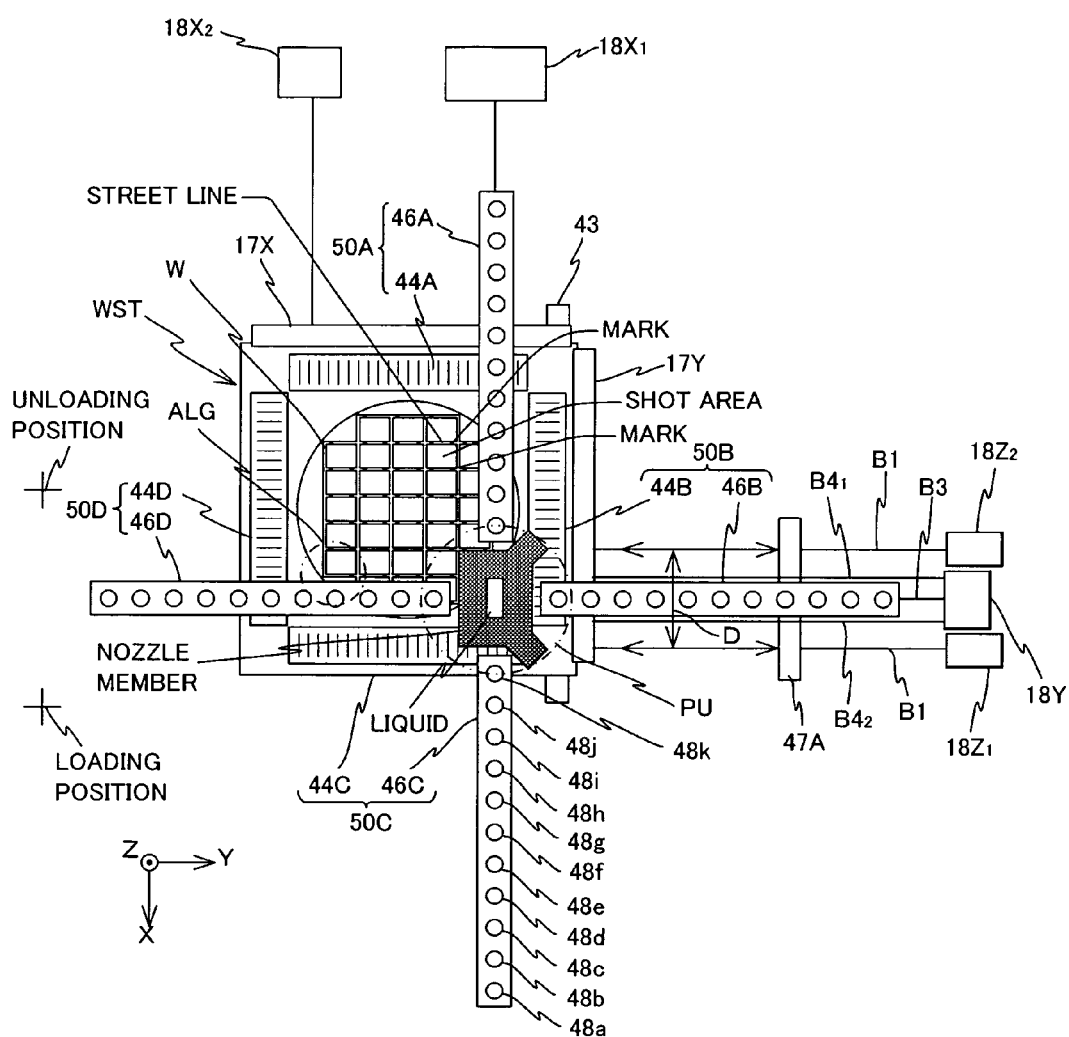
FIG. 28 is a view that shows an encoder system used with an immersion lithography apparatus having a nozzle member, unloading and loading positions for wafer exchange, and marks on the wafer in the street lines between shot areas on the wafer.

In the embodiment and the modified examples described above, the case has been described where during switching operation of the position measurement system, the measurement values of interferometers 18X₁ and 18Y are carried over to encoders 50A to 50D after wafer stage WST is suspended for a predetermined time until the short-term variation caused by air fluctuation (temperature fluctuation of air) of the measurement values of interferometers 18X₁ and 18Y falls to a level that can be ignored due to an averaging effect. The present invention, however, is not limited to this, and for example, the same operation as the second calibration previously described can be performed and the measurement values of interferometers 18X₁ and 18Y can be carried over to encoders 50A to 50D, based on the low order component that has been obtained in the calibration. Further, the switching operation of the position measurement system does not necessarily have to be performed. More specifically, the positional information of the alignment marks on wafer W (see FIG. 28) and the fiducial marks on wafer stage WST can be measured using alignment system ALG and wafer interferometer system (18X$_2$ and 18Y), as well as the positional information of the fiducial marks on wafer stage WST using the reticle alignment system and the encoder system, and based on the positional information, position control of the wafer stage can be performed by the encoder system.

Figure 29:
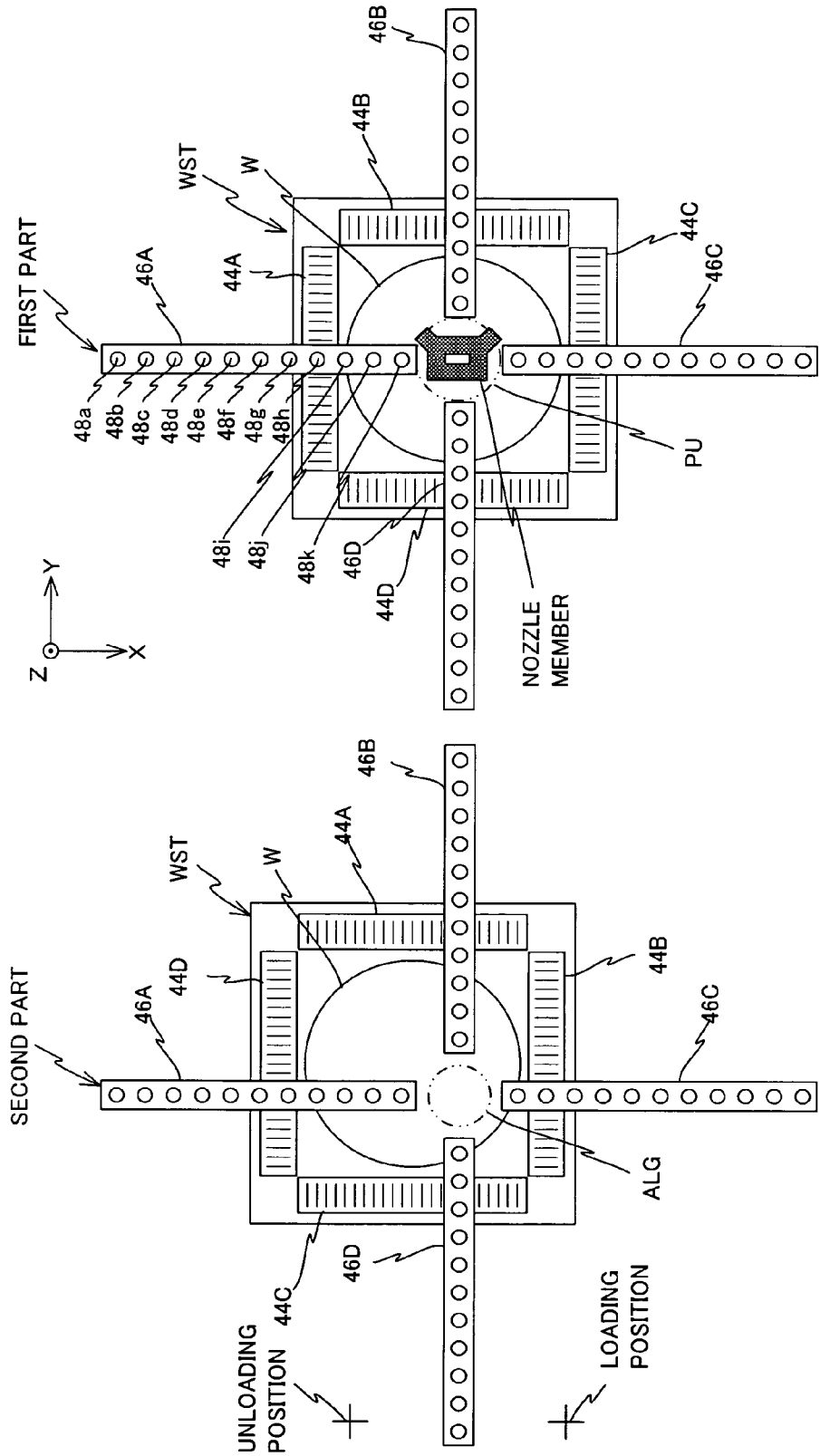
FIG. 29 is a view that shows an encoder system used with an immersion lithography apparatus having a nozzle member, unloading and loading positions for wafer exchange, and first and second parts of the encoder system located adjacent the projection optical system and adjacent the detecting system, respectively.

Further, in the embodiment and the modified examples described above, the case has been described where the system was switched from the interferometer to the encoder as the switching operation of the position measurement system, however, the present invention is not limited to this. For example, in the case such as when alignment system ALG is installed at a position sufficiently away from projection unit PU, head units similar to head units 46A to 46D should be arranged in the area where the alignment operation using alignment system ALG is to be performed, in the shape of a cross with alignment system ALG in the center (see FIG. 29). Then, an origin is set for each of the movement scales 44A to 44D, and on wafer alignment such as EGA, the positional information of each alignment mark on wafer W that uses an origin of a coordinate system set by the combination of movement scales 44A to 44D as a reference is detected using the head units and movement scales 44A to 44D, and then, based on the detection results, a predetermined calculation can be performed so as to obtain relative positional information of each shot area with respect to the origin referred to above. In this case, on exposure, by detecting the origin using encoders 50A to 50D, each shot area can be moved to the acceleration starting position for exposure using the relative positional information of each shot area with respect to the origin referred to above. In this case, since position drift between the head and projection unit PU/alignment system ALG also becomes an error cause, it is preferable to perform calibration on the positional shift.

In the embodiment and the modified examples described above, position control of reticle stage RST and wafer stage WST was performed during exposure operation of the wafer using the encoder system previously described (FIGS. 2, 3, 25, and 26), however the position control of the stages using the encoder system is not limited only during exposure operation, and besides during the exposure operation, for example, in the detection operation of the reticle alignment marks or the reference marks on reticle stage RST using the reticle alignment system, or in the reticle exchange operation, position control of reticle stage RST can be performed using the encoder system shown in FIG. 2. Similarly, for example, in the detection operation of the alignment marks of wafer W using alignment system ALG, or in the wafer exchange operation (see FIGS. 28 and 29), position control of wafer stage WST can be performed using the encoder system shown in FIGS. 3, 25, and 26. In this case, as a matter of course, the switching operation of the position measurement system will not be required.

In the case of using the encoder system previously described (FIGS. 3, 25, and 26), during the detection of the alignment marks on wafer W (see FIG. 28) or fiducial marks on wafer stage WST using alignment system ALG, or during the detection of the fiducial marks on wafer stage WST using the reticle alignment system, it is preferable to take into consideration the movement range of wafer stage WST during the detection operation. It is preferable to set the length (or placement) in the longitudinal direction of each of the head units or to arrange head units different from each of the head units above, so that especially during the mark detection operation performed when the wafer stage is moved to the measurement position of alignment system ALG, each of the head units (46A to 46D, 46A to 46D$_2$) does not move away from the corresponding measurement scales (diffraction gratings), that is, the situation where the measurement using the encoder system becomes unmeasurable and the position control of the wafer stage is cut off is avoided.

Further, in the case of using the encoder system previously described (FIGS. 3, 25, and 26) at the wafer exchange position (including at least one of the loading position and the unloading position), or during the movement from one point to the other between the wafer exchange position and the exposure position where transfer of the reticle pattern is performed via projection optical system PL or to the measurement position where mark detection by alignment system ALG is performed, it is preferable to similarly take into consideration the movement range of wafer stage WST at the wafer exchange position and during wafer exchange operation, and to set the placement and the length each of the head units or to arrange head units different from each of the head units above, so that the situation where the measurement using the encoder system becomes unmeasurable and the position control of the wafer stage is cut off is avoided.

Furthermore, even in an exposure apparatus by the twin wafer stage method that can perform exposure operation and measurement operation substantially in parallel using two wafer stages whose details are disclosed in, for example, Kokai (Japanese Unexamined Patent Publication) No. 10-214783 and the corresponding U.S. Pat. No. 6,341,007, and in the pamphlet of International Publication WO98/40791 and the corresponding U.S. Pat. No. 6,262,796 and the like, position control of each wafer stage can be performed using the encoder system previously described (FIGS. 3, 25, and 26). In this case, by appropriately setting the placement and the length each of the head units not only during exposure operation but also during measurement operation, it becomes possible to perform position control of each wafer stage using the encoder system previously described (FIGS. 3, 25, and 26) without any changes. However, head units that can be used during the measurement operation separate from the head units previously described (46A to 46D, and 54A to 54D$_2$) can also be arranged. For example, four head units can be arranged in the shape of a cross with alignment system ALG in the center, and during the measurement operation above, positional information of each wafer stage WST can be measured using these units and the corresponding movement scales (46A to 46D, and 52A to 52D). In the exposure apparatus by the twin wafer stage method, two or four movement scales (FIGS. 3, 25, and 26) are arranged, and when exposure operation of a wafer mounted on one of the stages is completed, then the wafer stage is exchanged so that the other wafer stage on which the next wafer that has undergone mark detection and the like at the measurement position is placed at the exposure position. Further, the measurement operation performed in parallel with the exposure operation is not limited to mark detection of the wafer by the alignment system, and instead of, or in combination with the mark detection, for example, detection of the surface information (level difference information) of the wafer can also be performed.

In the description above, when the position control of the wafer stage using the encoder system is cut off at the measurement position or exchange position, or while the wafer stage is moved from one of the exposure position, measurement position, and exchange position to another position, it is preferable to perform position control of the wafer stage at each of the positions above or during the movement using another measurement unit (e.g. an interferometer or an encoder) separate from the encoder system.

Further, in the embodiment and the modified examples described above, as is disclosed in, for example, the pamphlet of International Publication WO2005/074014, the pamphlet of International Publication WO1999/23692, U.S. Pat. No. 6,897,963 and the like, a measurement stage that has a measurement member (a reference mark, a sensor and the like) can be arranged separate from the wafer stage, and during wafer exchange operation or the like, the measurement stage can be exchanged with the wafer stage and be placed directly under projection optical system PL so as to measure the characteristics of the exposure apparatus (e.g. the image-forming characteristics of the projection optical system (such as wavefront aberration), polarization characteristics of illumination light IL, and the like). In this case, movement scales can also be placed on the measurement stage, and the position control of the measurement stage can be performed using the encoder system previously described. Further, during the exposure operation of the wafer mounted on the wafer stage, the measurement stage is withdrawn to a predetermined position where it does not interfere with the wafer stage, and the measurement stage is to move between this withdrawal position and the exposure position. Therefore, at the withdrawal position or during the movement from one position to the other between the withdrawal position and the exposure position, it is preferable to take into consideration the movement range of the measurement stage as in the case of the wafer stage, and to set the placement and the length each of the head units or to arrange head units different from each of the head units above, so that the situation where the measurement using the encoder system becomes unmeasurable and the position control of the measurement stage is cut off is avoided. Or, when the position control of the measurement stage by the encoder system is cut off at the withdrawal position or during the movement, it is preferable to perform position control of the measurement stage using another measurement unit (e.g. an interferometer or an encoder) separate from the encoder system.

Figure 27:
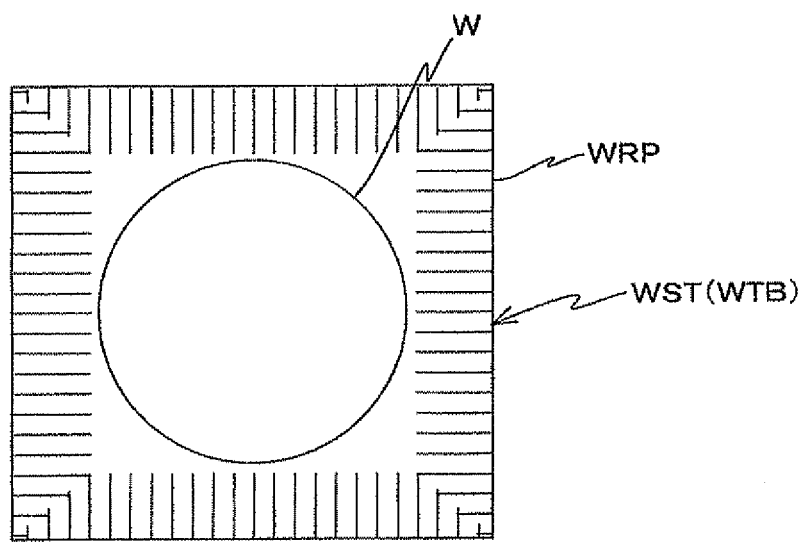
FIG. 27 is a view that shows a modified example of a wafer stage used in a liquid immersion exposure apparatus.

Further, in the embodiment and the modified examples described above, for example, depending on the size of projection unit PU, the distance between the pair of head units arranged extending in the same direction has to be increased, which could cause one unit of the pair of head units to move away from the corresponding movement scale during the scanning exposure of a specific shot area on wafer W, such as, for example, a shot area located on the outermost periphery. For instance, when projection unit PU becomes a little larger in FIG. 3, of the pair of head units 46B and 46D, head unit 46B may move away from the corresponding movement scale 44B. Furthermore, in a liquid immersion type exposure apparatus that has liquid (e.g. pure water or the like) filled in the space between projection optical system PL and the wafer whose details are disclosed in, for example, the pamphlet of International Publication WO99/49504, the pamphlet of International Publication WO2004/053955 (the corresponding U.S. Patent Application Publication 2005/0252506), U.S. Pat. No. 6,952,253, European Patent Application Publication No. 1420298, the pamphlet of International Publication WO2004/055803, the pamphlet of International Publication WO2004/057590, U.S. Patent Application Publication 2006/0231206, U.S. Patent Application Publication 2005/0280791 and the like, since a nozzle member for supplying the liquid is arranged surrounding projection unit PU (see FIGS. 28 and 29), it becomes more difficult to place the head units close to the exposure area previously described of projection optical system PL. Therefore, in the encoder system shown in FIGS. 3 and 26, the two positional information each for both the X-axis and Y-axis directions does not necessarily have to be measurable at all times, and the encoder system (especially the head unit) can be configured so that two positional information is measurable in one of the X-axis and Y-axis directions and one positional information is measurable in the other of the X-axis and Y-axis directions. That is, in the position control of the wafer stage (or the measurement stage) by the encoder system, the two positional information each for both the X-axis and Y-axis directions, which is a total of four positional information, does not necessarily have to be used. Further, in the liquid immersion exposure apparatus, as is shown in FIG. 27, for example, a liquid repellent plate WRP on the upper surface of wafer stage WST (or wafer table WTB) can be made of glass, and the scale pattern can be arranged directly on the glass. Or, the wafer table can be made of glass. In the liquid immersion exposure apparatus equipped with a wafer stage (or a measurement stage) that has the movement scales in the embodiment and the modified examples described above (FIGS. 3, 25, and 26), it is preferable to form a liquid repellent film on the surface of the movement scales.

When taking into consideration the decrease in size and weight of wafer stage WST, it is preferable to place the movement scales as close as possible to wafer W on wafer stage WST. However, when increasing the size of the wafer stage is acceptable, by increasing the size of the wafer stage as well as the distance of the pair of movement scales placed facing each other, the two positional information each for both the X-axis and Y-axis directions, which is a total of four positional information, can be constantly measured at least during the exposure operation of the wafer. Further, instead of increasing the size of the wafer stage, for example, the movement scale can be arranged on the wafer stage so that a part of the movement scale protrudes from the wafer stage, or the movement scale can be placed on the outer side of the wafer stage main section using an auxiliary plate on which at least one movement scales is arranged so as to increase the distance of the pair of movement scales placed facing each other.

Further, prior to performing the position control of the stage by the encoder system, for example, it is preferable to measure the tilt of the head units (tilt with respect to the Z-axis direction), disposal of the heads within the XY plane (the position, distance or the like), tilt of telecentricity of the heads, and the like, and to use the measurement results in the position control described above. Furthermore, for example, it is preferable to measure the displacement amount, the gradient amount or the like of the movement scale in the Z-axis direction (the direction perpendicular to the surface), and to use the measurement results in the position control described above.

The first to third calibration operation and the sequential calibration operation described in the embodiment and the modified examples above can be performed separately, or appropriately combined. Further, during the position measurement by the encoder system and the interferometer system in the calibration operation, the stage was moved at a low speed, however, the present invention is not limited to this, and the stage can be moved at the same level of speed as during the scanning exposure previously described.

Further, in the embodiment and the modified examples above, position control of the reticle stage and wafer stage was performed using the encoder system. The present invention, however, is not limited to this, and for example, position control using the encoder system can be performed in one of the reticle stage and the wafer stage, and in the other stage, position control using the interferometer system can be performed. Furthermore, in the in the embodiment and the modified examples above, the head units of the encoders were placed above the reticle stage, however, the head units of the encoders can be placed below the reticle stage. In this case, the movement scale is also to be arranged on the lower surface side of the reticle stage.

Furthermore, in the encoder system of the embodiment and the modified examples above (FIGS. 3, 25, and 26), the plurality of movement scales (44A to 44D, and 52A to 52D) are each fixed to wafer stage WST, for example, by a suction mechanism such as a vacuum chuck or a plate spring, however, the movement scales can also be fixed, for example, by a screw clamp, or the diffraction grating can be formed directly on the wafer stage. Especially in the latter case, the diffraction grating can be formed on the table where the wafer holder is formed, or especially in the liquid immersion exposure apparatus, the diffraction grating can be formed on the liquid repellent plate. Further, in both reticle stage RST and wafer stage WST, the member on which the diffraction grating is formed (including the measurement scale or the like described earlier) is preferably configured of a low thermal expansion material such as ceramics (e.g. Zerodur of Schott Corporation or the like). Further, in order to prevent the measurement accuracy from decreasing due to foreign substances adhesion or contamination, for example, at least a coating can be applied to the surface so as to cover the diffraction grating, or a cover glass can be arranged. Furthermore, in both reticle stage RST and wafer stage WST, the diffraction grating was continuously formed substantially covering the entire surface of each movement scale in the longitudinal direction, however, for example, the diffraction grating can be formed intermittently, divided into a plurality of areas, or each movement scale can be made up of a plurality of scales.

In the encoder system of the embodiment and the modified examples above, especially in the encoder system in FIG. 3, the case was exemplified where the pair of movement scales 44A and 44C used for measuring the position in the Y-axis direction and the pair of movement scales 44B and 44D used for measuring the position in the X-axis direction are arranged on wafer stage WST, and corresponding to the movement scales, the pair of head units 46A and 46C is arranged on one side and the other side in the X-axis direction of projection optical system PL and the pair head units 46B and 46D is arranged on one side and the other side in the Y-axis direction of projection optical system PL. However, the present invention is not limited to this, and of movement scales 44A and 44C used for measuring the position in the Y-axis direction and movement scales 44B and 44D used for measuring the position in the X-axis direction, at least one set of the movement scales can be a single unit instead of in pairs arranged on wafer stage WST, or of the pair of head units 46A and 46C and the pair head units 46B and 46D, at least one set of the head units can be a single unit arranged instead of in pairs. The same can be said for the encoder system shown in FIG. 26. Further, the extending direction in which the movement scales are arranged and the extending direction in which the head units are arranged are not limited to an orthogonal direction as in the X-axis direction and Y-axis direction in the embodiment above.

Further, in the embodiment and the modified examples above, the configuration of wafer interferometer system 18 is not limited to the one shown in FIG. 3, and for example, in the case of placing a head unit also in alignment system ALG (measurement position), the interferometer system does not have to be equipped with wafer X interferometer $18X_2$, or wafer X interferometer $18X_2$ can be configured, for example, by a multi-axis interferometer as in wafer Y interferometer 18Y, and besides the X position of wafer stage WST, rotational information (such as yawing and rolling) can be measured. Further, similar to wafer X interferometer $18X_1$, wafer Y interferometer 18Y can be a single-axis interferometer, and wafer X interferometer $18X_1$ can be a multi-axis interferometer similar to wafer Y interferometer 18Y. The multi-axis interferometer can be configured so that only yawing is measurable as the rotational information. Furthermore, in one of wafer X interferometer $18X_1$ and wafer Y interferometer 18Y, the interferometer can be configured so that the rotational information measurable is limited to one (rolling or pitching). That is, wafer interferometer system 18 of the embodiment can employ various configurations as long as at least the positional information in the X-axis and Y-axis direction and the rotational information in the θz direction (yawing) can be measured during the exposure operation of the wafer.

In the embodiment above, the case has been described where the present invention was applied to a scanning stepper. The present invention, however, is not limited to this, and it can be applied to a static exposure apparatus such as a stepper. Even in the case of a stepper, by measuring the position of the stage on which the object subject to exposure is mounted using an encoder, generation of position measurement errors due to air fluctuation can be reduced almost to zero, unlike when the position of the stage is measured using the interferometer. Further, based on correction information for correcting the short-term variation of the measurement values of the encoder using the measurement values of the interferometer and on the measurement values of the encoder, it becomes possible to set the position of the stage with high precision, which makes it possible to transfer the reticle pattern onto the object with high precision. Further, the present invention can also be applied to a reduction projection exposure apparatus by the step-and-stitch method that merges shot areas, an exposure apparatus by a proximity method, a mirror projection aligner or the like.

Further, the magnification of the projection optical system in the exposure apparatus of the embodiment above is not limited to a reduction system, and the system may be either an equal magnifying system or a magnifying system. Projection optical system PL is not limited to a refracting system, and the system can be either a reflection system or a catadioptric system, and the projected image can be either an inverted image or an upright image. Furthermore, the exposure area on which illumination light IL is irradiated via projection optical system PL is an on-axis area including optical axis AX within the field of view of projection optical system PL, however, the exposure area can be an off-axis area that does not include optical axis AX similar to the so-called inline type catodioptric system, which has an optical system (a reflection system or a deflection system) that has a plurality of reflection surfaces and forms an intermediate image at least once arranged in a part of the catodioptric system and also has a single optical axis, disclosed in, for example, the pamphlet of International Publication WO2004/107011. Further, the shape of the illumination area and the exposure area previously described was a rectangle, however, the shape is not limited to this, and it can be, for example, a circular arc, a trapezoid, a parallelogram or the like.

Further, illumination light IL is not limited to the ArF excimer laser beam (wavelength 193 nm), and illumination light IL can be an ultraviolet light such as the KrF excimer laser beam (wavelength 248 nm) or the like, or a vacuum ultraviolet light such as the $F_2$ laser beam (wavelength 157 nm). As a vacuum ultraviolet light, as is disclosed in, for example, the pamphlet of International Publication WO1999/46835 (the corresponding U.S. Pat. No. 7,023,610), a harmonic wave may also be used that is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a nonlinear optical crystal.

Further, in the embodiment above, it is a matter of course that as illumination light IL of the exposure apparatus the light is not limited to a light that has a wavelength of 100 nm or more, and a light whose wavelength is less than 100 nm can also be used. For example, in recent years, in order to expose a pattern of 70 nm or under, an EUV exposure apparatus is being developed that generates an EUV (Extreme Ultraviolet) light in the soft X-ray region (e.g. wavelength range of 5 to 15 nm) using an SOR or a plasma laser as a light source and uses an all reflection reduction optical system, which is designed based on the exposure wavelength (e.g. 13.5 nm), and a reflection typed mask. In this apparatus, because the structure of scanning exposure in which the mask and the wafer are synchronously scanned using a circular arc illumination can be considered, the present invention can also be suitably applied to the apparatus. Besides such apparatus, the present invention can also be applied to an exposure apparatus that uses a charged particle beam such as an electron beam or an ion beam.

Further, in the embodiment described above, a transmittance type mask (reticle) was used, which is a transmissive substrate on which a predetermined light shielding pattern (or a phase pattern or a light attenuation pattern) is formed. Instead of this mask, however, as is disclosed in, for example, U.S. Pat. No. 6,778,257, an electron mask (also called a variable shaped mask, an active mask, or an image generator, and includes, for example, a DMD (Digital Micromirror Device), which is a kind of a non-radiative image display device (also referred to as a spatial optical modulator), or the like) on which a light-transmitting pattern, a reflection pattern, or an emission pattern is formed according to electronic data of the pattern that should be exposed can also be used. In the case of using such a variable shaped mask, because the stage on which the wafer, the glass plate or the like is mounted is scanned with respect to the variable shaped mask, by measuring the position of the stage using the encoder and performing calibration on the measurement values of the encoder using the measurement values of the interferometer as is previously described, the same effect as in the embodiment above can be obtained.

Further, for example, as is disclosed in, the pamphlet of International Publication WO2001/035168, by forming interference fringes on wafer W, the present invention can also be applied to an exposure apparatus (a lithography system) that forms a line-and-space pattern on wafer W.

Furthermore, as is disclosed in, for example, Kohyo (Japanese Unexamined Patent Publication) No. 2004-519850 (the corresponding U.S. Pat. No. 6,611,316), the present invention can also be applied to an exposure apparatus that synthesizes patterns of two reticles on a wafer via a double-barrel projection optical system, and performs double exposure of a shot area on the wafer almost simultaneously in one scanning exposure.

Further, the apparatus for forming a pattern on an object is not limited to the exposure apparatus (lithography system) previously described, and for example, the present invention can also be applied to an apparatus for forming a pattern on an object by an inkjet method.

The object on which the pattern is to be formed in the embodiment above (the object subject to exposure on which the energy beam is irradiated) is not limited to a wafer, and can be other objects such as, a glass plate, a ceramic substrate, a mask blank, a film member or the like. Further, the shape of the object is not limited to a circular shape, and it can be other shapes such as a rectangular shape or the like.

The usage of the exposure apparatus is not limited to the exposure apparatus for manufacturing semiconductors, and the present invention can also be widely applied to an exposure apparatus for liquid crystals that transfers a liquid crystal display device pattern on a square glass plate or the like, or to an exposure apparatus used for manufacturing organic ELs, thin film magnetic heads, imaging devices (such as CCDs) micromachines, DNA chips and the like. Further, the present invention can also be applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, an electron beam exposure apparatus and the like.

The present invention is not limited to an exposure apparatus, and can also be widely applied to other substrate processing units (e.g. a laser repair unit, a substrate inspection unit and the like), or to an apparatus equipped with a movement stage of a position setting unit of a sample, a wire bonding unit and the like in other precision machinery.

The disclosures of all the publications, the pamphlet of the International Publications, the U.S. Patent Application Publication, and the U.S. Patent descriptions related to the exposure apparatus or the like referred to above are each incorporated herein by reference.

Semiconductor devices are manufactured through the following steps: a step where the function/performance design of a device is performed; a step where a reticle based on the design step is manufactured; a step where a wafer is manufactured using materials such as silicon; a lithography step where the pattern formed on the mask is transferred onto a photosensitive object using the exposure apparatus described in the embodiment above; a device assembly step (including processes such as a dicing process, a bonding process, and a packaging process); an inspection step, and the like. In this case, in the lithography step, because the exposure apparatus in the embodiment above is used, high integration devices can be manufactured with good yield.

The exposure apparatus in the embodiment and the modified examples above can be made by assembling various subsystems that include each of the components given in the scope of the claims of the present application so that a predetermined mechanical accuracy, electrical accuracy, and optical accuracy are maintained. In order to secure these various accuracies, before and after the assembly, adjustment for achieving the optical accuracy is performed for the various optical systems, adjustment for achieving the mechanical accuracy is performed for the various mechanical systems, and adjustment for achieving the electrical accuracy is performed for the various electric systems. The assembly process from the various subsystems to the exposure apparatus includes mechanical connection, wiring connection of the electric circuits, piping connection of the pressure circuits and the like between the various subsystems. It is a matter of course that prior to the assembly process from the various subsystems to the exposure apparatus, there is an assembly process for each of the individual subsystems. When the assembly process from the various subsystems to the exposure apparatus has been completed, total adjustment is performed, and the various accuracies in the exposure apparatus as a whole are secured. The exposure apparatus is preferably built in a clean room where conditions such as the temperature and the degree of cleanliness are controlled.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A scanning exposure apparatus having an illumination optical system that illuminates a mask with illumination light and a projection optical system that projects a pattern image of the illuminated mask onto a substrate, the apparatus comprising:
   a body having a frame member that supports the projection optical system;
   a mask stage system that has a first movable body and a first motor, the first movable body being placed above the projection optical system and holding the mask, and the first motor driving the first movable body;
   a first encoder system that has a plurality of first heads each irradiating a first measurement beam to a first grating section having a reflection type grating, and measures positional information of the first movable body moved by the first motor, the reflection type grating being placed substantially parallel to a predetermined plane orthogonal to an optical axis of the projection optical system;
   a substrate stage system having a second movable body and a second motor, the second movable body being placed below the projection optical system and holding the substrate, and the second motor driving the second movable body;
   a second encoder system that has four second heads each irradiating a second measurement beam to a second grating section having four scales, and measures positional information of the second movable body moved by the second motor, the four scales each having a reflection type grating placed substantially parallel to the predetermined plane; and
   a controller coupled to the mask stage system and the substrate stage system, that controls a drive of the first movable body by the first motor based on measurement information of the first encoder system and also controls a drive of the second movable body by the second motor based on measurement information of the second encoder system so that the mask and the substrate are each moved relative to the illumination light in a scanning exposure of the substrate, wherein
   the plurality of first heads include two first heads that are different in position in a first direction which is orthogonal to the optical axis of the projection optical system and in which the mask is moved in the scanning exposure, and one first head that is different in position from the two first heads in a second direction orthogonal to the optical axis and orthogonal to the first direction,
   at least in an exposure operation of the substrate, a relationship between the second grating section and the four second heads changes between a first state and a second state by a movement of the second movable body, wherein
      in the first state, the four second heads respectively face the four scales, and
      in the second state, only three of the four second heads respectively face three scales of the four scales, such that none of the four second heads faces a fourth one of the four scales, and
   at least during the scanning exposure, three scales of the four scales are always faced by three of the four second heads.

2. The exposure apparatus according to claim 1, wherein when the relationship changes from the first state to the second state, the fourth one of the four scales of the second grating section in the second state is determined depending on a position of the second movable body.

3. The exposure apparatus according to claim 1, wherein when the relationship changes from the first state to the second state, the three second heads that respectively face the three scales of the second grating section in the second state are determined depending on a position of the second movable body.

4. The exposure apparatus according to claim 1, wherein the controller controls the drive of the second movable body based on positional information measured by three of the four second heads in each of the first state and the second state.

5. The exposure apparatus according to claim 1, further comprising:
   a nozzle member arranged adjacent to the projection optical system, that supplies liquid to below the projection optical system such that the substrate is exposed via the projection optical system and the liquid, wherein
   the second encoder system measures the positional information of the second movable body during an exposure operation of the substrate via the projection optical system and the liquid.

6. The exposure apparatus according to claim 5, wherein the second encoder system is arranged outside the nozzle member with respect to the projection optical system.

7. The exposure apparatus according to claim 5, wherein the second encoder system measures the positional information of the second movable body during a different operation from the exposure operation.

8. The exposure apparatus according to claim 7, further comprising:
   a detecting system arranged away from the projection optical system, that detects a mark of the substrate held by the second movable body, wherein
   the different operation includes at least a detection operation of the substrate by the detecting system.

9. The exposure apparatus according to claim 8, wherein the second encoder system has a first part arranged outside the nozzle member with respect to the projection optical system to measure the positional information of the second movable body during the exposure operation, and a second part arranged surrounding the detecting system to measure the positional information of the second movable body during the detection operation.

10. The exposure apparatus according to claim 9, wherein the different operation includes at least an exchange operation of the substrate held by the second movable body.

11. The exposure apparatus according to claim 9, wherein the second encoder system measures the positional information of the second movable body during a movement of the second movable body away from below the projection optical system.

12. The exposure apparatus according to claim 9, wherein the second encoder system measures the positional information of the second movable body during a movement of the second movable body from a detection position where a mark detection of the substrate is performed by the detecting system to an exposure position where the exposure of the substrate is performed via the projection optical system and the liquid.

13. The exposure apparatus according to claim 12, wherein
the second encoder system measures the positional information of the second movable body during a movement of the second movable body from one of the exposure position and an exchange position where an exchange of the substrate held by the second movable body is performed to the other of the exposure position and the exchange position.

14. The exposure apparatus according to claim 13, wherein
the second encoder system measures the positional information of the second movable body during a movement of the second movable body from the exchange position to the detection position.

15. The exposure apparatus according to claim 9, wherein
the substrate stage system has a plurality of second movable bodies including the second movable body, the plurality of second movable bodies each holding a substrate, and
the second encoder system measures positional information of the plurality of second movable bodies.

16. The exposure apparatus according to claim 9, wherein
the controller controls the drive of the second movable body based on positional information measured by the second encoder system and information on at least one of the second grating section and the second heads.

17. The exposure apparatus according to claim 16, wherein
the information on the second grating section includes information on at least one of a pitch of the grating and a deformation of the grating.

18. The exposure apparatus according to claim 16, wherein
the information on the second grating section includes information on an arrangement of the grating.

19. The exposure apparatus according to claim 16, wherein
the information on the second heads includes information on at least one of a tilt of one of the second heads and an optical characteristic of one of the second heads.

20. The exposure apparatus according to claim 9, wherein
the controller compensates for a measurement error of the second encoder system by using information on at least one of the second grating section and the second heads to control the drive of the second movable body.

21. The exposure apparatus according to claim 9, wherein
the controller corrects a measurement error of the second encoder system generated due to at least one of the second grating section and the second heads.

22. A device manufacturing method, including
a lithography process of transferring a pattern onto a photosensitive substrate using the exposure apparatus according to claim 1.

23. The exposure apparatus according to claim 1, wherein
one of the two first heads and the one first head is placed on one side of the second direction with respect to an illumination area of the illumination light irradiated on the mask by the illumination optical system, and the other of the two first heads and the one first head is placed on an other side of the second direction with respect to the illumination area.

24. The exposure apparatus according to claim 23, wherein
the first grating section has a scale placed on one side of the second direction with respect to the illumination area and another scale placed on an other side of the second direction with respect to the illumination area, in each of the scale and the another scale the grating being formed, and
at least during the scanning exposure, the two first heads and the one first head continue to face the gratings of the first grating section.

25. The exposure apparatus according to claim 24, wherein
in the first encoder system, one of the plurality of first heads and the first grating section is provided at the body and the other of the plurality of first heads and the first grating section is provided at the first movable body.

26. The exposure apparatus according to claim 25, wherein
the plurality of first heads have at least one first head that is different from the two first heads and the one first head and is placed away in the first direction from the two first heads and the one first head, and
the first encoder system is capable of measuring positional information of the first movable body in an exchange operation of the mask, by the at least one first head.

27. The exposure apparatus according to claim 25, wherein
the plurality of first heads have at least one first head that is different from the two first heads and the one first head and is placed away in the first direction from the two first heads and the one first head, and
during a movement of the first movable body in the first direction for the scanning exposure, a positional relationship between the at least one first head and the first grating section changes from one of a first state and a second state to the other, in the first state the at least one first head facing the grating of the first grating section and in the second state the at least one first head moving off from the grating of the first grating section.

28. The exposure apparatus according to claim 25, further comprising:
a first detection system that detects a mark of the mask or a mark of the first movable body, wherein
in each of the exposure operation and a detection operation by the first detection system, positional information of the first movable body is measured by the first encoder system.

29. The exposure apparatus according to claim 28, further comprising:

a second detection system placed away from the projection optical system, that detects positional information of the substrate by irradiating a beam on the substrate, wherein in each of the exposure operation and a detection operation by the second detection system, positional information of the second movable body is measured by the second encoder system.

30. The exposure apparatus according to claim 29, wherein in an exchange operation of the substrate held by the second movable body, positional information of the second movable body is measured by the second encoder system, the exchange operation being performed at an exchange position that is away from the projection optical system.

31. The exposure apparatus according to claim 29, further comprising:

a nozzle member arranged adjacent to the projection optical system, that supplies liquid to below the projection optical system such that the substrate is exposed via the projection optical system and the liquid, wherein the second encoder system measures the positional information of the second movable body during an exposure operation of the substrate via the projection optical system and the liquid.

32. The exposure apparatus according to claim 31, wherein the substrate stage system has a plurality of second movable bodies including the second movable body, the plurality of second movable bodies each holding a substrate, and the second encoder system measures positional information of the plurality of second movable bodies.

33. The exposure apparatus according to claim 32, wherein the controller controls the drive of the second movable body while compensating a measurement error of the second encoder system that occurs due to at least one of the plurality of second heads and the second grating section.

* * * * *